United States Patent
Ikeda et al.

(10) Patent No.: US 11,423,844 B2
(45) Date of Patent: Aug. 23, 2022

(54) DISPLAY DEVICE AND ELECTRONIC DEVICE

(71) Applicant: Semiconductor Energy Laboratory Co., Ltd., Atsugi (JP)

(72) Inventors: Takayuki Ikeda, Atsugi (JP); Hidetomo Kobayashi, Isehara (JP); Hideaki Shishido, Atsugi (JP); Kiyotaka Kimura, Isehara (JP); Takashi Nakagawa, Sagamihara (JP); Kosei Nei, Yokohama (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/055,285

(22) PCT Filed: May 9, 2019

(86) PCT No.: PCT/IB2019/053804
§ 371 (c)(1),
(2) Date: Nov. 13, 2020

(87) PCT Pub. No.: WO2019/220278
PCT Pub. Date: Nov. 21, 2019

(65) Prior Publication Data
US 2021/0295780 A1    Sep. 23, 2021

(30) Foreign Application Priority Data

May 17, 2018  (JP) .............................. JP2018-095244
Jun. 6, 2018  (JP) .............................. JP2018-108416
Aug. 28, 2018  (JP) .............................. JP2018-159543

(51) Int. Cl.
*G09G 3/3266*  (2016.01)
*G09G 3/3275*  (2016.01)
(Continued)

(52) U.S. Cl.
CPC ......... *G09G 3/3275* (2013.01); *G09G 3/3233* (2013.01); *G09G 3/3266* (2013.01);
(Continued)

(58) Field of Classification Search
CPC .. G09G 3/32; G09G 3/00; G09G 3/10; G09G 3/20; G09G 3/30; G09G 3/34; G09G 3/36;
(Continued)

(56) References Cited

U.S. PATENT DOCUMENTS 6,956,234 B2  10/2005  Kato et al.
7,323,714 B2   1/2008  Kato et al.
(Continued)

FOREIGN PATENT DOCUMENTS

CN  102654979 A   9/2012
CN  103155202 A   6/2013
(Continued)

OTHER PUBLICATIONS

International Search Report (Application No. PCT/IB2019/053804), dated Aug. 13, 2019.
(Continued)

*Primary Examiner* — Chanh D Nguyen
*Assistant Examiner* — Nguyen H Truong
(74) *Attorney, Agent, or Firm* — Robinson Intellectual Property Law Office; Eric J. Robinson

(57) ABSTRACT

A high-definition display device is provided. A small display device is provided. In the display device, a first layer and a second layer are stacked and provided. The first layer includes a gate driver circuit and a source driver circuit, and the second layer includes a display portion. The gate driver circuit and the source driver circuit are provided to include a region overlapping with the display portion. The gate driver circuit and the source driver circuit have an overlap
(Continued)

region where they are not strictly separated from each other. Five or more gate driver circuits and five or more source driver circuits can be provided.

16 Claims, 35 Drawing Sheets

(51) Int. Cl.
*G09G 3/3233* (2016.01)
*G09G 5/377* (2006.01)
*H01L 27/32* (2006.01)
*H01L 29/786* (2006.01)
*G09G 3/36* (2006.01)

(52) U.S. Cl.
CPC ......... *G09G 5/377* (2013.01); *H01L 27/3253* (2013.01); *H01L 29/7869* (2013.01); *G09G 3/36* (2013.01); *G09G 2300/0426* (2013.01); *G09G 2300/0809* (2013.01); *G09G 2310/0297* (2013.01); *G09G 2340/12* (2013.01)

(58) Field of Classification Search
CPC .. G09G 3/3275; G09G 3/3266; G09G 3/3233; G09G 3/3258; G09G 3/3225; G09G 3/3208; G09G 5/00; G09G 5/10; G09G 5/377; G09G 2300/0426; G09G 2300/0809; G09G 2310/0297; G09G 2340/12; H01L 27/00; H01L 27/12; H01L 27/32; H01L 27/3253; H01L 29/24; H01L 29/417; H01L 29/423; H01L 29/786; H01L 29/7869; H01L 21/66; H01L 51/00; H01L 51/52; G02F 1/1362; G02F 1/1345; G02F 1/1368; G02F 1/1343; G02F 1/1333; G02F 1/1335; G02F 1/1339
See application file for complete search history.

(56) References Cited

U.S. PATENT DOCUMENTS

| | | | |
|---|---|---|---|
| 8,520,312 B2 | 8/2013 | Miyano | |
| 8,976,090 B2 | 3/2015 | Yamamoto et al. | |
| 9,496,408 B2 | 11/2016 | Yamazaki et al. | |
| 9,741,865 B2 | 8/2017 | Yamazaki et al. | |
| 9,899,536 B2 | 2/2018 | Yamazaki et al. | |
| 10,354,574 B2 | 7/2019 | Kobayashi et al. | |
| 2003/0166336 A1 | 9/2003 | Kato et al. | |
| 2007/0001982 A1* | 1/2007 | Ito | G09G 3/3688 345/98 |
| 2010/0176395 A1* | 7/2010 | Choi | H01L 27/0688 257/43 |
| 2011/0186852 A1* | 8/2011 | Kimura | G09G 3/3241 257/71 |
| 2012/0223978 A1 | 9/2012 | Yamamoto et al. | |
| 2015/0228666 A1 | 8/2015 | Paolini, Jr. | |
| 2015/0364070 A1* | 12/2015 | Lv | G09G 3/035 345/690 |
| 2017/0061857 A1* | 3/2017 | Lee | H01L 25/0657 |
| 2017/0092177 A1 | 3/2017 | Kobayashi et al. | |
| 2017/0178586 A1* | 6/2017 | Kim | G09G 3/3659 |
| 2017/0357113 A1* | 12/2017 | Yamazaki | G09G 3/3648 |
| 2018/0012549 A1 | 1/2018 | Lee et al. | |
| 2018/0188867 A1* | 7/2018 | Yeh | G06F 3/047 |
| 2018/0308871 A1* | 10/2018 | Wu | G09G 3/3233 |
| 2019/0025660 A1* | 1/2019 | Shimoshikiryoh | G09G 3/3648 |

FOREIGN PATENT DOCUMENTS

| | | |
|---|---|---|
| CN | 106133816 A | 11/2016 |
| CN | 107579075 A | 1/2018 |
| EP | 2628200 A | 8/2013 |
| EP | 3096370 A | 11/2016 |
| EP | 3103113 A | 12/2016 |
| JP | 2003-233333 A | 8/2003 |
| JP | 2008-281986 A | 11/2008 |
| JP | 2011-141412 A | 7/2011 |
| JP | 2011-145447 A | 7/2011 |
| JP | 2012-042569 A | 3/2012 |
| JP | 2012-185328 A | 9/2012 |
| JP | 2013-546012 | 12/2013 |
| JP | 2014-007399 A | 1/2014 |
| JP | 2017-062474 A | 3/2017 |
| KR | 2013-0143051 A | 12/2013 |
| KR | 2016-0119195 A | 10/2016 |
| WO | WO-2012/050586 | 4/2012 |
| WO | WO-2015/120288 | 8/2015 |
| WO | WO-2017/051288 | 3/2017 |

OTHER PUBLICATIONS

Written Opinion (Application No. PCT/IB2019/053804), dated Aug. 13, 2019.

* cited by examiner

DISPLAY DEVICE AND ELECTRONIC DEVICE

TECHNICAL FIELD

One embodiment of the present invention relates to a display device and an operating method therefor, and an electronic device. One embodiment of the present invention relates to a method for manufacturing a display device. One embodiment of the present invention relates to a transistor and a fabrication method of the transistor.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that makes field-effect mobility (simply referred to as mobility or μFE in some cases) to be increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; thus, a high-performance display device provided with driver circuits can be obtained.

In addition, as display devices for augmented reality (AR) or virtual reality (VR), wearable display devices and stationary display devices have been widely used. Examples of wearable display devices include a head mounted display (HMD) and an eyeglass-type display device. Examples of stationary display devices include a head-up display (HUD).

Furthermore, an electronic viewfinder is used as a viewfinder that is used to check an image to be taken before imaging and is provided in a digital camera or the like, which is an electronic device including an imaging device. A display portion is provided in the electronic viewfinder, and an image obtained by the imaging device can be displayed as an image in the display portion. For example, Patent Document 2 discloses an electronic viewfinder that can obtain a good visibility state from a center portion of an image to a peripheral portion of the image.

REFERENCES

Patent Documents

[Patent Document 1] Japanese Published Patent Application No. 2014-7399
[Patent Document 2] Japanese Published Patent Application No. 2012-42569

SUMMARY OF THE INVENTION

Problems to be Solved by the Invention

With a display device having a short distance between its display surface and the user, such as a head mounted display (HMD), the user is likely to perceive pixels and strongly feel granularity, which might decrease the sense of immersion or realistic feeling of AR or VR. In an electronic viewfinder, as in an optical finder, an eyepiece is provided, and when the user brings his/her eyes closer to the eyepiece, an image displayed on a display portion of the electronic viewfinder is perceived. Thus, a distance between the display portion of the electronic viewfinder and the user is short. Accordingly, the user is likely to perceive pixels provided in the display portion and thus sometimes feels granularity strongly. In view of the foregoing, an HMD and an electronic viewfinder require a display device including fine pixels such that the user does not perceive the pixels. For example, the pixel density is preferably 1000 ppi or higher, further preferably 5000 ppi or higher, still further preferably 10000 ppi. Moreover, it is preferable that for example, particularly in a display device provided in an electronic viewfinder, an image having a resolution of 4K (the number of pixels: 3840×2160), 5K (the number of pixels: 5120×2880), or higher can be displayed.

An object of one embodiment of the present invention is to provide a display device with a large number of pixels. Another object of one embodiment of the present invention is to provide a high-definition display device. Another object of one embodiment of the present invention is to provide a display device that can display a high-resolution image. Another object of one embodiment of the present invention is to provide a display device that can display a high-quality image. Another object of one embodiment of the present invention is to provide a display device that can display a highly realistic image. Another object of one embodiment of the present invention is to provide a display device that can display a high-luminance image. Another object of one embodiment of the present invention t is to provide a display device with a high dynamic range. Another object of one embodiment of the present invention is to provide a liquid crystal display device with a narrower frame. Another object of one embodiment of the present invention is to provide a small display apparatus. Another object of one embodiment of the present invention is to provide a display device operating at high speed. Another object of one embodiment of the present invention is to provide a display device with low power consumption. Another object of one embodiment of the present invention is to provide an inexpensive display apparatus. Another object of one embodiment of the present invention is to provide a highly reliable display device. Another object of one embodiment of the present invention is to provide a novel display device. Another object of one embodiment of the present invention is to provide a novel method for driving a display device. Another object of one embodiment of the present invention is to provide a novel electronic device.

Note that the description of these objects does not preclude the existence of other objects. One embodiment of the present invention does not have to achieve all these objects.

Note that other objects can be derived from the description of the specification, the drawings, the claims, and the like.

Means for Solving the Problems

One embodiment of the present invention is a display device in which a first layer and a second layer are stacked and provided. The first layer includes a gate driver circuit and a source driver circuit. The second layer includes a display portion. Pixels are arranged in a matrix in the display portion. The gate driver circuit and the source driver circuit each include a region overlapping with the pixel. The gate driver circuit includes a region overlapping with the source driver circuit.

In the above embodiment, the display device may include a D/A converter circuit. The D/A converter circuit may include a potential generator circuit and a pass transistor logic circuit. The potential generator circuit may be provided outside the source driver circuit. The pass transistor logic circuit may be provided in the source driver circuit. The potential generator circuit may have a function of a plurality of potentials that have different levels. The pass transistor logic circuit may have a function of receiving image data and outputting any of the potentials generated by the potential generator circuit on the basis of the digital value of the image data.

In the above embodiment, the pixel may include a transistor including a metal oxide in a channel formation region, and the metal oxide may include an element M (M is Al, Ga, Y, or Sn) and Zn.

Another embodiment of the present invention is a display device in which a first layer and a second layer are stacked and provided. The first layer includes a gate driver circuit, a first source driver circuit, a second source driver circuit, a third source driver circuit, a fourth source driver circuit, and a fifth source driver circuit. The second layer includes a first display portion, a second display portion, a third display portion, a fourth display portion, and a fifth display portion. First pixels are arranged in a matrix in the first display portion. Second pixels are arranged in a matrix in the second display portion. Third pixels are arranged in a matrix in the third display portion. Fourth pixels are arranged in a matrix in the fourth display portion. Fifth pixels are arranged in a matrix in the fifth display portion. The gate driver circuit and the first source driver circuit each include a region overlapping with the first pixel. The second source driver circuit includes a region overlapping with the second pixel. The third source driver circuit includes a region overlapping with the third pixel. The fourth source driver circuit includes a region overlapping with the fourth pixel. The fifth source driver circuit includes a region overlapping with the fifth pixel. The gate driver circuit includes a region overlapping with the first source driver circuit.

In the above embodiment, the display device may include a D/A converter circuit. The D/A converter circuit may include a potential generator circuit and a first pass transistor logic circuit, a second pass transistor logic circuit, a third pass transistor logic circuit, a fourth pass transistor logic circuit, and a fifth pass transistor logic circuit. The potential generator circuit may be provided outside the first to fifth source driver circuits. The first pass transistor logic circuit may be provided in the first source driver circuit. The second pass transistor logic circuit may be provided in the second source driver circuit. The third pass transistor logic circuit may be provided in the third source driver circuit. The fourth pass transistor logic circuit may be provided in the fourth source driver circuit. The fifth pass transistor logic circuit may be provided in the fifth source driver circuit. The potential generator circuit may have a function of generating a plurality of potentials that have different levels. The first to fifth pass transistor logic circuits may have a function of receiving image data and outputting any of the potentials generated by the potential generator circuit on the basis of the digital value of the image data.

In the above embodiment, the first to five pixels may each include a transistor including a metal oxide in a channel formation region, and the metal oxide may include an element M (M is Al, Ga, Y, or Sn) and Zn.

Another embodiment of the present invention is a display device in which a first layer and a second layer are stacked and provided. The first layer includes a gate driver circuit and a source driver circuit. The second layer includes a display portion. Pixels are arranged in a matrix in the display portion. The gate driver circuit and the source driver circuit each include a region overlapping with the pixel. The gate driver circuit includes a region overlapping with the source driver circuit. The source driver circuit is electrically connected to the pixel through a first data line. The source driver circuit is electrically connected to the pixel through a second data line. The source driver circuit has a function of generating a first image signal and supplying the first image signal to the pixel through the first data line. The source driver circuit has a function of generating a second image signal and supplying the second image signal to the pixel through the second data line. The pixel has a function of displaying an image in which an image corresponding to the first image signal and an image corresponding to the second image signal are superimposed on each other.

In the above embodiment, the display device may include a D/A converter circuit. The D/A converter circuit may include a potential generator circuit and a pass transistor logic circuit. The potential generator circuit may be provided outside the source driver circuit. The pass transistor logic circuit may be provided in the source driver circuit. The potential generator circuit may have a function of a plurality of potentials that have different levels. The pass transistor logic circuit may have a function of receiving image data and outputting any of the potentials generated by the potential generator circuit on the basis of the digital value of the image data.

In the above embodiment, the pixel may include a display element, and the display element may be a light-emitting element.

In the above embodiment, the display element may be an organic EL element.

In the above embodiment, the organic EL element may have a tandem structure.

In the above embodiment, the pixel may include the display element, a first transistor, a second transistor, a third transistor, and a capacitor. One of a source and a drain of the first transistor may be electrically connected to one electrode of the capacitor. The other of the source and the drain of the first transistor may be electrically connected to the first data line. One of a source and a drain of the second transistor may be electrically connected to the other electrode of the capacitor. The other of the source and the drain of the second transistor may be electrically connected to the second data line. The other electrode of the capacitor may be electrically connected to a gate of the third transistor. One of a source and a drain of the third transistor may be electrically connected to one electrode of the display element.

In the above embodiment, the first and second transistors may each include a metal oxide in a channel formation region, and the metal oxide may include an element M (M is Al, Ga, Y, or Sn) and Zn.

An electronic device including the display device of one embodiment of the present invention and a lens is also one embodiment of the present invention.

Effect of the Invention

According to one embodiment of the present invention, a display device with a large number of pixels can be provided. According to one embodiment of the present invention, a high-definition display device can be provided. According to one embodiment of the present invention, a display device that can display a high-resolution image can be provided. According to one embodiment of the present invention, a display device that can display a high-quality image can be provided. According to one embodiment of the present invention, a display device that can display a highly realistic image can be provided. According to one embodiment of the present invention, a display device that can display a high-luminance image can be provided. According to one embodiment of the present invention, a display device with a high dynamic range can be provided. According to one embodiment of the present invention, a liquid crystal display device with a narrower frame can be provided. According to one embodiment of the present invention, a small display apparatus can be provided. According to one embodiment of the present invention, a display device operating at high speed can be provided. According to one embodiment of the present invention, a display device with low power consumption can be provided. According to one embodiment of the present invention, an inexpensive display apparatus can be provided. According to one embodiment of the present invention, a highly reliable display device can be provided. According to one embodiment of the present invention, a novel display device can be provided. According to one embodiment of the present invention, a novel method for driving a display device can be provided. According to one embodiment of the present invention, a novel electronic device can be provided.

Note that the descriptions of the effects do not disturb the existence of other effects. Note that one embodiment of the present invention does not need to have all these effects. Other effects can be derived from the description of the specification, the drawings, the claims, and the like.

MODE FOR CARRYING OUT THE INVENTION

Figure 1:
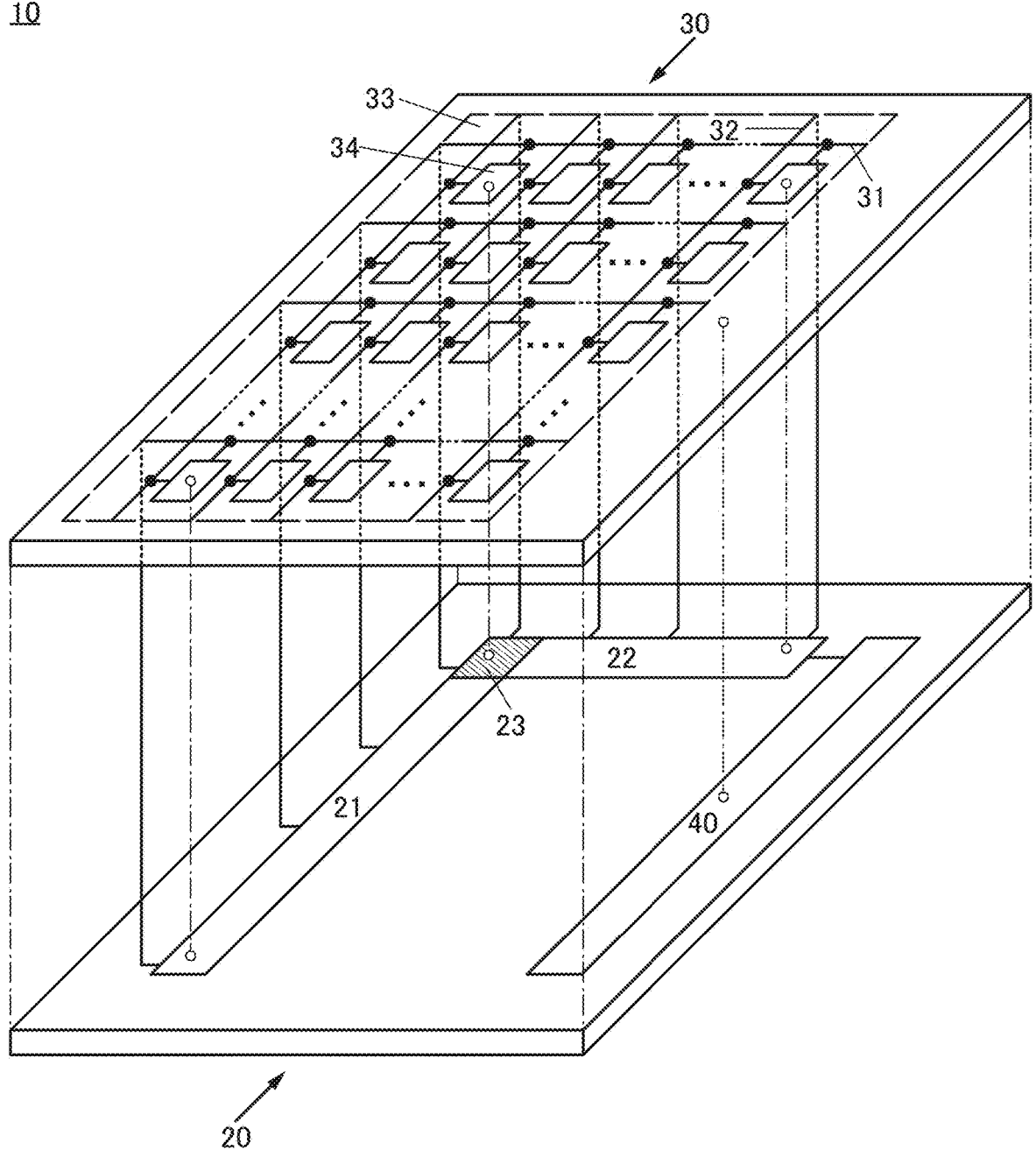
FIG. 1 A block diagram illustrating a structure example of a display device.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Therefore, the present invention should not be construed as being limited to the description of embodiments below.

In each drawing described in this specification, the size, the layer thickness, or the region of each component is exaggerated for clarity in some cases.

Furthermore, ordinal numbers such as "first," "second," and "third" used in this specification are used in order to avoid confusion among components and do not limit the components numerically.

Also, in this specification and the like, terms for describing arrangement such as "over" and "under" are used for convenience in describing a positional relation between components with reference to drawings. Furthermore, the positional relationship between components is changed as appropriate in accordance with a direction in which the components are described. Thus, terms for the description are not limited to terms used in the specification, and description can be made appropriately depending on the situation.

In this specification and the like, functions of a source and a drain of a transistor are sometimes switched from each other depending on the polarity of the transistor, the case where the direction of current flow is changed in circuit operation, or the like. Therefore, the terms "source" and "drain" can be used interchangeably.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

Moreover, in this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to a drain current of a transistor in an off state (also referred to as a non-conducting state or a cutoff state). Unless otherwise specified, an off state refers to, in an n-channel transistor, a state where the voltage $V_{gs}$ between its gate and source is lower than the threshold voltage $V_{th}$ (in a p-channel transistor, higher than $V_{th}$).

In the drawings, the size, the layer thickness, or the region is exaggerated for clarity in some cases. Therefore, they are not necessarily limited to the illustrated scale. Note that the drawings are schematic views illustrating ideal examples, and embodiments of the present invention are not limited to shapes or values shown in the drawings. For example, in an actual manufacturing process, a layer, a resist mask, or the like might be unintentionally reduced in size by treatment such as etching, which might not be reflected in the drawings for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS FET can also be called a transistor including a metal oxide or an oxide semiconductor.

Embodiment 1

In this embodiment, a display device that is one embodiment of the present invention is described.

One embodiment of the present invention relates to a display device in which a first layer and a second layer are stacked and provided. The first layer includes a gate driver circuit and a source driver circuit, and the second layer includes a display portion. The gate driver circuit and the source driver circuit are provided to include a region overlapping with the display portion. Accordingly, the display device of one embodiment of the present invention can have a narrower frame and can be smaller.

The gate driver circuit and the source driver circuit have an overlap region where they are not strictly separated from each other. Accordingly, the frame and size of the display device can be further reduced, compared to the case where the overlap region is not included.

With a structure where the gate driver circuit and the source driver circuit do not overlap with the display portion, the gate driver circuit and the source driver circuit are provided in a portion around the display portion, for example. In this case, it is difficult to provide display portions of more than two rows and more than two columns in terms of positions where source driver circuits would be provided, for example. In contrast, in the display device of one embodiment of the present invention, the gate driver circuit and the source driver circuit can be provided in a layer different from the layer including the display portion, thereby having a region overlapping with the display portion; hence, display portions of more than two rows and more than two columns can be provided. In other words, five or more gate driver circuits and five or more source driver circuits can be provided in the display device of one embodiment of the present invention.

As described above, the gate driver circuit and the source driver circuit are provided to include a region overlapping with the display portion; accordingly, for example, high speed operation is possible compared to a display device having a structure in which a gate driver circuit and a source driver circuit do not overlap with a display portion. Thus, the definition of the display device of one embodiment of the present invention can be higher than that of the display device in which the gate driver circuit and the source driver circuit do not overlap with the display portion. For example, the pixel density of the display device of one embodiment of the present invention can be 1000 ppi or higher, 5000 ppi or higher, or 10000 ppi. In addition, the resolution of an image that can be displayed by the display device of one embodiment of the present invention can be higher than the resolution of an image that can be displayed by a display device in which a gate driver circuit and a source driver circuit do not overlap with a display portion.

Structure Example 1 of Display Device

FIG. 1 is a block diagram illustrating a structure example of a display device 10 that is the display device of one embodiment of the present invention. The display device 10 includes a layer 20 and a layer 30 stacked over the layer 20. The layer 20 includes a gate driver circuit 21, a source driver circuit 22, and a circuit 40. The layer 30 includes a display portion 33, and pixels 34 are arranged in a matrix in the display portion 33. Note that an interlayer insulating layer can be provided between the layer 20 and the layer 30. Note that the layer 20 may be stacked over the layer 30.

The circuit 40 is electrically connected to the source driver circuit 22. Note that the circuit 40 may be electrically connected to another circuit or the like.

The pixels 34 in the same row are electrically connected to the gate driver circuit 21 through a wiring 31, and the pixels 34 in the same column are electrically connected to the source driver circuit 22 through a wiring 32. The wiring 31 functions as a scan line, and the wiring 32 functions as a data line.

Although FIG. 1 illustrates the structure in which the pixels 34 in one row are electrically connected through one wiring 31 and the pixels 34 in one column are electrically connected through one wiring 32, one embodiment of the present invention is not limited thereto. For example, the pixels 34 in one row may be electrically connected through two or more wirings 31, or the pixels 34 in one column may be electrically connected through two or more wirings 32. That is, for example, one pixel 34 may be electrically connected to two or more scan lines or two or more data lines. Alternatively, for example, one wiring 31 may be electrically connected to the pixels 34 in two or more rows, or one wiring 32 may be connected to the pixels 34 in two or more columns. That is, for example, one wiring 31 may be shared by the pixels 34 in two or more rows, or one wiring 32 may be shared by the pixels 34 in two or more columns.

The gate driver circuit 21 has a function of generating a signal for controlling the operation of the pixel 34 and supplying the signal to the pixel 34 through the wiring 31. The source driver circuit 22 has a function of generating an image signal and supplying the signal to the pixel 34 through the wiring 32. The circuit 40 has a function of receiving image data that serves as a base for an image signal generated by the source driver circuit 22 and supplying the received image data to the source driver circuit 22, for example. The circuit 40 also has a function of a control circuit that generates a start pulse signal, a clock signal, and the like. In addition, the circuit 40 can have a function that the gate driver circuit 21 and the source driver circuit 22 do not have.

The display portion 33 has a function of displaying an image corresponding to image signals supplied to the pixels 34 from the source driver circuit 22. Specifically, light with luminance corresponding to the image signals is emitted from the pixels 34, whereby an image is displayed on the display portion 33.

In FIG. 1, the positional relation between the layer 20 and the layer 30 is represented by dashed-dotted lines and blank circles; the blank circle of the layer 20 and the blank circle of the layer 30 that are connected by the dashed-dotted line overlap with each other. Note that the same representation is used in other diagrams.

In the display device 10, the gate driver circuit 21 and the source driver circuit 22, which are provided in the layer 20, each include a region overlapping with the display portion 33. For example, the gate driver circuit 21 and the source driver circuit 22 each include a region overlapping with some of the pixels 34. Stacking the gate driver circuit 21 and the source driver circuit 22 with the display portion 33 to have an overlap region allows the display device 10 to have a narrower frame and a smaller size.

The gate driver circuit 21 and the source driver circuit 22 have an overlap region where they are not strictly separated from each other. The region is referred to as a region 23. With the region 23, the area occupied by the gate driver circuit 21 and the source driver circuit 22 can be reduced. Accordingly, even when the area of the display portion 33 is small, the gate driver circuit 21 and the source driver circuit 22 can be provided without extending beyond the display portion 33. Alternatively, the area of the region where the gate driver circuit 21 and the source driver circuit 22 do not overlap with the display portion 33 can be reduced. In the above manner, the frame and size of the display device 10 can be further reduced, compared to the structure without the region 23.

The circuit 40 can be provided not to overlap with the display portion 33. Note that the circuit 40 may be provided to have a region overlapping with the display portion 33.

Figure 2:
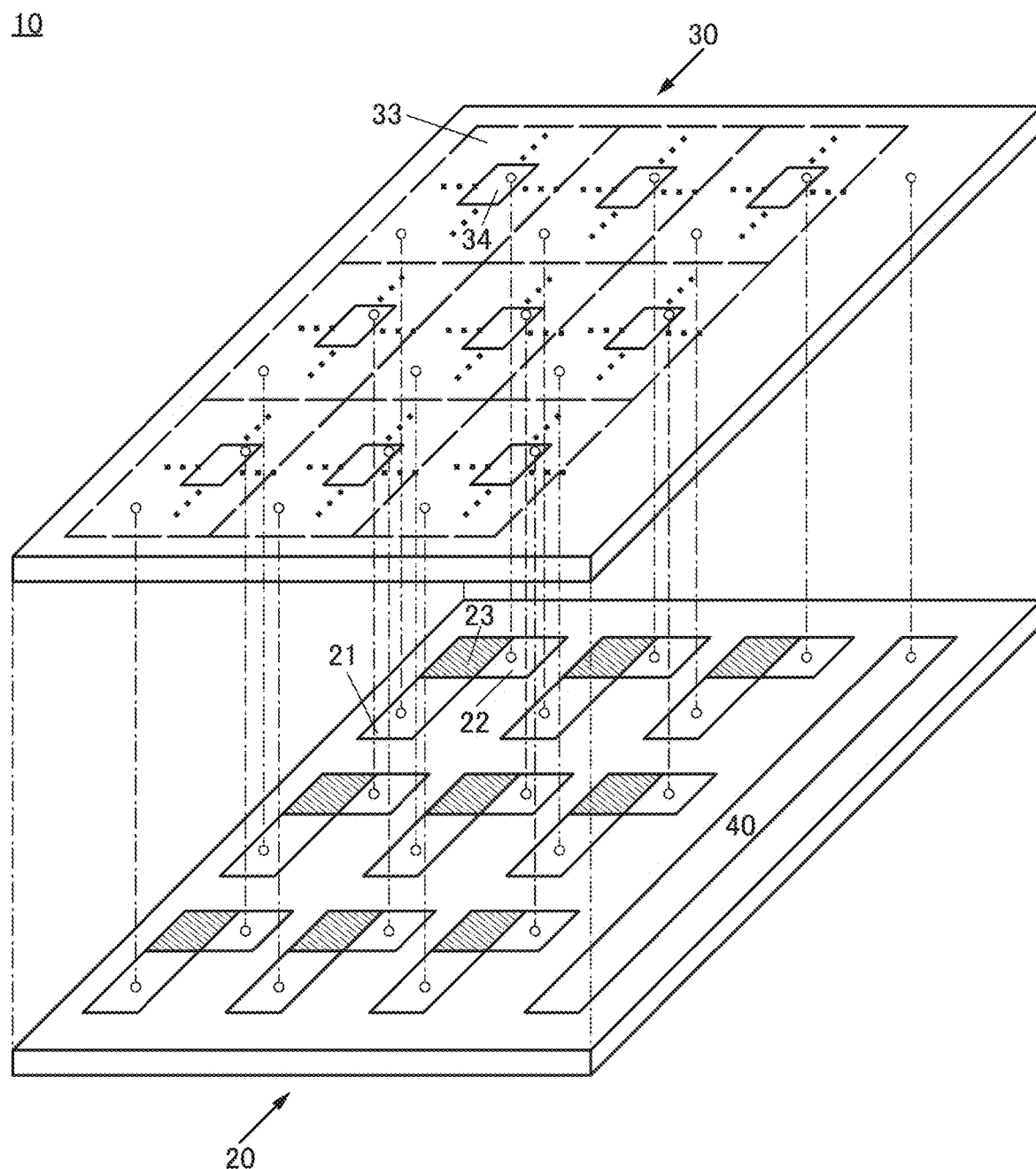
FIG. 2 A block diagram illustrating a structure example of a display device.

Although FIG. 1 illustrates a structure example in which one gate driver circuit 21 and one source driver circuit 22 are provided in the layer 20 and one display portion 33 is provided in the layer 30, a plurality of display portions 33 may be provided in the layer 30. That is, the display portion provided in the layer 30 may be divided. FIG. 2 illustrates a modification example of the structure in FIG. 1, and shows a structure example of the display device 10 in which display portions 33 of three rows by three columns are provided in the layer 30. Note that the layer 30 may include display portions 33 of two rows by two columns, or display portions 33 of four or more rows by four or more columns. The number of rows and the number of columns of display portions 33 provided in the layer 30 may be different from each other. In the display device 10 having the structure illustrated in FIG. 2, one image can be displayed using all the display portions 33, for example.

Although the wirings 31 and 32 are omitted for simplicity in FIG. 2, the wirings 31 and 32 are actually provided in the display device 10 having the structure illustrated in FIG. 2. In addition, although the electrical connection relation of the circuit 40 is not illustrated in FIG. 2, the circuit 40 is actually electrically connected to the source driver circuit 22. Note that as in FIG. 2, some components and the like may be omitted in other diagrams.

In the layer 20, the gate driver circuits 21 as many as the display portions 33 and the source driver circuits 22 as many as the display portions 33 can be provided, for example. In that case, each of the gate driver circuits 21 can be provided to overlap with the corresponding the display portion 33 including the pixel 34 to which the gate driver circuit 21 supplies a signal. Moreover, each of the source driver circuits 22 can be provided to overlap with the corresponding the display portion 33 including the pixel 34 to which the source driver circuit 22 supplies an image signal.

When a plurality of display portions 33 are provided and a plurality of gate driver circuits 21 and source driver circuits 22 are provided accordingly, the number of pixels 34 provided in one display portion 33 can be reduced. A plurality of gate driver circuits 21 can be operated in parallel and a plurality of source driver circuits 22 can be operated in parallel; hence, the time required for writing image signals corresponding to a one-frame image to the pixels 34 can be shortened, for example. Thus, the length of one frame period can be shortened, and the display device 10 can operate at higher speed. Therefore, the number of pixels 34 included in the display device 10 can be increased, resulting in a higher definition of the display device 10. In addition, the resolution of an image that can be displayed by the display device of one embodiment of the present invention can be higher than the resolution of an image that can be displayed by a display device in which a gate driver circuit and a source driver circuit do not overlap with a display portion. Furthermore, the clock frequency can be lowered, so that power consumption of the display device 10 can be reduced.

With a structure where a gate driver circuit and a source driver circuit do not overlap with a display portion, the gate driver circuit and the source driver circuit are provided in a portion around the display portion, for example. In this case, it is difficult to provide display portions of more than two rows and more than two columns in terms of positions where source driver circuits would be provided, for example. In contrast, in the display device 10, the gate driver circuit and the source driver circuit can be provided in a layer different from the layer including the display portion, thereby having a region overlapping with the display portion; hence, display portions of more than two rows and more than two columns can be provided as illustrated in FIG. 2. In other words, five or more gate driver circuits and five or more source driver circuits can be provided in the display device 10.

As described above, the display device 10 can operate at higher speed, for example, than a display device in which a gate driver circuit and a source driver circuit do not overlap with a display portion. Thus, the definition of the display device 10 can be higher than that of the display device in which the gate driver circuit and the source driver circuit do not overlap with the display portion. For example, the pixel density of the display device 10 can be 1000 ppi or higher, 5000 ppi or higher, or 10000 ppi. Consequently, the display device 10 can display high-quality images with little graininess and highly realistic images. Thus, the display device 10 can be suitably used for, in particular, a display device having a display surface close to the user, especially a portable electronic device, a wearable electronic device (a wearable device), an e-book reader, or the like. Furthermore, the display device 10 can be suitably used for a VR device, an AR device, and the like. Moreover, the display device 10 can be suitably used for a viewfinder such as an electronic viewfinder that is provided in a digital camera or the like that is an electronic device including an imaging device.

The resolution of an image that can be displayed by the display device 10 can be higher than the resolution of an image that can be displayed by the display device in which the gate driver circuit and the source driver circuit do not overlap with the display portion. For example, in the case where the display device 10 is used for a viewfinder, the display device 10 can display an image having a resolution of 4K, 5K, or higher.

Note that even in the structure where a plurality of source driver circuits 22 and the like are provided in the layer 20 and a plurality of display portions 33 are provided in the layer 30, the number of circuits 40 provided in the display device 10 can be one as in the structure illustrated FIG. 1. As illustrated in FIG. 2, the circuit 40 can be provided not to overlap with any of the display portions 33. Note that the circuit 40 may be provided to have a region overlapping with any of the display portions 33.

Figure 3:
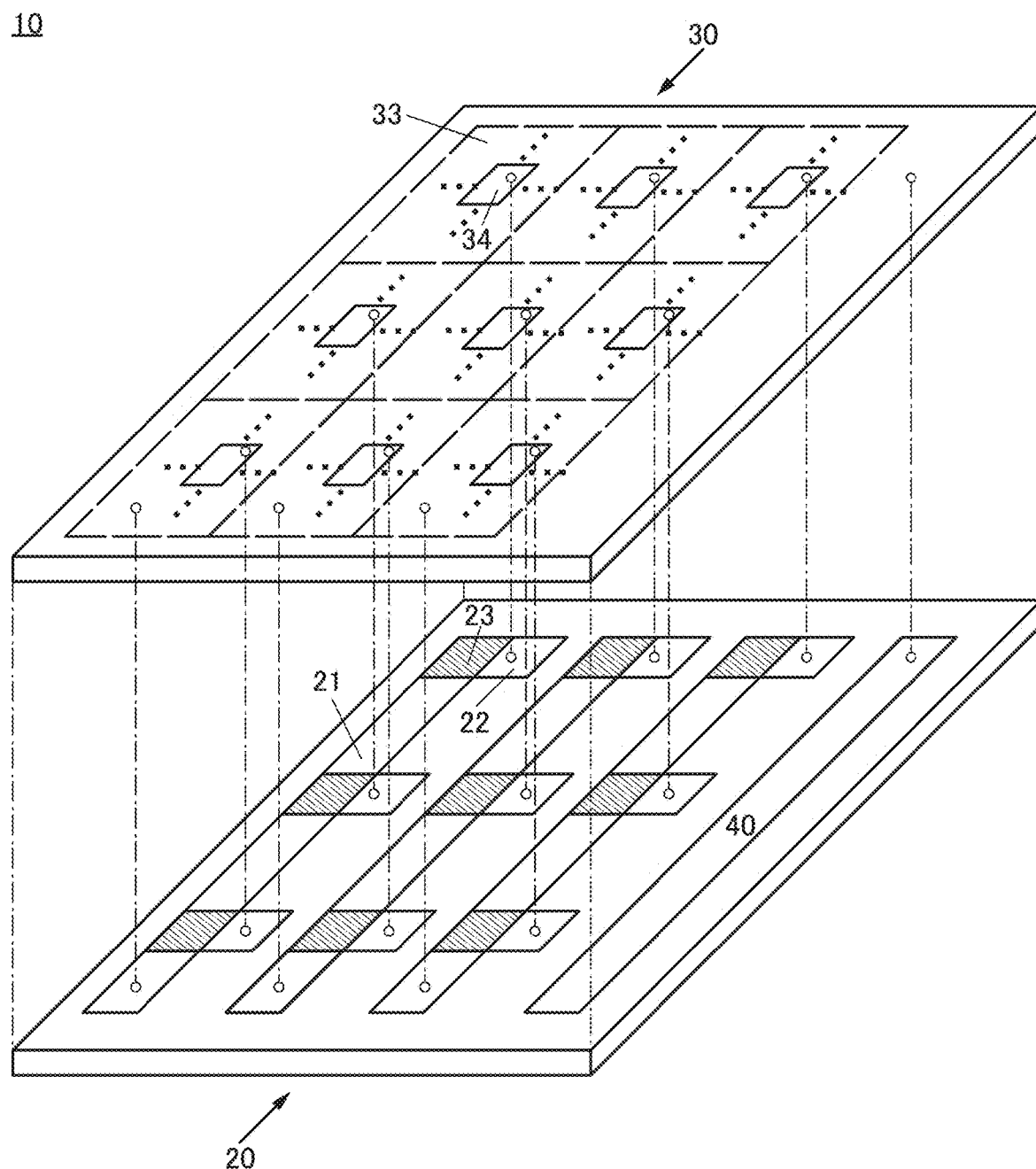
FIG. 3 A block diagram illustrating a structure example of a display device.

Although FIG. 2 illustrates the structure example in which the number of gate driver circuits 21 is the same as the number of display portions 33, one embodiment of the present invention is not limited thereto. FIG. 3 illustrates a modification example of the structure in FIG. 2, and shows a structure example of the display device 10 in which the number of gate driver circuits 21 is the same as the number of columns of the display portions 33. In the display device 10 with the structure illustrated in FIG. 3, three gate driver circuits 21 are provided to correspond to display portions 33 of three columns. In addition, display portions 33 of three rows are provided, and the display portions 33 of three rows and one column share one gate driver circuit 21.

Figure 4:
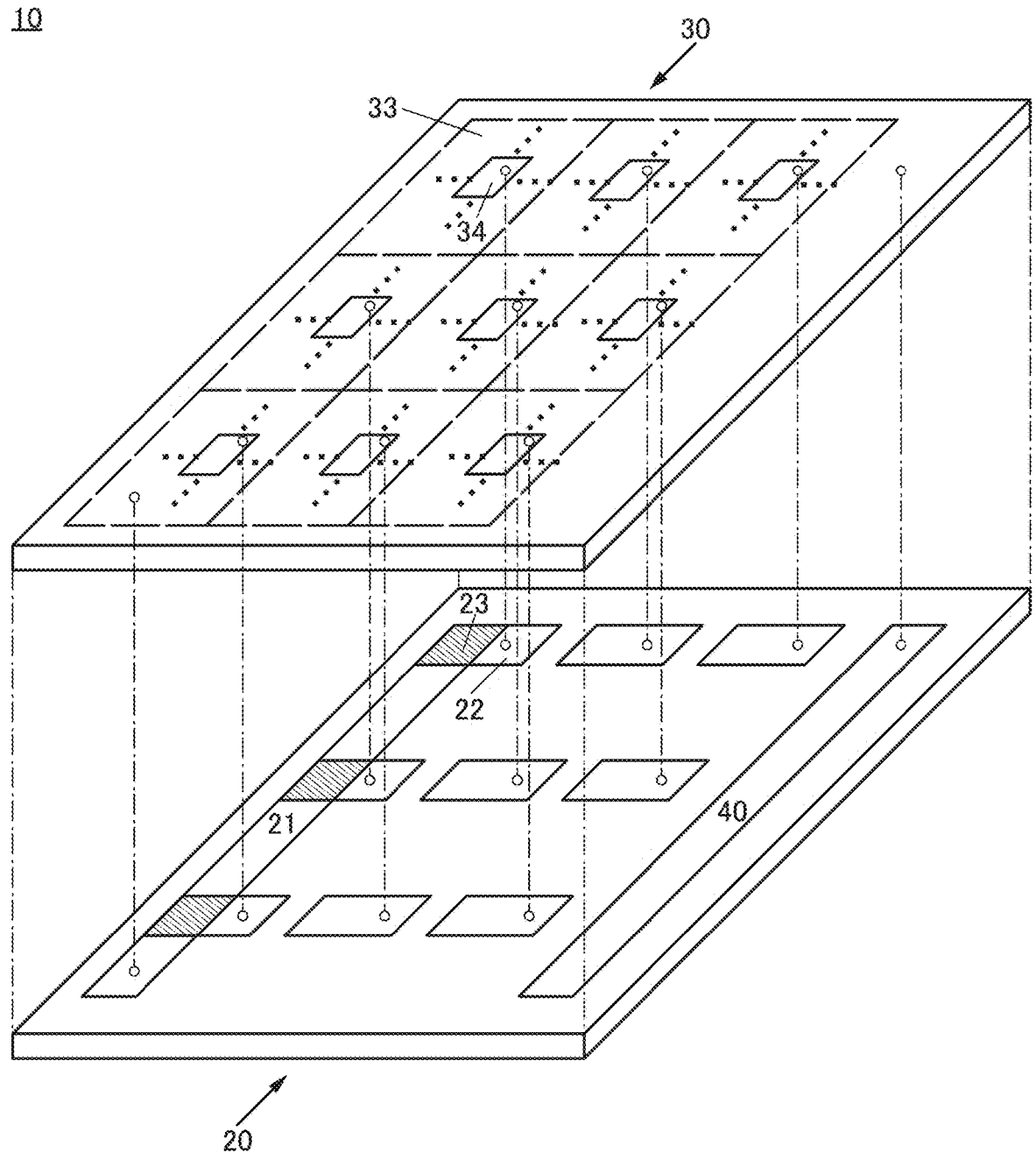
FIG. 4 A block diagram illustrating a structure example of a display device.

FIG. 4 illustrates a modification example of the structure in FIG. 2, and shows a structure example of the display device 10 including a plurality of display portions 33 and one gate driver circuit 21. In the display device 10 with the structure illustrated in FIG. 4, display portions 33 of three rows and three columns share one gate driver circuit 21. Note that in the display device 10 with the structure in FIG. 4, the gate driver circuit 21 can be provided not to overlap with the display portion 33.

Although not illustrated, the number of source driver circuits 22 is not necessarily the same as the number of display portions 33. The number of source driver circuits 22 in the display device 10 may be larger than or smaller than the number of display portions 33 in the display device 10.

Figure 5:
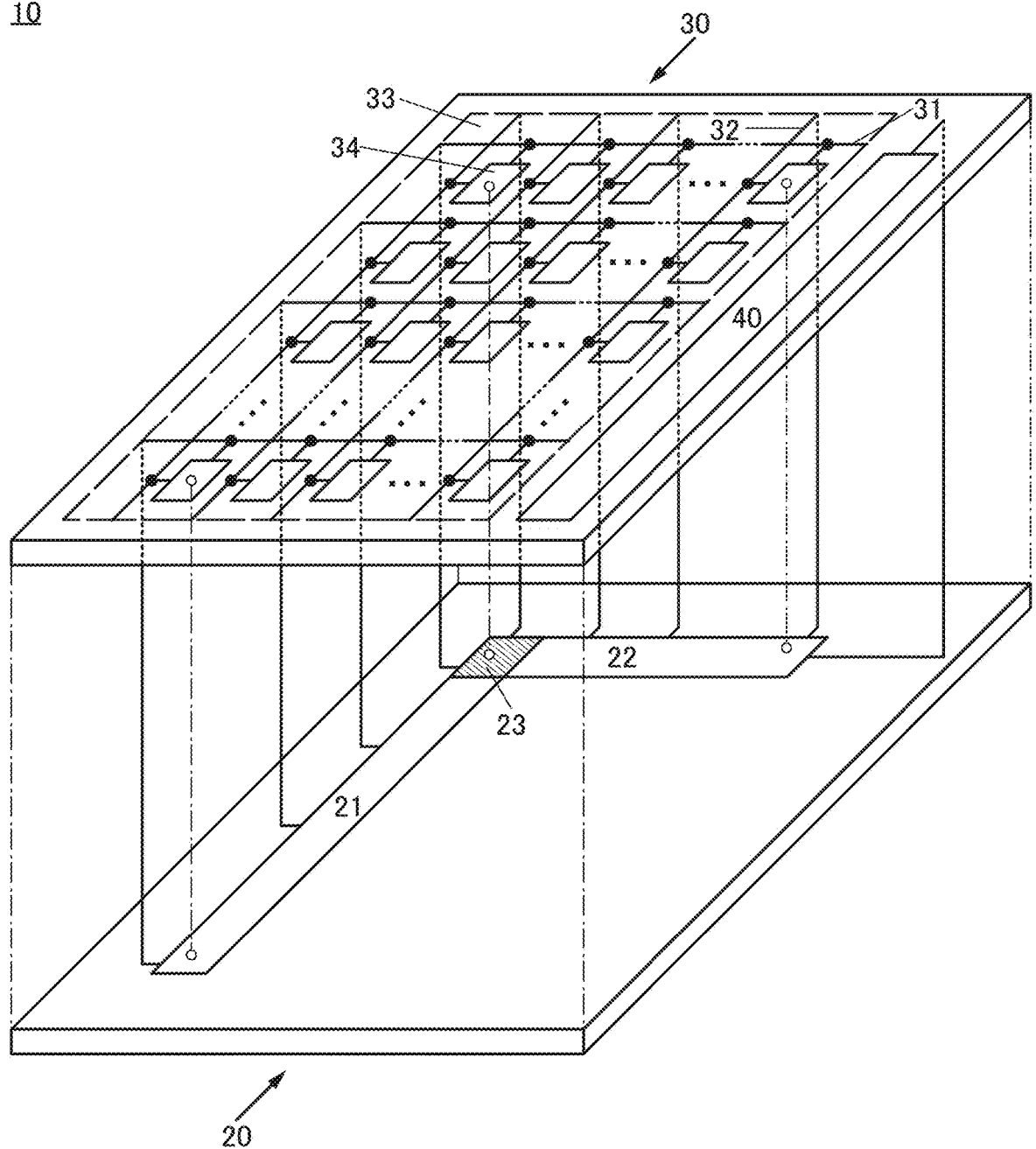
FIG. 5 A block diagram illustrating a structure example of a display device.

Although FIG. 1 illustrates the structure example in which the circuit 40 is provided in the layer 20, the circuit 40 is not necessarily provided in the layer 20. FIG. 5 illustrates a modification example of the structure in FIG. 1 and shows a structure example of the display device 10 in which the circuit 40 is provided in the layer 30. Note that the components of the circuit 40 may be provided in both the layer 20 and the layer 30.

Figure 6:
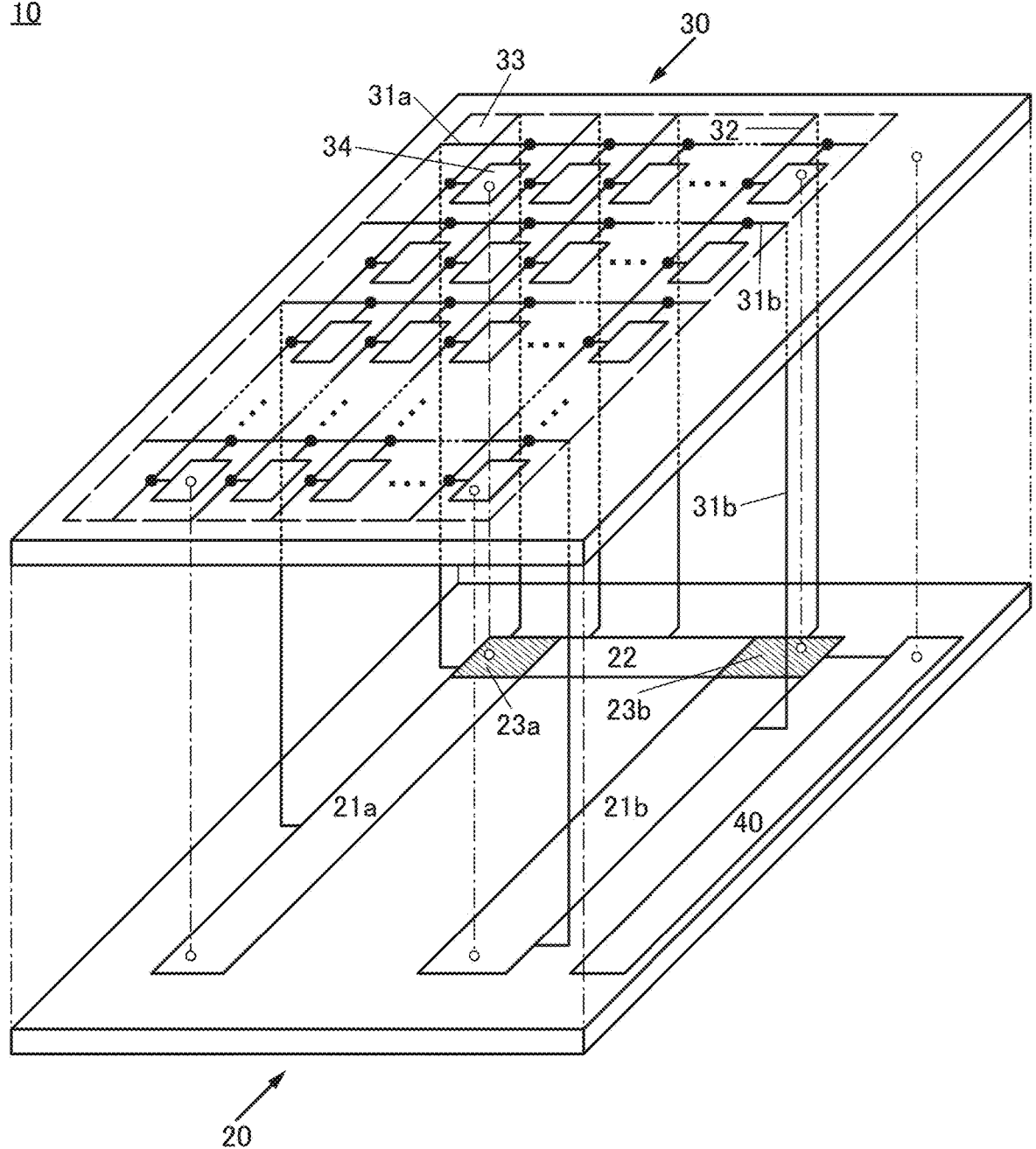
FIG. 6 A block diagram illustrating a structure example of a display device.

Although FIG. 1 illustrates the structure example including one display portion 33 and one gate driver circuit, the number of gate driver circuits may be larger than that of display portions 33. FIG. 6 illustrates a modification example of the structure in FIG. 1, and shows a structure example of the display device 10 in which two gate driver circuits (a gate driver circuit 21a and a gate driver circuit 21b) are provided for one display portion 33.

In the display device 10 having the structure illustrated in FIG. 6, the pixels 34 in an odd-numbered row are electrically connected to the gate driver circuit 21a through a wiring 31a, and the pixels 34 in an even-numbered row are electrically connected to the gate driver circuit 21b through a wiring 31b. The wiring 31a and the wiring 31b function as scan lines like the wiring 31.

The gate driver circuit 21a has a function of generating a signal for controlling the operation of the pixel 34 in the odd-numbered row and supplying the signal to the pixel 34 through the wiring 31a. The gate driver circuit 21b has a function of generating a signal for controlling the operation of the pixel 34 in the even-numbered row and supplying the signal to the pixel 34 through the wiring 31b.

Like the gate driver circuit 21, the gate driver circuit 21a and the gate driver circuit 21b include a region overlapping with the display portion 33. For example, the gate driver circuit 21a and the gate driver circuit 21b include a region overlapping with some of the pixels 34, like the gate driver circuit 21. The gate driver circuit 21a includes a region 23a where the gate driver circuit 21a overlaps with the source driver circuit 22 without being strictly separated from the source driver circuit 22. The gate driver circuit 21b includes a region 23b where the gate driver circuit 21b overlaps with the source driver circuit 22 without being strictly separated from the source driver circuit 22.

In the display device 10 having the structure illustrated in FIG. 6, the gate driver circuit 21a can operate to write image signals to all the pixels 34 in the odd-numbered rows, and then the gate driver circuit 21b can operate to write image signals to all the pixels 34 in the even-numbered rows. That is, the display device 10 having the structure illustrated in FIG. 6 can operate by an interlace method. With an interlace method, the operating speed of the display device 10 can be increased and the frame frequency can be increased. In addition, the number of pixels 34 to which image signals are written in one frame period can be half that when the display device 10 operates by a progressive method. Thus, in the display device 10, the clock frequency can be lower in interlace driving than in progressive driving; hence, power consumption of the display device 10 can be reduced.

Figure 7:
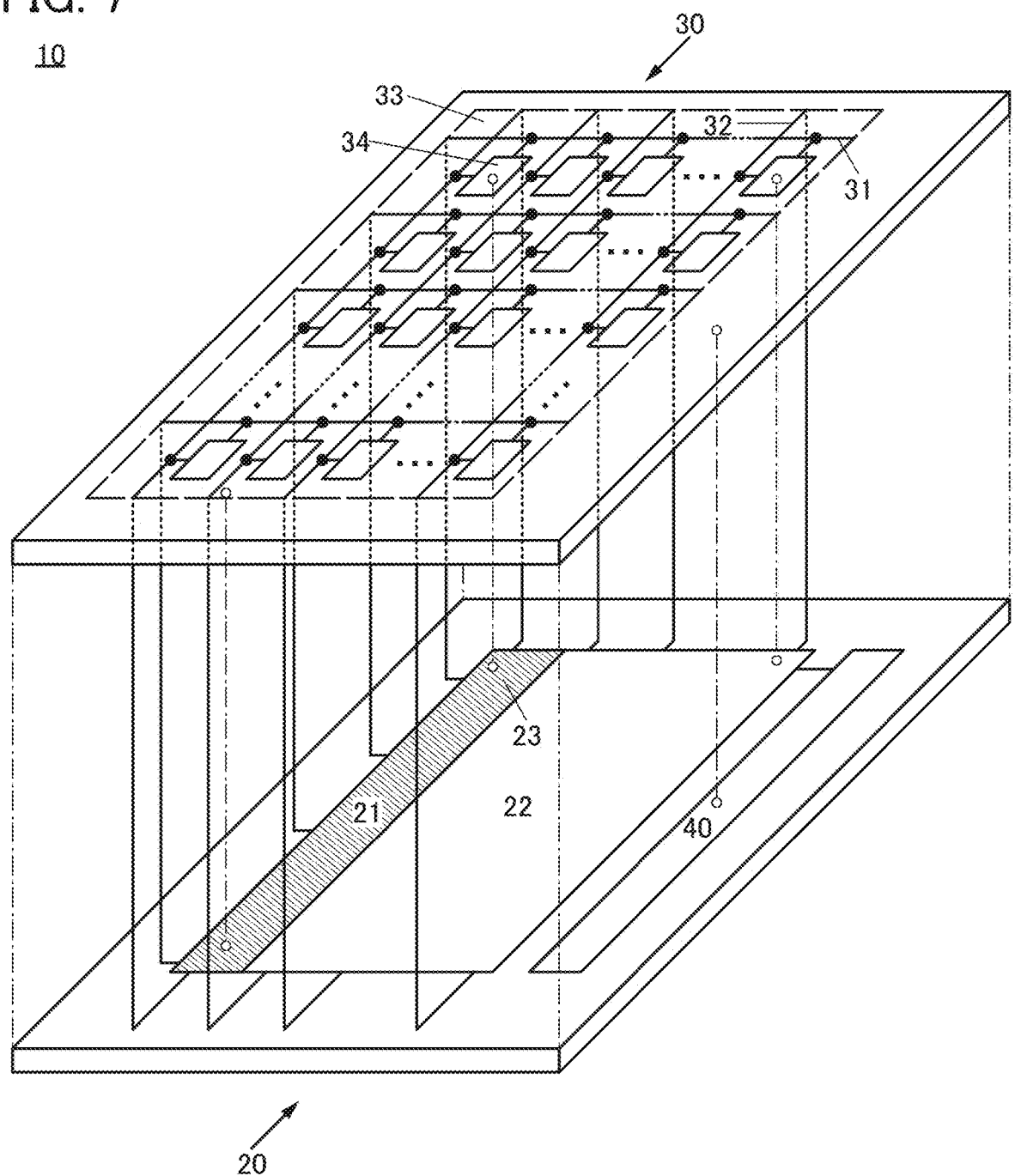
FIG. 7 A block diagram illustrating a structure example of a display device.

Although FIG. 1 illustrates the structure example in which only one end of the wiring 32 is connected to the source driver circuit 22, a plurality of portions of the wiring 32 may be connected to the source driver circuit 22. FIG. 7 illustrates a structure example of the display device 10 in which the source driver circuit 22 is connected to both ends of the wiring 32. When a plurality of portions of the wiring 32 are connected to the source driver circuit 22, signal delay due to wiring resistance, parasitic capacitance, and the like can be inhibited, for example. This increases the operating speed of the display device 10.

Note that not only the one end and the other end of the wirings 32 but also another portion of the wiring 32 may be connected to the source driver circuit 22. For example, a center portion of the wiring 32 may be connected to the source driver circuit 22. By increasing the number of portions where the wiring 32 and the source driver circuit 22 are connected, signal delay and the like can be further inhibited and the operating speed of the display device 10 can be further increased. Note that for example, a structure may be employed in which one end of the wiring 32 and a center portion of the wiring 32 are connected to the source driver circuit 22 and the other end of the wiring 32 is not connected to the source driver circuit 22.

When one source driver circuit 22 is connected to a plurality of portions of the wiring 32, the area occupied by the source driver circuit 22 increases as illustrated in FIG. 7. Even in that case, the source driver circuit 22 is stacked to have a region overlapping with the display portion 33, which can inhibit an increase in size of the display device 10. FIG. 7 shows that the entire gate driver circuit 21 overlaps with the source driver circuit 22 without being strictly separated from the source driver circuit 22; however, even when one source driver circuit 22 is connected to a plurality of portions of the wiring 32, only part of the gate driver circuit 21 may overlap with the source driver circuit 22.

Note that a plurality of portions of the wiring 31 may be connected to one gate driver circuit 21; thus, signal delay or the like can be inhibited, and the operating speed of the display device 10 can be increased. Such a structure increases the area occupied by the gate driver circuit 21 as in the case of employing the source driver circuit 22 in FIG. 7; however, the gate driver circuit 21 is stacked to have a region overlapping with the display portion 33, which can prevent an increase in size of the display device 10.

The structures of the display device 10 that are illustrated in FIG. 1 to FIG. 7 can be combined as appropriate. For example, the structure in FIG. 2 can be combined with the structure in FIG. 6. In this case, the display device 10 can include, for example, a plurality of display portions 33, gate driver circuits 21 twice as many as the display portions 33, and source driver circuits 22 as many as the display portions 33.

Structure Example of Circuit 40 and Source Driver Circuit 22

Figure 8:
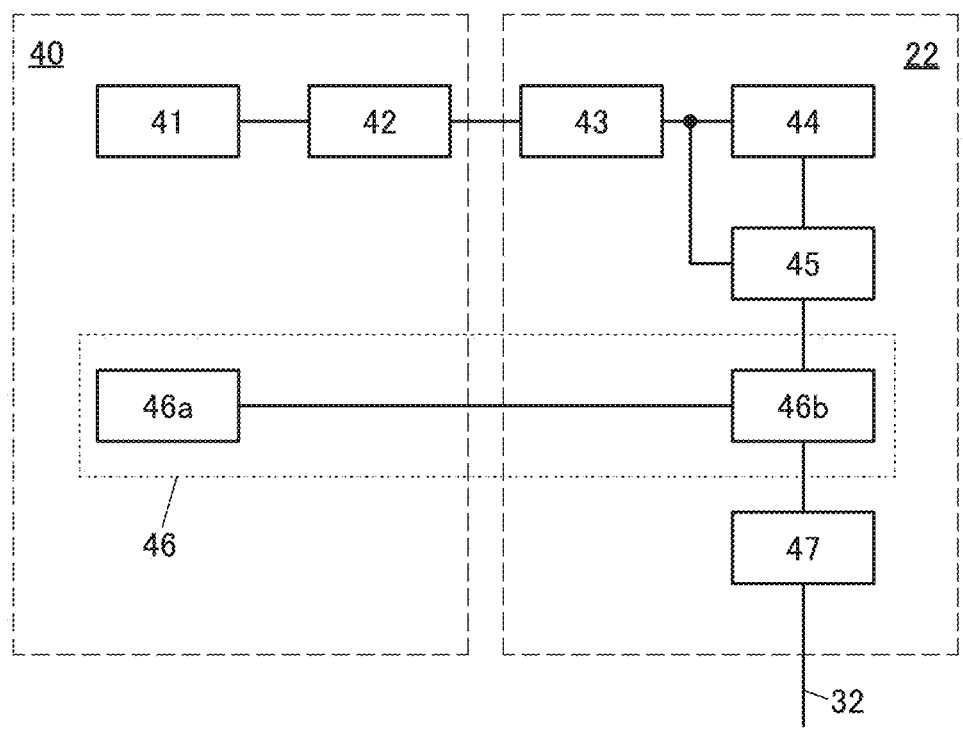
FIG. 8 A block diagram illustrating a structure example of a display device.

FIG. 8 is a block diagram illustrating a structure example of the circuit 40 and the source driver circuit 22. Although FIG. 8 illustrates only one source driver circuit 22, the circuit 40 can be electrically connected to a plurality of source driver circuits 22.

The circuit 40 includes a receiver circuit 41, a serial-to-parallel converter circuit 42, and a potential generator circuit 46a. The source driver circuit 22 includes a buffer circuit 43, a shift register circuit 44, a latch circuit 45, a pass transistor logic circuit 46b, and an amplifier circuit 47. Here, the potential generator circuit 46a and the pass transistor logic circuit 46b constitute a digital-to-analog converter circuit (hereinafter D/A converter circuit) 46.

The receiver circuit 41 is electrically connected to the serial-to-parallel converter circuit 42. The serial-to-parallel converter circuit 42 is electrically connected to the buffer circuit 43. The buffer circuit 43 is electrically connected to the shift register circuit 44 and the latch circuit 45. The shift register circuit 44 is electrically connected to the latch circuit 45. The latch circuit 45 and the potential generator circuit 46a are electrically connected to the pass transistor logic circuit 46b. The pass transistor logic circuit 46b is electrically connected to an input terminal of the amplifier circuit 47. An output terminal of the amplifier circuit 47 is electrically connected to the wiring 32.

The receiver circuit 41 has a function of receiving image data that serves as a base for an image signal generated by the source driver circuit 22. The image data can be single-ended image data. When the receiver circuit 41 receives image data with the use of a data transmitting signal based on low voltage differential signaling (LVDS) or the like, the receiver circuit 41 may have a function of converting the received signal into a signal based on a standard that can undergo internal processing.

The serial-to-parallel converter circuit 42 has a function of performing parallel conversion of single-ended image data output from the receiver circuit 41. Providing the serial-to-parallel converter circuit 42 in the circuit 40 allows image data and the like to be transmitted from the circuit 40 to the source driver circuit 22 and the like even if the load is large at the time of transmitting image data and the like from the circuit 40 to the source driver circuit 22 and the like.

The buffer circuit 43 can be a unity gain buffer, for example. The buffer circuit 43 has a function of outputting data identical to image data output from the serial-to-parallel converter circuit 42. With the buffer circuit 43 provided in the source driver circuit 22, even if a potential corresponding to image data output from the serial-to-parallel converter circuit 42 is lowered by wiring resistance or the like when being transmitted from the circuit 40 to the source driver circuit 22, a potential corresponding to the decrease amount can be recovered. Accordingly, the decrease in driving capability of the source driver circuit 22 and the like can be inhibited even if the load is large at the time of transmitting image data and the like from the circuit 40 to the source driver circuit 22 and the like.

The shift register circuit 44 has a function of generating a signal for controlling the operation of the latch circuit 45. The latch circuit 45 has a function of holding or outputting image data output from the buffer circuit 43. Whether the latch circuit 45 holds or outputs image data is selected in accordance with a signal supplied from the shift register circuit 44.

The D/A converter circuit 46 has a function of converting digital image data, which is output from the latch circuit 45, into an analog image signal. The potential generator circuit 46a has a function of generating potentials that correspond to the number of bits of image data capable of being subjected to D/A conversion and supplying the potentials to the pass transistor logic circuit 46b. For example, when the D/A converter circuit 46 has a function of converting 8-bit image data into an analog image signal, the potential generator circuit 46a can generate 256 potentials with different levels.

The pass transistor logic circuit 46b has a function of receiving image data from the latch circuit 45 and outputting any of the potentials generated by the potential generator circuit 46a on the basis of the digital value of the received image data. For example, a potential output from the pass transistor logic circuit 46b can be higher as the digital value of image data is higher. The potential output from the pass transistor logic circuit 46b can be used as an image signal.

As illustrated in FIG. 8, in the display device 10, the circuits constituting the D/A converter circuit 46 can be provided in both the source driver circuit 22 and the circuit 40. Specifically, a circuit that is preferably provided in each source driver circuit such as the pass transistor logic circuit 46b can be provided in the source driver circuit 22, and a circuit that is not necessarily provided in each source driver circuit such as the potential generator circuit 46a can be provided in the circuit 40. In that case, the area occupied by the source driver circuit 22 can be reduced as compared with the case where all circuits constituting the D/A converter circuit 46 are provided in the source driver circuit 22, for example; hence, the number of source driver circuits 22 provided in the layer 20 can be increased. Thus, the number of display portions 33 provided in the layer 30 can be increased, and it is possible to achieve high speed operation, low power consumption, and high definition of the display device 10, for example, as well as high resolution of images that the display device 10 can display. Here, the components of a circuit other than the D/A converter circuit 46 can also be provided in both the source driver circuit 22 and the circuit 40.

When the circuits constituting the D/A converter circuit 46 are provided in both the source driver circuit 22 and the circuit 40 as illustrated in FIG. 8, the display device 10 can include one potential generator circuit 46a and pass transistor logic circuits 46b as many as the source driver circuits 22.

The amplifier circuit 47 has a function of amplifying an image signal output from the pass transistor logic circuit 46b and outputting the amplified signal to the wiring 32 functioning as a data line. Providing the amplifier circuit 47 allows an image signal to be supplied to the pixel 34 stably. As the amplifier circuit 47, a voltage follower circuit including an operational amplifier and the like can be used, for example. Note that in the case where a circuit including a differential input circuit is used as the amplifier circuit, the offset voltage of the differential input circuit is preferably set as close to 0 V as possible.

In the circuit 40, a variety of circuits can be provided in addition to the receiver circuit 41, the serial-to-parallel converter circuit 42, and the potential generator circuit 46a. For example, the circuit 40 can include a control circuit having a function of generating a start pulse signal, a clock signal, and the like.

Configuration Example of D/A Converter Circuit 46

Figure 9:
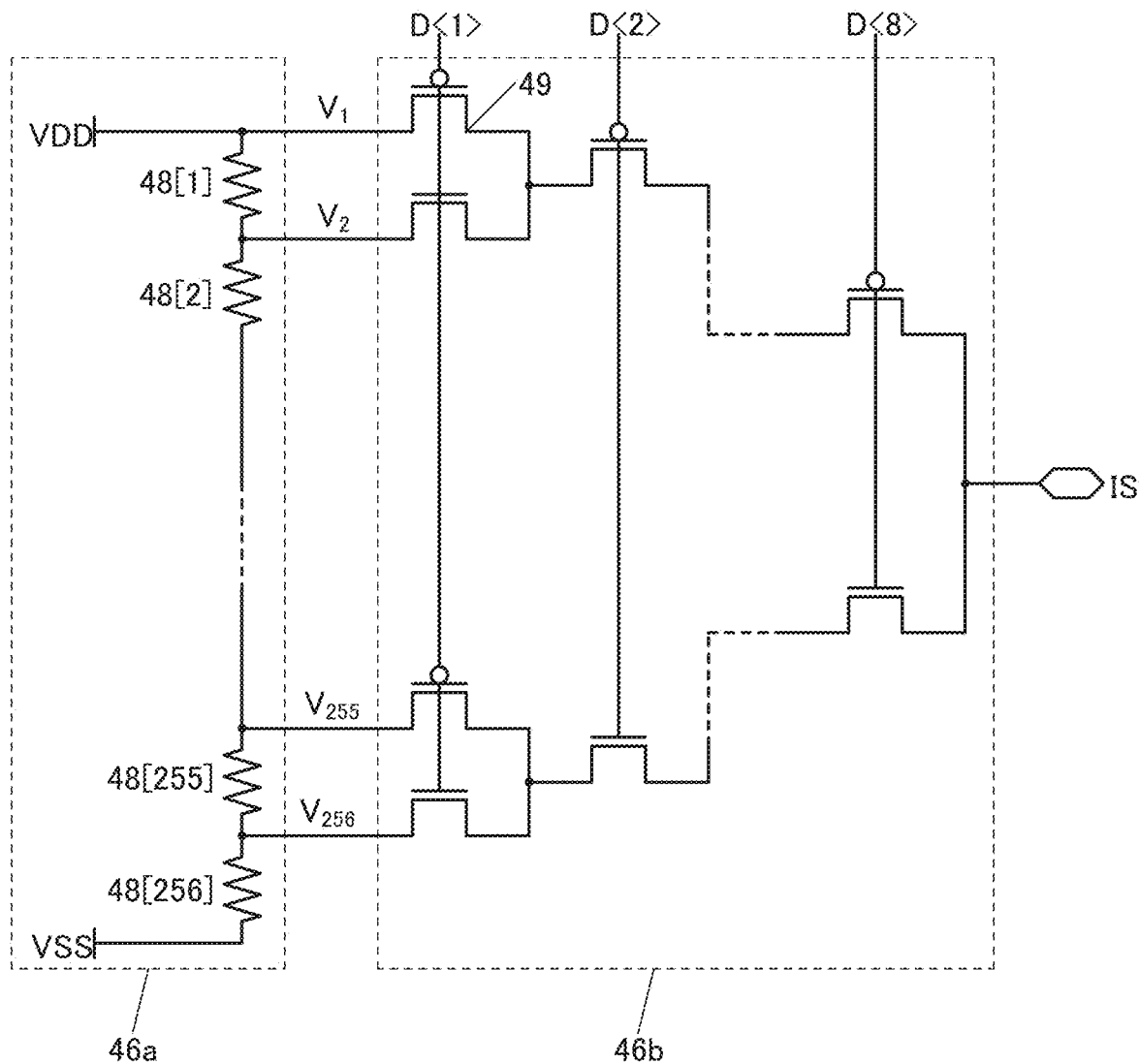
FIG. 9 A circuit diagram illustrating a configuration example of a D/A converter circuit.

FIG. 9 is a circuit diagram illustrating a configuration example of the potential generator circuit 46a and the pass transistor logic circuit 46b, which constitute the D/A converter circuit 46. The D/A converter circuit 46 having the configuration illustrated in FIG. 9 is capable of converting 8-bit image data D<1> to D<8> into an analog image signal IS.

In this specification and the like, for example, first-bit image data D is denoted as the image data D<1>, second-bit image data D as the image data D<2>, and eighth-bit image data D as the image data D<8>.

The potential generator circuit 46a having the configuration in FIG. 9 includes resistors 48[1] to 48[256] that are connected in series. In other words, the D/A converter circuit 46 can be a resistor-string D/A converter circuit.

A potential VDD can be supplied to one terminal of the resistor 48[1]. A potential VSS can be supplied to one terminal of the resistor 48[256]. Thus, potentials $V_1$ to $V_{256}$ that have different levels can be output from the terminals of the resistors 48[1] to 48[256]. Although FIG. 9 illustrates a configuration example of the potential generator circuit 46a in which the potential $V_1$ is the potential VDD, the potential $V_{256}$ may be the potential VSS. Alternatively, the potential $V_1$ may be the potential VDD and the potential $V_{256}$ may be the potential VSS without providing the resistor 48[256].

In this specification and the like, the potential VDD can be a high potential and the potential VSS can be a low potential, for example. Here, the low potential can be a ground potential, for example. The high potential is a potential higher than the low potential, and can be a positive potential when the low potential is a ground potential.

The pass transistor logic circuit 46b having the configuration in FIG. 9 is formed of 8-stage pass transistors 49. Specifically, the pass transistor logic circuit 46b has a structure in which one stage is separated into two electrical paths; i.e., the pass transistor logic circuit 46b has a total of 256 paths. That is, the pass transistors 49 can be regarded as being electrically connected in a tournament manner. The analog image signal IS can be output from one of a source and a drain of the pass transistor 49 in the eighth stage, which is the last stage.

For example, the image data D<1> can be supplied to the pass transistor 49 in the first stage, the image data D<2> can be supplied to the pass transistors 49 in the second stage, and the image data D<8> can be supplied to the pass transistors 49 in the eighth stage. In this manner, the potential of the image signal IS can be set to any of the potentials $V_1$ to $V_{256}$ in accordance with the image data D. Consequently, digital image data can be converted into the analog image signal IS.

The pass transistor logic circuit 46b in FIG. 9 includes n-channel pass transistors 49 and p-channel pass transistors 49; alternatively, the pass transistor logic circuit 46b can include only n-channel pass transistors 49. The pass transistors 49 provided in the pass transistor logic circuit 46b can be all n-channel transistors when the image data D<1> to D<8> and their complementary data are supplied to the gates of the pass transistors 49, for example.

The configuration illustrated in FIG. 9 can also be applied to the D/A converter circuit 46 having a function of performing D/A conversion on the image data D with bits other than 8 bits. For example, when 1024 or 1023 resistors 48 are provided in the potential generator circuit 46a and 10-stage pass transistors 49 are provided in the pass transistor logic circuit 46b, the D/A converter circuit 46 can have a function of performing D/A conversion on 10-bit image data D.

Configuration Example of Gate Driver Circuit 21

Figure 10:
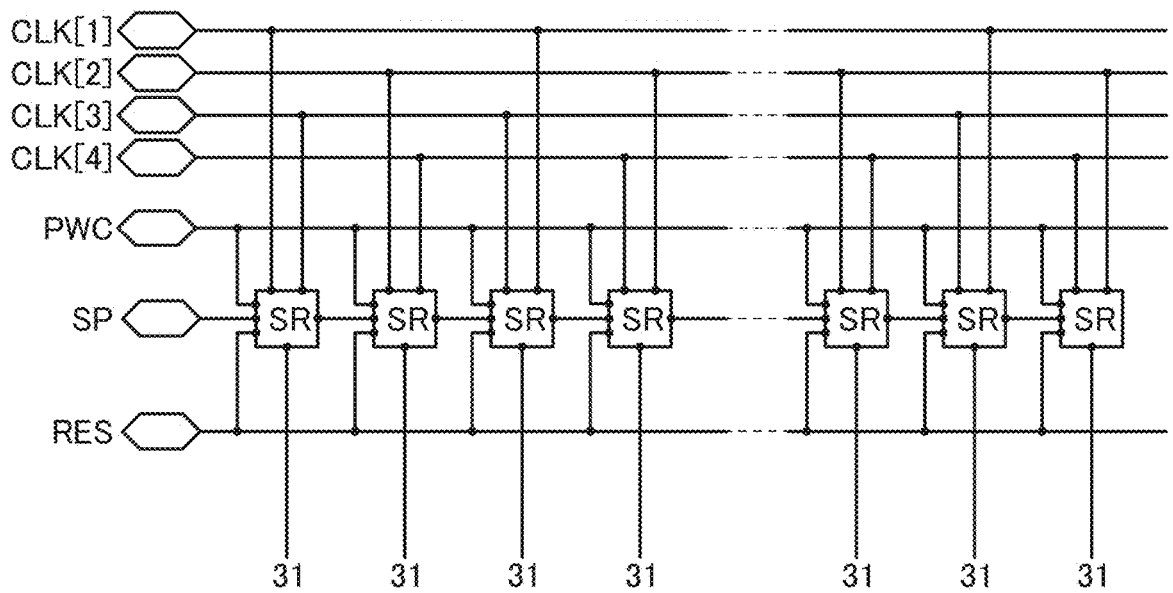
FIG. 10 A block diagram illustrating a configuration example of a shift register.

FIG. 10 is a block diagram illustrating a configuration example of the gate driver circuit 21. The gate driver circuit 21 includes shift register circuits SR composed of a plurality of set-reset flip-flops. The shift register circuit SR is electrically connected to the wiring 31 having a function of a scan line, and has a function of outputting a signal to the wiring 31.

A signal RES is a reset signal. When the signal RES is set to a high potential, for example, all the outputs of the shift register circuits SR can be a low potential. A signal SP is a start pulse signal. When the signal SP is input to the gate driver circuit 21, the shift operation of the shift register circuits SR can be started. A signal PWC is a pulse width control signal and has a function of controlling the pulse width of a signal output from the shift register circuit SR to the wiring 31. A signal CLK[1], a signal CLK[2], a signal CLK[3], and a signal CLK[4] are clock signals. For example, two of the signals CLK[1] to CLK[4] can be input to one shift register circuit SR.

Note that the configuration illustrated in FIG. 10 can be applied to the shift register circuit 44 and the like included in the source driver circuit 22 when the wiring 31 electrically connected to the shift register circuit SR is replaced with another wiring, for example.

Figure 11A:
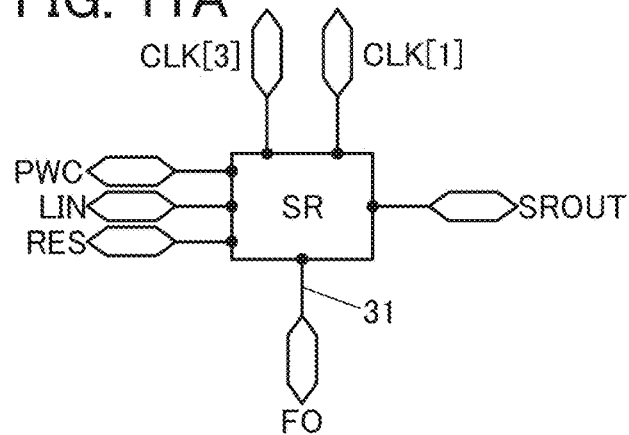
FIG. 11 (A) A block diagram illustrating a configuration example of a shift register. (B) A circuit diagram illustrating a configuration example of a shift register.

FIG. 11(A) illustrates signals input to the shift register circuit SR and signals output from the shift register circuit SR. Here, FIG. 11(A) illustrates the case where the signal CLK[1] and the signal CLK[3] are input as the clock signals.

A signal FO is an output signal and is output to the wiring 31, for example. A signal SROUT is a shift signal and can be used as a signal LIN that is input to the next-stage shift register circuit SR. Among the signals illustrated in FIG. 11(A), the signal RES, the signal PWC, the signal CLK[1], the signal CLK[3], and the signal LIN are input to the shift register circuit SR; the signal FO and the signal SROUT are output from the shift register circuit SR.

Figure 11B:
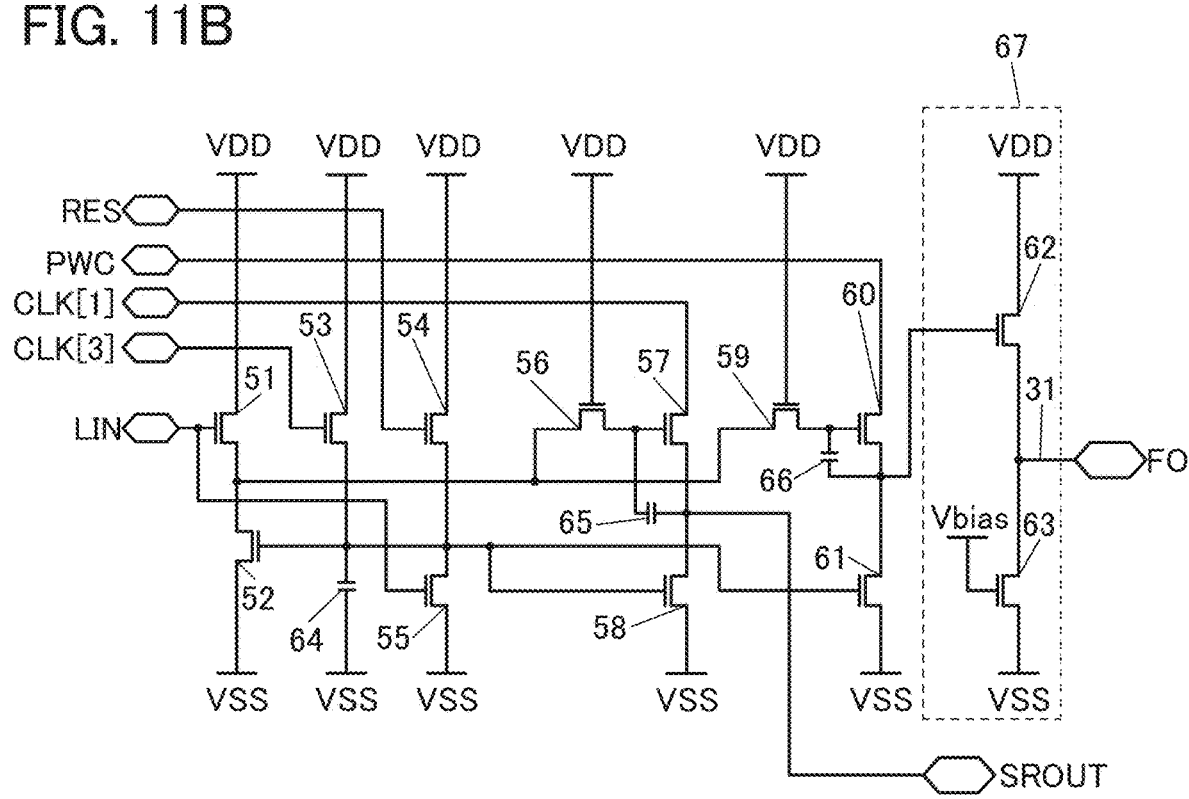

FIG. 11(B) is a circuit diagram illustrating a configuration example of the shift register circuit SR that inputs and outputs the signals illustrated in FIG. 11(A). The shift register circuit SR includes transistors 51 to 63 and capacitors 64 to 66.

One of a source and a drain of the transistor 51 is electrically connected to one of a source and a drain of the transistor 52, one of a source and a drain of the transistor 56, and one of a source and a drain of the transistor 59. A gate of the transistor 52 is electrically connected to one of a source and a drain of the transistor 53, one of a source and a drain of the transistor 54, one of a source and a drain of the transistor 55, a gate of the transistor 58, a gate of the transistor 61, and one electrode of the capacitor 64. The other of the source and the drain of the transistor 56 is electrically connected to a gate of the transistor 57 and one electrode of the capacitor 65. The other of the source and the drain of the transistor 59 is electrically connected to a gate of the transistor 60 and one electrode of the capacitor 66. One of a source and a drain of the transistor 60 is electrically connected to one of a source and a drain of the transistor 61, a gate of the transistor 62, and the other electrode of the capacitor 66.

The signal LIN is input to a gate of the transistor 51 and a gate of the transistor 55. The signal CLK[3] is input to a gate of the transistor 53. The signal RES is input to a gate of the transistor 54. The signal CLK[1] is input to one of a source and a drain of the transistor 57. The signal PWC is input to the other of the source and the drain of the transistor 60.

One of a source and a drain of the transistor 62 and one of a source and a drain of the transistor 63 are electrically connected to the wiring 31, and the signal FO is output from the wiring 31 as described above. The signal SROUT is output from the other of the source and the drain of the transistor 57, one of a source and a drain of the transistor 58, and the other electrode of the capacitor 65.

The potential VDD is supplied to the other of the source and the drain of the transistor 51, the other of the source and the drain of the transistor 53, the other of the source and the drain of the transistor 54, a gate of the transistor 56, a gate of the transistor 59, and other of the source and drain of the transistor 62. The potential VSS is supplied to the other of the source and the drain of the transistor 52, the other of the source and the drain of the transistor 55, the other of the source and the drain of the transistor 58, the other of the source and the drain of the transistor 61, the other of the source and the drain of the transistor 63, and the other electrode of the capacitor 64.

The transistor 63 is a bias transistor and has a function of a constant current source. A potential Vbias that is a bias potential can be supplied to a gate of the transistor 63.

The transistor 62 and the transistor 63 form a source follower circuit 67. Even if signal decay or the like due to wiring resistance, parasitic capacitance, or the like occurs inside the register circuit SR, the source follower circuit 67 in the shift register circuit SR can prevent the potential of the signal FO from being lowered by the signal decay or the like. This increases the operating speed of the display device 10. Note that the source follower circuit 67 may be replaced with another circuit as long as the circuit has a function of a buffer.

Structure Example of Region 23

Figure 12:
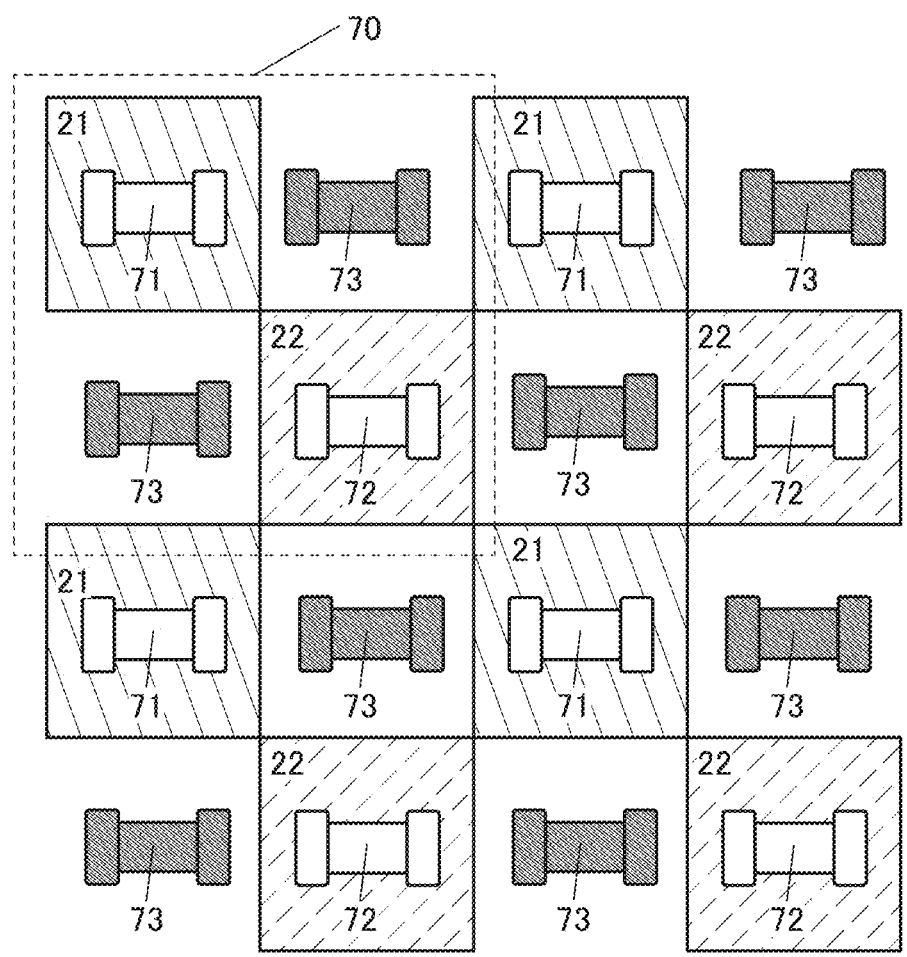
FIG. 12 A schematic diagram illustrating arrangement of a gate driver circuit and a source driver circuit.

FIG. 12 illustrates a structure example of the region 23, where the gate driver circuit 21 and the source driver circuit 22 overlap with each other. As illustrated in FIG. 12, regions including a component of the gate driver circuit 21 and regions including a component of the source driver circuit 22 are arranged in a certain regular pattern in the region 23. FIG. 12 shows a transistor 71 as a component of the gate driver circuit 21, and a transistor 72 as a component of the source driver circuit 22.

FIG. 12 illustrates the case where the regions including the component of the gate driver circuit 21 are provided in the first row and the third row, and the regions including the component of the source driver circuit 22 are provided in the second row and the fourth row. In the region 23, a dummy element is provided between the regions including the component of the gate driver circuit 21. A dummy element is provided between the regions including the component of the source driver circuit 22. FIG. 12 illustrates a structure example of the region 23 in which four dummy transistors 73 as dummy elements are provided around the transistor 71 and around the transistor 72.

When the dummy elements such as the dummy transistors 73 are provided in the region 23, the dummy elements can absorb impurities and inhibit diffusion of impurities into the transistor 71, the transistor 72, and the like. Thus, the reliability of the transistor 71, the transistor 72, and the like can be increased, leading to higher reliability of the display device 10. Although the transistors 71, the transistors 72, and the dummy transistors 73 are arranged in a matrix in FIG. 12, they are not necessarily arranged in a matrix.

Figure 13:
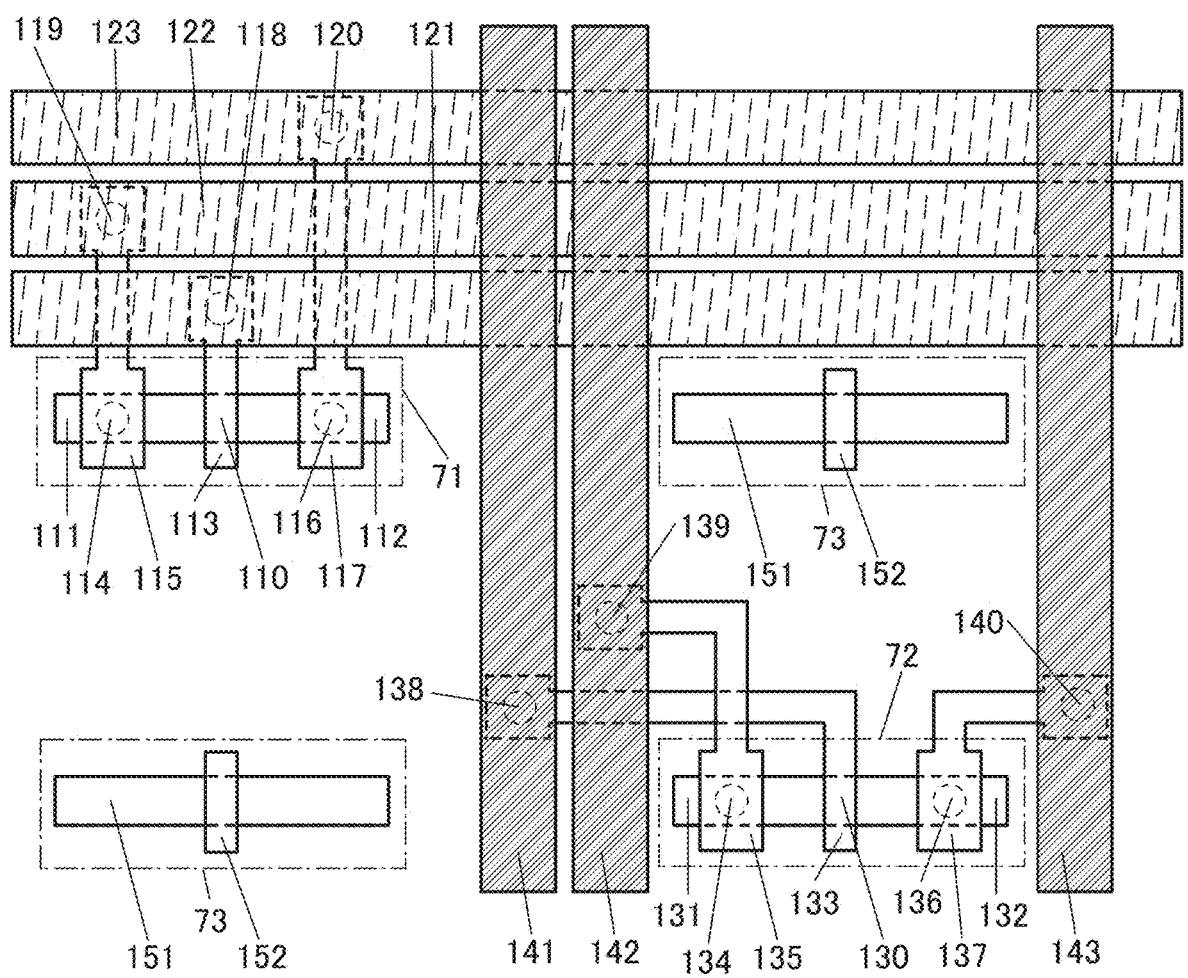
FIG. 13 A top view illustrating a structure example of a gate driver circuit and a source driver circuit.

FIG. 13 is a top view illustrating a structure example of a region 70 that is part of the region 23. As illustrated in FIG. 12 and FIG. 13, one transistor 71, one transistor 72, and two dummy transistors 73 are provided in the region 70. As illustrated in FIG. 13, the transistor 71 includes a channel formation region 110, a source region 111, and a drain region 112. The transistor 71 also includes a gate electrode 113 that has a region overlapping with the channel formation region 110.

Note that components such as a gate insulator are not illustrated in FIG. 13. The channel formation region, the source region, and the drain region are not illustrated as clearly separated regions in FIG. 13.

An opening 114 is provided in the source region 111, and the source region 111 is electrically connected to a wiring 115 through the opening 114. An opening 116 is provided in the drain region 112, and the drain region 112 is electrically connected to a wiring 117 through the opening 116.

An opening 118 is provided in the gate electrode 113, and the gate electrode 113 is electrically connected to a wiring 121 through the opening 118. An opening 119 is provided in the wiring 115, and the wiring 115 is electrically connected to a wiring 122 through the opening 119. An opening 120 is provided in the wiring 117, and the wiring 117 is electrically connected to a wiring 123 through the opening 120. In other words, the source region 111 is electrically connected to the wiring 122 through the wiring 115, and the drain region 112 is electrically connected to the wiring 123 through the wiring 117.

The transistor 72 includes a channel formation region 130, a source region 131, and a drain region 132. The transistor 72 also includes a gate electrode 133 that has a region overlapping with the channel formation region 130.

An opening 134 is provided in the source region 131, and the source region 131 is electrically connected to a wiring 135 through the opening 134. An opening 136 is provided in the drain region 132, and the drain region 132 is electrically connected to a wiring 137 through the opening 136.

An opening 138 is provided in the gate electrode 133, and the gate electrode 133 is electrically connected to a wiring 141 through the opening 138. An opening 139 is provided in the wiring 135, and the wiring 135 is electrically connected to a wiring 142 through the opening 139. An opening 140 is provided in the wiring 137, and the wiring 137 is electrically connected to a wiring 143 through the opening 140. In other words, the source region 131 is electrically connected to the wiring 142 through the wiring 135, and the drain region 132 is electrically connected to the wiring 143 through the wiring 137.

Note that the channel formation region 110 can be provided in the same layer as the channel formation region 130. The source region 111 and the drain region 112 can be provided in the same layer as the source region 131 and the drain region 132. The gate electrode 113 can be provided in the same layer as the gate electrode 133. The wirings 115 and 117 can be provided in the same layer as the wirings 135 and 137. That is, the transistor 71 can be provided in the same layer as the transistor 72. Consequently, the manufacturing process of the display device 10 can be simpler than the case where the transistor 71 and the transistor 72 are provided in different layers, making the display device 10 inexpensive.

The wiring 121 to the wiring 123 electrically connected to the transistor 71 included in the gate driver circuit 21 are provided in the same layer as each other. The wiring 141 to the wiring 143 electrically connected to the transistor 72 included in the source driver circuit 22 are provided in the same layer as each other. The wiring 121 to the wiring 123 are provided in a layer different from the layer where the wiring 141 to the wiring 143 are provided. In the above manner, an electrical short circuit between the transistor 71, which is the component of the gate driver circuit 21, and the transistor 72, which is the component of the source driver circuit 22, can be inhibited. Accordingly, a malfunction of the gate driver circuit 21 and the source driver circuit 22 can be inhibited even when the gate driver circuit 21 and the source driver circuit 22 are not strictly separated from each other and have an overlap region. As a result, the reliability of the display device 10 can be increased.

In this specification and the like, the expression "the same layer as A" means a layer that is formed in the same step as A and contains the same material as A, for example.

Although FIG. 13 illustrates a structure in which the wiring 141 to the wiring 143 are provided above the wiring 121 to the wiring 123, the wiring 141 to the wiring 143 may be provided below the wiring 121 to the wiring 123.

Although FIG. 13 illustrates a structure in which the wiring 121 to the wiring 123 extend in the horizontal direction and the wiring 141 to the wiring 143 extend in the perpendicular direction, one embodiment of the present invention is not limited thereto. For example, the wiring 121 to the wiring 123 may extend in the perpendicular direction, and the wiring 141 to the wiring 143 may extend in the horizontal direction. Alternatively, the wiring 121 to the wiring 123 and the wiring 141 to the wiring 143 may all extend in the horizontal direction or in the perpendicular direction.

The dummy transistor 73 includes a semiconductor 151 and a conductor 152. The conductor 152 includes a region overlapping with the semiconductor 151. The semiconductor 151 can be formed in the same layer as the channel formation regions of the transistor 71 and the transistor 72. The conductor 152 can be formed in the same layer as the gate electrodes of the transistor 71 and the transistor 72. Note that one of the semiconductor 151 and the conductor 152 may be omitted in the dummy transistor 73.

The semiconductor 151 and the conductor 152 can be electrically isolated from other wirings or the like. A constant potential may be supplied to the semiconductor 151 and/or the conductor 152. For example, a ground potential may be supplied.

Structure Examples of Pixel 34

Figure 14A:
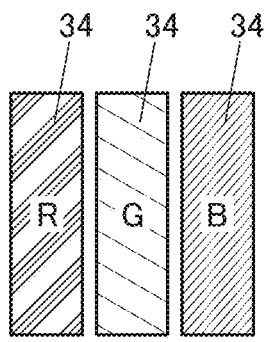
FIG. 14 (A), (B), (C), (D), (E) Diagrams illustrating structure examples of a pixel.
Figure 14B:
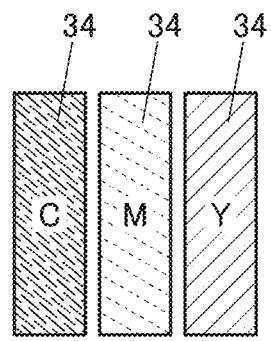

FIGS. 14(A) to 14(E) are diagrams for describing colors exhibited by the pixels 34 provided in the display device 10. As illustrated in FIG. 14(A), the pixel 34 that exhibits red (R), the pixel 34 that exhibits green (G), and the pixel 34 that exhibits blue (B) can be provided in the display device of one embodiment of the present invention. Alternatively, as illustrated in FIG. 14(B), the pixel 34 that exhibits cyan (C), the pixel 34 that exhibits magenta (M), and the pixel 34 that exhibits yellow (Y) may be provided in the display device 10.

Figure 14C:
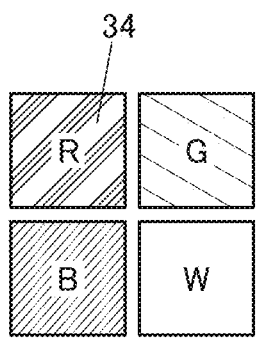
Figure 14D:
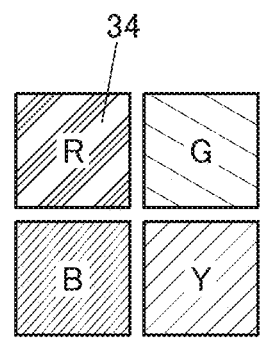

Alternatively, as illustrated in FIG. 14(C), the pixel 34 that exhibits red (R), the pixel 34 that exhibits green (G), the pixel 34 that exhibits blue (B), and the pixel 34 that exhibits white (W) may be provided in the display device 10. Alternatively, as illustrated in FIG. 14(D), the pixel 34 that exhibits red (R), the pixel 34 that exhibits green (G), the pixel 34 that exhibits blue (B), and the pixel 34 that exhibits yellow (Y) may be provided in the display device 10. Alternatively, as illustrated in FIG. 14(E), the pixel 34 that exhibits cyan (C), the pixel 34 that exhibits magenta (M), the pixel 34 that exhibits yellow (Y), and the pixel 34 that exhibits white (W) may be provided in the display device 10.

Figure 14E:
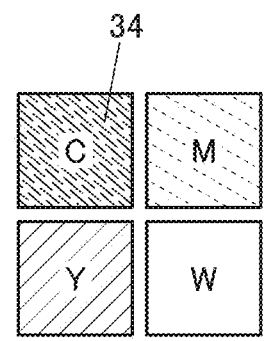

Providing the pixel 34 having a function of emitting white light in the display device 10 as illustrated in FIGS. 14(C) and 14(E) can increase the luminance of a displayed image. Furthermore, increasing the number of colors exhibited by the pixels 34 as illustrated in FIG. 14(D) and the like can increase the reproducibility of intermediate colors and improve the display quality.

Figure 15A:
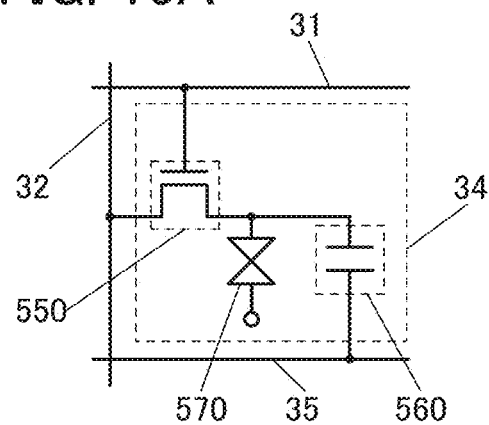
FIG. 15 (A), (B), (C) Circuit diagrams illustrating configuration examples of a pixel.
Figure 15B:
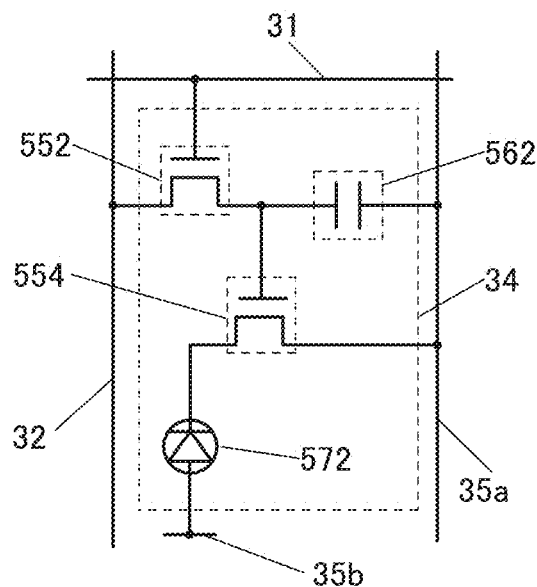

FIGS. 15(A) and 15(B) are circuit diagrams illustrating configuration examples of the pixel 34. The pixel 34 having the configuration illustrated in FIG. 15(A) includes a liquid crystal element 570, a transistor 550, and a capacitor 560. Moreover, in addition to the wiring 31 and the wiring 32, a wiring 35 and the like are electrically connected to the pixel 34.

The potential of one electrode of the liquid crystal element 570 is set in accordance with the specifications of the pixel 34 as appropriate. The alignment state of the liquid crystal element 570 is set depending on an image signal written to the pixel 34. Note that a common potential may be supplied to the one electrode of the liquid crystal element 570 included in each of the plurality of pixels 34. Furthermore, different potentials may be supplied to the one electrode of the liquid crystal element 570 in the pixel 34 in each row.

In addition, the pixel 34 having the configuration illustrated in FIG. 15(B) includes a transistor 552, a transistor 554, a capacitor 562, and a light-emitting element 572. As the light-emitting element 572, an EL element utilizing electroluminescence can be used, for example. An EL element includes a layer containing a light-emitting compound (hereinafter also referred to as an EL layer) between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light.

EL elements are classified according to whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. Then, the carriers (electrons and holes) are recombined, and thus, a light-emitting organic compound is excited. The light-emitting organic compound returns to a ground state from the excited state, thereby emitting light. Owing to such a mechanism, this light-emitting element is referred to as a current-excitation light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), and the like.

The EL layer can be formed by an evaporation method (including a vacuum evaporation method), a transfer method, a printing method, an inkjet method, a coating method, or the like.

The inorganic EL elements are classified according to their device structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions.

In order to extract light emitted from the light-emitting element, at least one of the pair of electrodes needs to be transparent. The light-emitting element that is formed over a substrate together with a transistor can have any of a top emission structure in which emitted light is extracted through the surface opposite to the substrate; a bottom emission structure in which emitted light is extracted through the surface on the substrate side; and a dual emission structure in which emitted light is extracted through both sides.

Note that an element similar to the light-emitting element 572 can be used as light-emitting elements other than the light-emitting element 572.

One of a source and a drain of a transistor 552 is electrically connected to the wiring 32. The other of the source and the drain of the transistor 552 is electrically connected to one electrode of the capacitor 562 and a gate of the transistor 554. The other electrode of the capacitor 562 is electrically connected to a wiring 35a. A gate of the transistor 552 is electrically connected to a wiring 31. One of a source and a drain of the transistor 554 is electrically connected to the wiring 35a. The other of the source and the drain of the transistor 554 is electrically connected to one electrode of the light-emitting element 572. The other electrode of the light-emitting element 572 is electrically connected to a wiring 35b. The potential VSS is supplied to the wiring 35a, and the potential VDD is supplied to the wiring 35b.

In the pixel 34 having the configuration illustrated in FIG. 15(B), current flowing through the light-emitting element 572 is controlled in accordance with the potential supplied to a gate of the transistor 554, whereby the luminance of light emitted from the light-emitting element 572 is controlled.

Figure 15C:
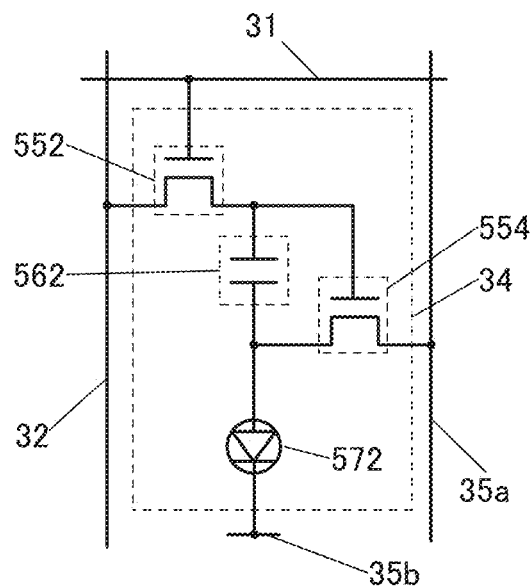

FIG. 15(C) illustrates a configuration different from that of the pixel 34 in FIG. 15(B). In the pixel 34 having the configuration illustrated in FIG. 15(C), the one of the source and the drain of the transistor 552 is electrically connected to the wiring 32. The other of the source and the drain of the transistor 552 is electrically connected to the one electrode of the capacitor 562 and the gate of the transistor 554. The gate of the transistor 552 is electrically connected to the wiring 31. The one of the source and the drain of the transistor 554 is electrically connected to the wiring 35a. The other of the source and the drain of the transistor 554 is electrically connected to the other electrode of the capacitor 562 and the one electrode of the light-emitting element 572. The other electrode of the light-emitting element 572 is electrically connected to the wiring 35b. The potential VDD is supplied to the wiring 35a, and the potential VSS is supplied to the wiring 35b.

Figure 16A:
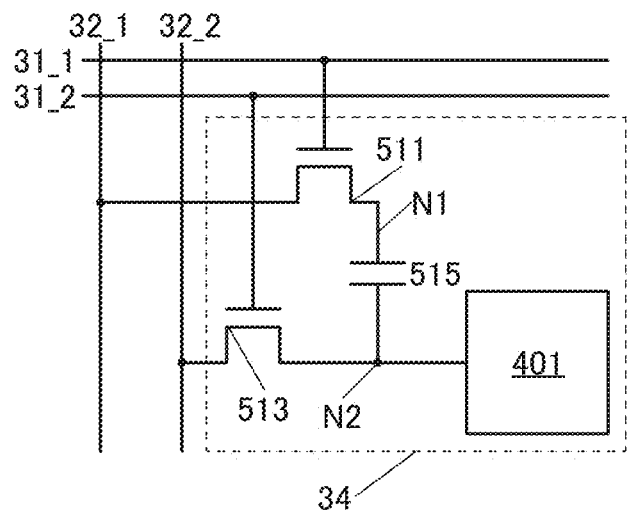
FIG. 16 (A) A circuit diagram illustrating a configuration example of a pixel. (B) A timing chart showing an example of an operation method of a pixel. (C), (D) Circuit diagrams illustrating configuration examples of a pixel.

FIG. 16(A) illustrates a configuration example of the pixel 34 different from the pixels 34 having the configurations in FIG. 15(A) to FIG. 15(C) in including a memory. The pixel 34 having the configuration illustrated in FIG. 16(A) includes a transistor 511, a transistor 513, a capacitor 515, and a circuit 401. To the pixel 34, a wiring 31_1 and a wiring 31_2 are electrically connected as the wiring 31 functioning as a scan line, and a wiring 32_1 and a wiring 32_2 are electrically connected as the wiring 32 functioning as a data line.

One of a source and a drain of the transistor 511 is electrically connected to the wiring 32_1. The other of the source and the drain of the transistor 511 is electrically connected to one electrode of the capacitor 515. A gate of the transistor 511 is electrically connected to the wiring 31_1. One of a source and a drain of the transistor 513 is electrically connected to the wiring 32_2. The other of the source and the drain of the transistor 513 is electrically connected to the other electrode of the capacitor 515 and the circuit 401. A gate of the transistor 513 is electrically connected to the wiring 31_2.

The circuit 401 is a circuit including at least one display element. Any of a variety of elements can be used as the display element, and typically, a light-emitting element such as an organic light-emitting element or an LED element, a liquid crystal element, a MEMS (Micro Electro Mechanical Systems) element, or the like can be used.

In this specification and the like, a voltage supplied to the display element such as a light-emitting element or a liquid crystal element refers to a difference between the potential applied to the one electrode of the display element and the potential applied to the other electrode of the display element.

A node connecting the transistor 511 and the capacitor 515 is N1, and a node connecting the transistor 513 and the circuit 401 is N2.

In the pixel 34, the potential of the node N1 can be retained when the transistor 511 is turned off. The potential of the node N2 can be retained when the transistor 513 is turned off. When a predetermined potential is written in the node N1 through the transistor 511 with the transistor 513 being in an off state, the potential of the node N2 can be changed in accordance with displacement of the potential of the node N1 owing to capacitive coupling through the capacitor 515.

Here, transistors containing a metal oxide in their channel formation regions (OS transistors) can be used as the transistor 511 and the transistor 513. A metal oxide can have a band gap of 2 eV or more, or 2.5 eV or more. Thus, an OS transistor exhibits an extremely low leakage current (off-state current) in an off state. Accordingly, the use of OS transistors as the transistor 511 and the transistor 513 enables the potentials of the node N1 and the node N2 to be held for a long time.

For example, as the metal oxide, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, indium oxide, zinc oxide, an In—Ga oxide, an In—Zn oxide, a Ga—Zn oxide, or gallium oxide may be used as the metal oxide.

Example of Operation Method for Pixel 34

Figure 16B:
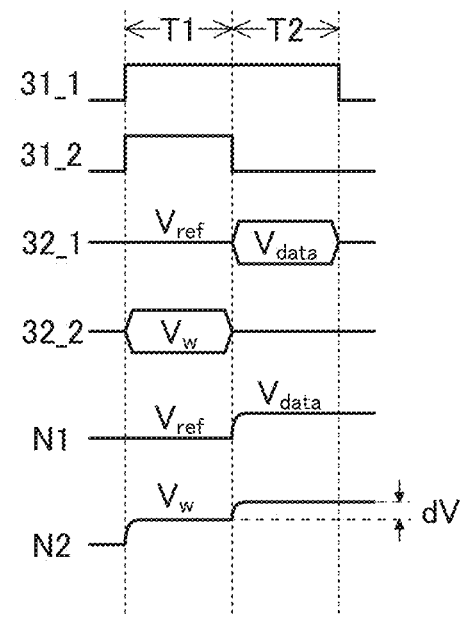

Next, an example of an operation method for the pixel 34 having the configuration in FIG. 16(A) is described with reference to FIG. 16(B). FIG. 16(B) is a timing chart of the operation of the pixel 34 having the configuration in FIG. 16(A). Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 16(B), one frame period is divided into a period T1 and a period T2. The period T1 is a period in which a potential is written in the node N2, and the period T2 is a period in which a potential is written in the node N1.

In the period T1, a potential for turning on the transistor is supplied to both the wiring 31_1 and the wiring 31_2. In addition, a potential $V_{ref}$ that is a fixed potential is supplied to the wiring 32_1 and a potential $V_w$ is supplied to the wiring 32_2.

The potential $V_{ref}$ is supplied from the wiring 32_1 to the node N1 through the transistor 511. The potential $V_w$ is supplied from the wiring 32_2 to the node N2 through the transistor 513. Accordingly, a potential difference $V_w - V_{ref}$ is retained in the capacitor 515.

Next, in the period T2, a potential for turning on the transistor 511 is supplied to the wiring 31_1, and a potential for turning off the transistor 513 is supplied to the wiring 31_2. A potential $V_{data}$ is supplied to the wiring 32_1, and a predetermined constant potential is supplied to the wiring 32_2. Note that the potential of the wiring 32_2 may be floating.

The potential $V_{data}$ is supplied to the node N1 through the transistor 511. At this time, capacitive coupling due to the capacitor 515 changes the potential of the node N2 in accordance with the potential $V_{data}$ by a potential dV. That is, a potential that is the sum of the potential $V_w$ and the potential dV is input to the circuit 401. Note that although dV is shown as having a positive value in FIG. 16(B), dV may have a negative value. That is, the potential $V_{data}$ may be lower than the potential $V_{ref}$.

Here, the potential dV is roughly determined by the capacitance of the capacitor 515 and the capacitance of the circuit 401. When the capacitance of the capacitor 515 is sufficiently higher than the capacitance of the circuit 401, the potential dV is a potential close to a potential difference $V_{data} - V_{ref}$.

As described above, the pixel 34 can generate the potential supplied to the circuit 401 including the display element in combination with two kinds of data signals; thus, an image displayed on the display portion 33 can be corrected inside the pixel 34. Here, one of the two kinds of data signals can be the aforementioned image signal, and the other can be a correction signal, for example. For example, when the potential $V_w$ corresponding to a correction signal is supplied to the node N2 in the period T1 and then the potential $V_{data}$ corresponding to an image signal is supplied to the node N1 in the period T2, an image based on the image signal corrected by the correction signal can be displayed on the display portion 33. Note that not only image signals but also correction signals and the like can be generated by the source driver circuit 22 included in the display device 10.

The pixel 34 can also generate a potential exceeding the maximum potential that can be supplied to the wiring 32_1 and the wiring 32_2. For example, in the case of using a light-emitting element, high-dynamic range (HDR) display or the like can be performed. In the case of using a liquid crystal element, overdriving or the like can be performed.

Configuration Example of Circuit 401

Figure 16C:
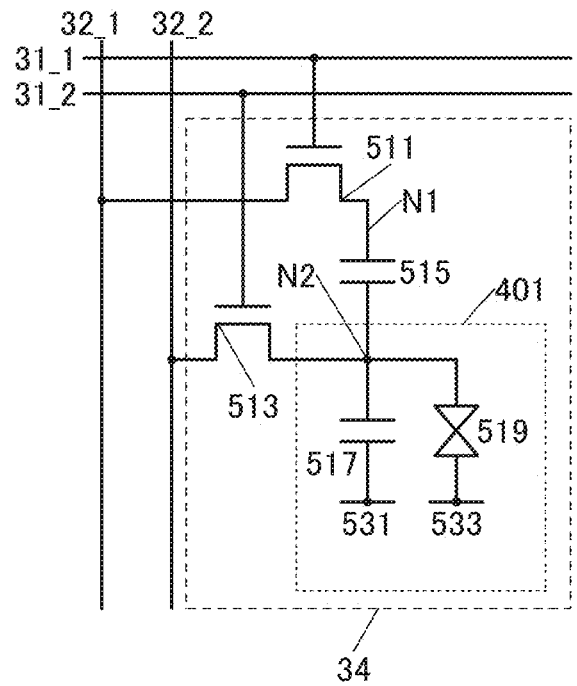
Figure 16D:
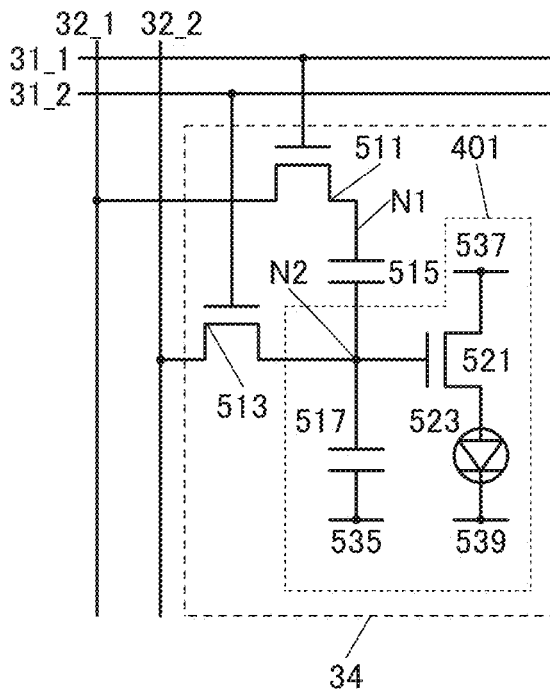

FIGS. 16(C) and 16(D) each illustrate a configuration example of the pixel 34 including a specific configuration example of the circuit 401. The circuit 401 that is provided in the pixel 34 having the configuration illustrated in FIG. 16(C) includes a liquid crystal element 519 and a capacitor 517.

One electrode of the liquid crystal element 519 is electrically connected to the node N2. The other electrode of the liquid crystal element 519 is electrically connected to a wiring 533. One electrode of the capacitor 517 is electrically connected to the node N2. The other electrode of the capacitor 517 is electrically connected to a wiring 531. The wiring 531 and the wiring 533 can be shared by all the pixels 34 provided in the display device 10, for example. In that case, a potential supplied to the wiring 531 and the wiring 533 is a common potential.

The capacitor 517 functions as a storage capacitor. The capacitor 517 may be omitted.

In the pixel 34 having the configuration illustrated in FIG. 16(C), a potential higher than or equal to a potential that can be generated by the source driver circuit 22 and the like can be supplied to the one electrode of the liquid crystal element 519. Thus, a high voltage can be supplied to the liquid crystal element 519 without the source driver circuit 22 having a high withstand voltage, and thus the display device 10 can be provided at a low price. Alternatively, an increase in power consumption of the display device 10 is inhibited, high speed display can be performed by, for example, overdriving, and a liquid crystal material having high driving voltage can be used, for example. The image signal can be corrected in accordance with the operation temperature, the deterioration state of the liquid crystal element 519, or the like by supply of a correction signal to the wiring 32_1 or the wiring 32_2.

The circuit 401 provided in the pixel 34 having the configuration illustrated in FIG. 16(D) includes a light-emitting element 523, a transistor 521, and the capacitor 517.

One of a source and a drain of the transistor 521 is electrically connected to a wiring 537. The other of the source and the drain of the transistor 521 is electrically connected to one electrode of the light-emitting element 523. A gate of the transistor 521 is electrically connected to the node N2. The one electrode of the capacitor 517 is electrically connected to the node N2. The other electrode of the capacitor 517 is electrically connected to a wiring 535. The other electrode of the light-emitting element 523 is electrically connected to a wiring 539.

The wiring 535 can be shared by all the pixels 34 provided in the display device 10, for example. In that case, a potential supplied to the wiring 535 is a common potential. A constant potential can be supplied to the wiring 537 and the wiring 539. For example, a high potential can be supplied to the wiring 537, and a low potential can be supplied to the wiring 539.

The transistor 521 has a function of controlling current to be supplied to the light-emitting element 523. The capacitor 517 functions as a storage capacitor. The capacitor 517 may be omitted.

Note that FIG. 16(D) illustrates a configuration in which the anode of the light-emitting element 523 is electrically connected to the transistor 521; alternatively, the transistor 521 may be electrically connected to the cathode. In that case, the value of the potential of the wiring 537 and the value of the potential of the wiring 539 can be changed as appropriate.

In the pixel 34 having the configuration illustrated in FIG. 16(D), a potential higher than or equal to a potential that can be generated by the source driver circuit 22 and the like can be supplied to the one electrode of the light-emitting element 523. Thus, a high voltage can be supplied to the gate of the transistor 521 without the source driver circuit 22 having a high withstand voltage, and thus the display device 10 can be provided at a low price. Supplying a high potential to the gate of the transistor 521 can flow a large current to the light-emitting element 523; thus, for example, HDR display or the like can be achieved in the pixel 34 having the configuration illustrated in FIG. 16(D). Variations in the electrical characteristics of the transistor 521 and the light-emitting element 523 can also be corrected by supply of a correction signal to the wiring 32_1 or the wiring 32_2.

Moreover, supplying a high potential to the gate of the transistor 521 can supply high voltage to the light-emitting element 523. Specifically, the potential of the wiring 537 can be set higher, for example. Accordingly, when the light-emitting element 523 is an organic EL element, the light-emitting element can employ a tandem structure described later. This increases the current efficiency and external quantum efficiency of the light-emitting element 523. Thus, the display device 10 can display high-luminance images. In addition, power consumption of the display device 10 can be reduced.

Note that the configuration is not limited to the circuits shown in FIGS. 16(C) and 16(D), and a configuration to which a transistor, a capacitor, or the like is further added may be employed. For example, when one transistor and one capacitor are added to the configuration in FIG. 16(C) or 16(D), three nodes capable of holding a potential can be provided. That is, the pixel 34 can have another node capable of holding a potential, in addition to the node N1 and the node N2. Thus, the potential of the node N2 can be further increased. Therefore, in the case where the pixel 34 has the configuration illustrated in FIG. 16(C), higher voltage can be supplied to the liquid crystal element 519. Furthermore, in the case where the pixel 34 has the configuration illustrated in FIG. 16(D), larger current can be supplied to the light-emitting element 523.

FIGS. 17(A) to 17(D) are diagrams illustrating configuration examples of the circuit 401 when the light-emitting element 523 is used as a display element. Like the circuit 401 having the configuration illustrated in FIG. 16(D), the circuit 401 having the configuration illustrated in FIG. 17(A) includes the capacitor 517, the transistor 521, and the light-emitting element 523.

Figure 17A:
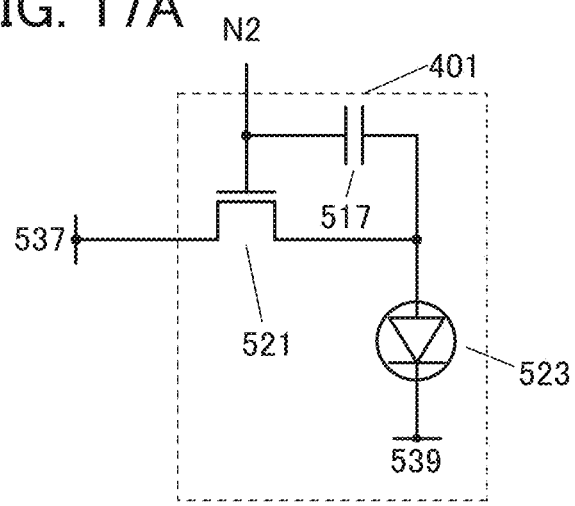
FIG. 17 (A), (B), (C), (D) Circuit diagrams illustrating configuration examples of a pixel.

In the circuit 401 having the configuration illustrated in FIG. 17(A), the gate of the transistor 521 and the one electrode of the capacitor 517 are electrically connected to the node N2. The one of the source and the drain of the transistor 521 is electrically connected to the wiring 537. The other of the source and the drain of the transistor 521 is electrically connected to the other electrode of the capacitor 517. The other electrode of the capacitor 517 is electrically connected to the one electrode of the light-emitting element 523. The other electrode of the light-emitting element 523 is electrically connected to the wiring 539.

Figure 17B:
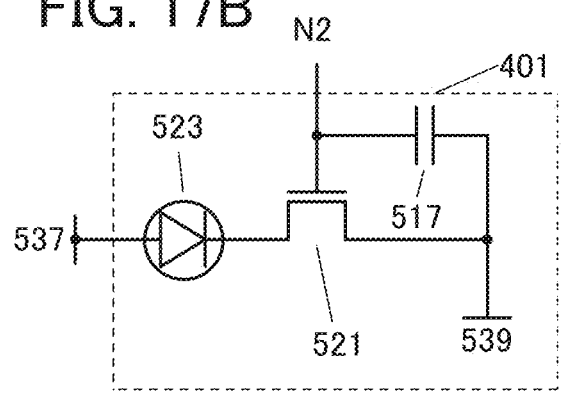

Like the circuit 401 having the configuration illustrated in FIG. 16(D), the circuit 401 having the configuration illustrated in FIG. 17(B) includes the capacitor 517, the transistor 521, and the light-emitting element 523.

In the circuit 401 having the configuration illustrated in FIG. 17(B), the gate of the transistor 521 and the one electrode of the capacitor 517 are electrically connected to the node N2. The one electrode of the light-emitting element 523 is electrically connected to the wiring 537. The other electrode of the light-emitting element 523 is electrically connected to the one of the source and the drain of the transistor 521. The other of the source and the drain of the transistor 521 is electrically connected to the other electrode of the capacitor 517. The other electrode of the capacitor 517 is electrically connected to the wiring 539.

Figure 17C:
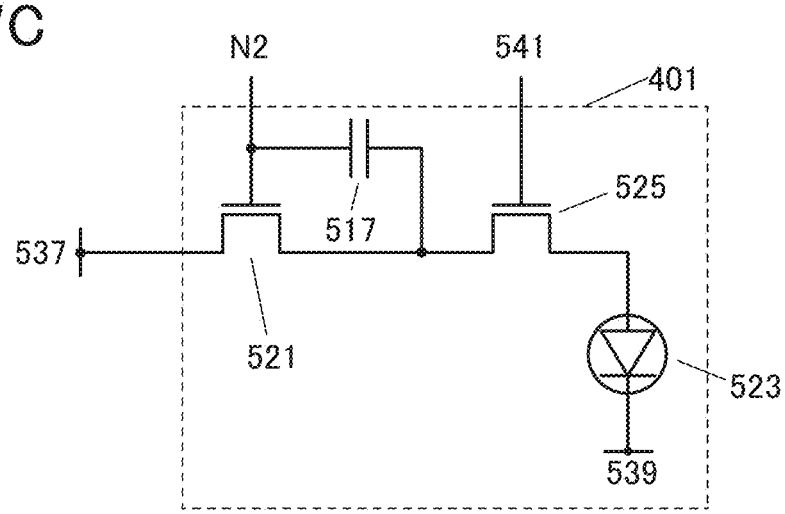

FIG. 17(C) illustrates a configuration example of the circuit 401 in which a transistor 525 is added to the circuit 401 in FIG. 17(A). One of a source and a drain of the transistor 525 is electrically connected to the other of the source and the drain of the transistor 521 and the other electrode of the capacitor 517. The other of the source and the drain of the transistor 525 is electrically connected to one electrode of the light-emitting element 523. A gate of the transistor 525 is electrically connected to a wiring 541. Moreover, the wiring 541 has a function of a scan line controlling the conduction of the transistor 525.

In the pixel 34 including the circuit 401 having the configuration illustrated in FIG. 17(C), even when the potential of the node N2 becomes higher than or equal to the threshold voltage of the transistor 521, a current does not flow through the light-emitting element 523 unless the transistor 525 is turned on. Thus, a malfunction of the display device 10 can be inhibited.

Figure 17D:
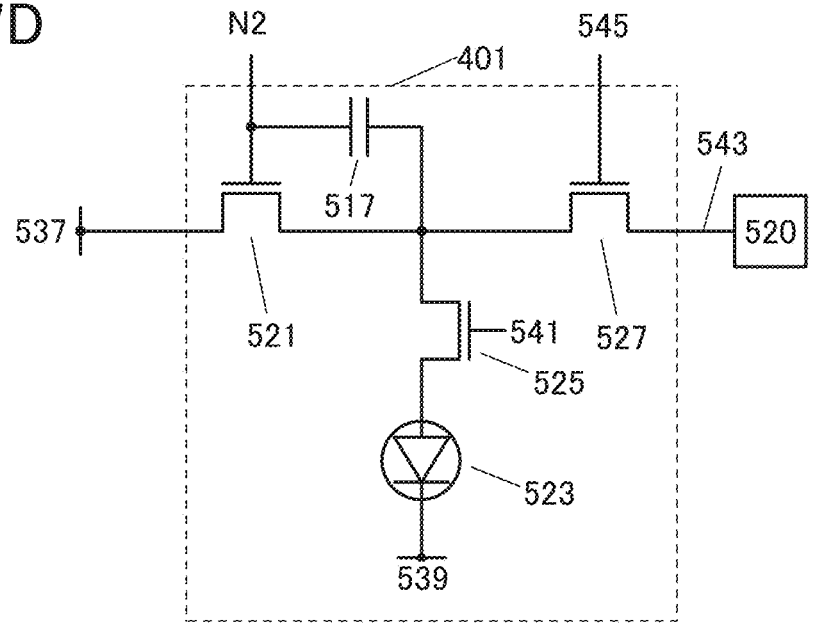

FIG. 17(D) illustrates a configuration example of the circuit 401 in which a transistor 527 is added to the circuit 401 in FIG. 17(C). One of a source and a drain of the transistor 527 is electrically connected to the other of the source and the drain of the transistor 521. The other of the source and the drain of the transistor 527 is electrically connected to a wiring 543. A gate of the transistor 527 is electrically connected to a wiring 545. Moreover, the wiring 545 has a function of a scan line controlling the conduction of the transistor 527.

The wiring 543 can be electrically connected to a supply source of a certain potential such as a reference potential. The certain potential is supplied from the wiring 543 to the other of the source and the drain of the transistor 521, whereby write of the image signal to the pixel 34 can be stable.

The wiring 543 can be electrically connected to a circuit 520. The circuit 520 can have one or more of the supply source of the certain potential, a function of obtaining electrical characteristics of the transistor 521, and a function of generating a correction signal.

Structure Example 2 of Display Device

Figure 18:
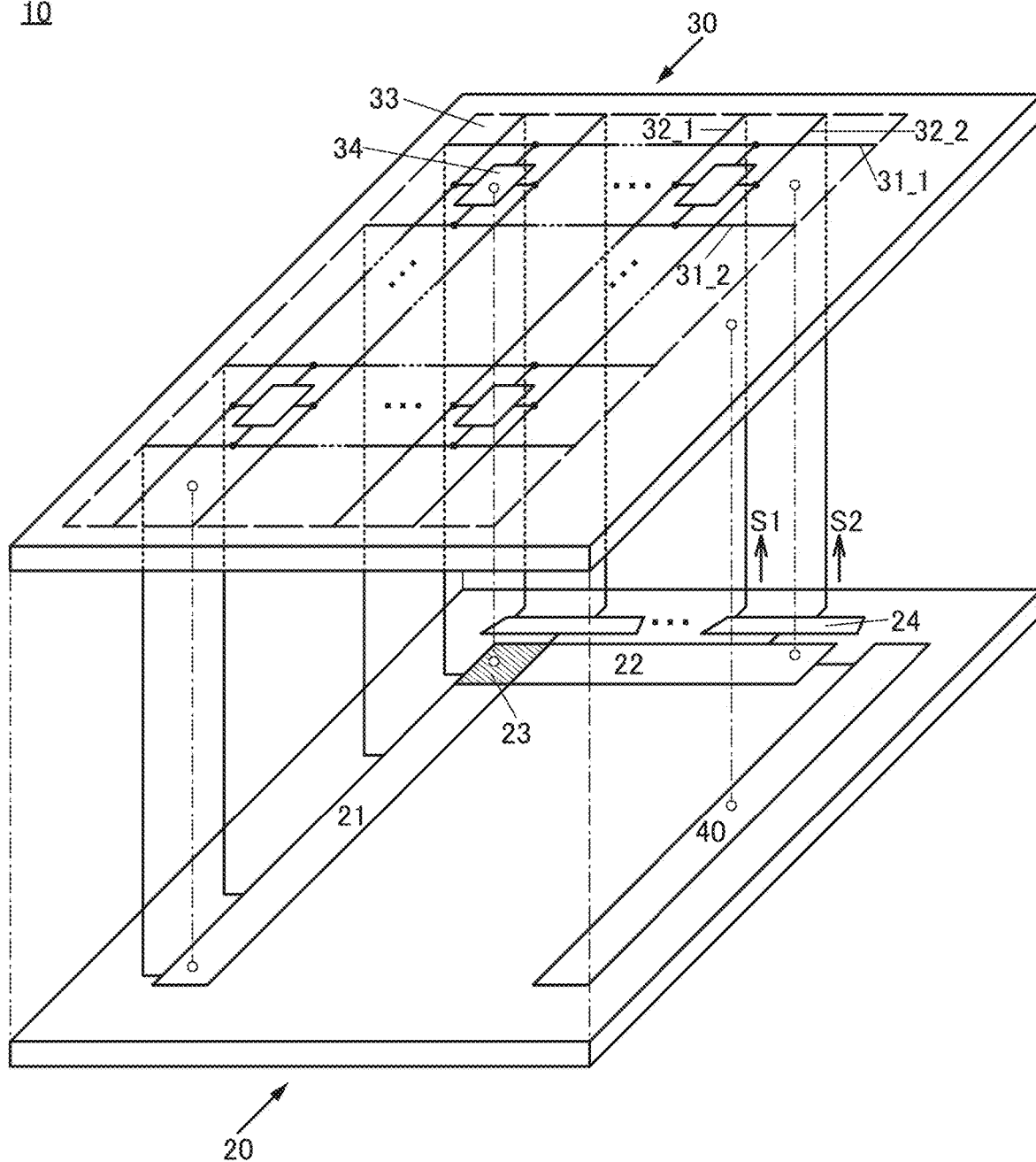
FIG. 18 A block diagram illustrating a structure example of a display device.

FIG. 18 is a block diagram illustrating a structure example of the display device 10 in which the pixels 34 have the configuration illustrated in FIG. 16(A), 16(C), or 16(D). In the display device 10 having the structure illustrated in FIG. 18, a demultiplexer circuit 24 is provided in addition to the components of the display device 10 illustrated in FIG. 1. The demultiplexer circuit can be provided in the layer 20 as illustrated in FIG. 18, for example. Note that the number of demultiplexer circuits 24 can be equal to the number of columns of the pixels 34 arranged in the display portion 33, for example.

The gate driver circuit 21 is electrically connected to the pixels 34 through the wirings 31_1. The gate driver circuit 21 is electrically connected to the pixels 34 through the wirings 31_2. The wiring 31_1 and the wiring 31_2 each have a function of a scan line.

The source driver circuit 22 is electrically connected to an input terminal of the demultiplexer circuit 24. A first output terminal of the demultiplexer circuit 24 is electrically connected to the pixel 34 through the wiring 32_1. A second output terminal of the demultiplexer circuit 24 is electrically connected to the pixel 34 through the wiring 32_2. The wiring 32_1 and the wiring 32_2 each have a function of a data line.

Note that the source driver circuit 22 and the demultiplexer circuits 24 may be collectively referred to as a source driver circuit. In other words, the demultiplexer circuits 24 may be included in the source driver circuit 22.

In the display device 10 having the structure in FIG. 18, the source driver circuit 22 has a function of generating an image signal S1 and an image signal S2. The demultiplexer circuit 24 has a function of supplying the image signal S1 to the pixel 34 through the wiring 32_1, and a function of supplying the image signal S2 to the pixel 34 through the wiring 32_2. Here, when the display device 10 having the structure in FIG. 18 operates with the method illustrated in FIG. 16(B), the potential $V_{data}$ can be a potential corresponding to the image signal S1 and the potential $V_w$ can be a potential corresponding to the image signal S2.

When the potential $V_w$ is supplied to the node N2 and then the potential $V_{data}$ is supplied to the node N1 as shown in FIG. 16(B), the potential of the node N2 becomes "$V_w$+dV". Here, the potential dV corresponds to the potential $V_{data}$ as described above. As a result, the image signal S1 can be added to the image signal S2. That is, the image signal S1 can be superimposed on the image signal S2.

The level of the potential $V_{data}$ corresponding to the image signal S1 and the level of the potential $V_w$ corresponding to the image signal S2 are limited by the withstand voltage of the source driver circuit 22, for example. In view of this, superimposing the image signal S1 and the image signal S2 enables an image corresponding to an image signal having a potential higher than a potential that the source driver circuit 22 can output, to be displayed on the display portion 33. Accordingly, high-luminance images can be displayed on the display portion 33. In particular, in the case where the pixel 34 includes the light-emitting element 523 as a display element, a large current can flow through the light-emitting element 523, and thus high-luminance images can be displayed on the display portion 33. Moreover, the dynamic range, which is the range of luminance of images that the display portion 33 can display, can be enlarged.

An image corresponding to the image signal S1 and an image corresponding to the image signal S2 may be the same or different from each other. When an image corresponding to the image signal S1 and an image corresponding to the image signal S2 are the same, the display portion 33 can display an image with higher luminance than the luminance of the image corresponding to the image signal S1 or the luminance of the image corresponding to the image signal S2.

Figure 19:
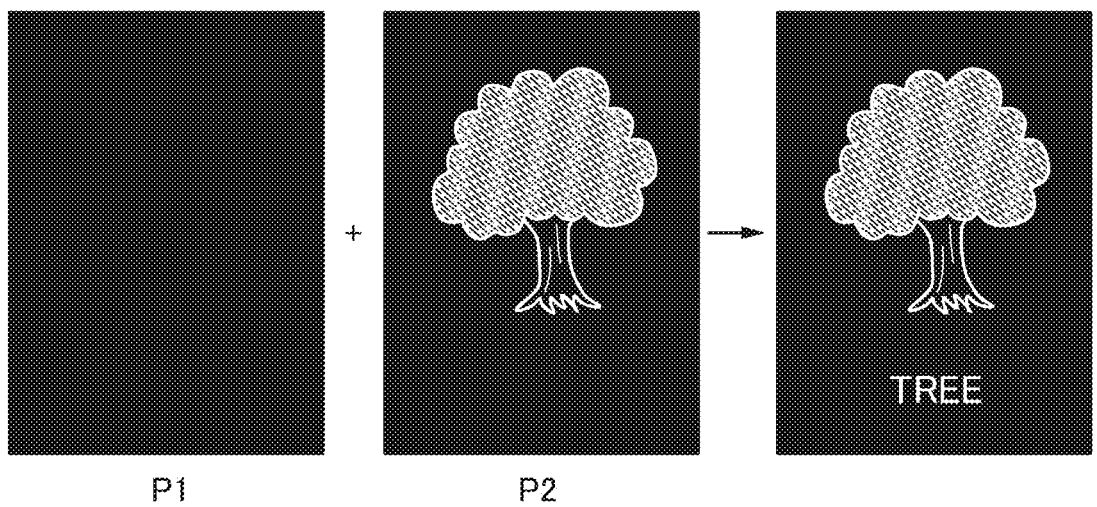
FIG. 19 A diagram showing an operation example of a display device.

FIG. 19 shows the case where an image P1 corresponding to the image signal S1 includes only letters, and an image P2 corresponding to the image signal S2 includes a picture and letters. In this case, when the image P1 and the image P2 are superimposed on each other, the luminance of the letters can be increased, whereby the letters can be emphasized, for example. As illustrated in FIG. 16(B), the potential of the node N2 is changed in accordance with the potential $V_{data}$ after the potential $V_w$ is written to the node N2; hence, to rewrite the potential $V_w$ corresponding to the image signal S2, the potential $V_{data}$ of the image signal S1 needs to be written again. Meanwhile, to rewrite the potential $V_{data}$, the potential $V_w$ does not need to be rewritten as long as the charge written to the node N2 at the time T1 shown in FIG. 16(B) is retained without being leaked through the transistor 513 or the like. Therefore, in the case illustrated in FIG. 19, the luminance of the letters can be controlled by adjusting the level of the potential $V_{data}$.

Here, to rewrite the potential $V_w$ corresponding to the image signal S2, the potential $V_{data}$ corresponding to the image signal S1 needs to be written again as described above. On the other hand, to rewrite the potential $V_{data}$, the potential $V_w$ does not need to be rewritten. Therefore, the image P2 is preferably an image that needs to be rewritten less frequently than the image P1. Note that the image P1 is not limited to an image including only letters, and the image P2 is not limited to an image including a picture and letters.

Example of Cross-Sectional Structure of Display Device

Figure 20:
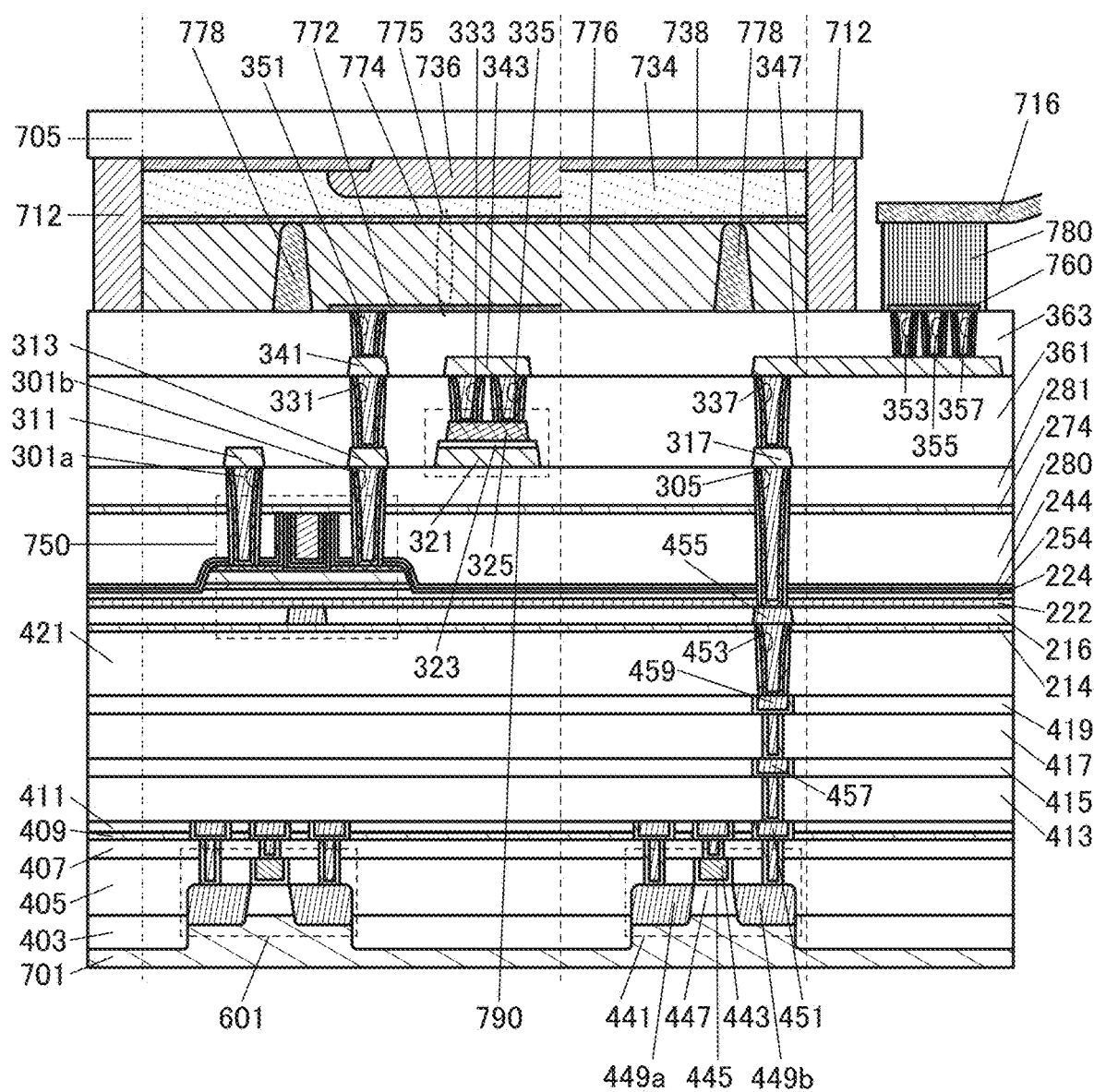
FIG. 20 A cross-sectional view illustrating a structure example of a display device.

FIG. 20 is a cross-sectional view illustrating a structure example of the display device 10. The display device 10 includes a substrate 701 and a substrate 705. The substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 can be a transistor provided in the circuit 40. The transistor 601 can be a transistor provided in the gate driver circuit 21 or a transistor provided in the source driver circuit 22. That is, the transistor 441 and the transistor 601 can be provided in the layer 20 illustrated in FIG. 1 and the like.

The transistor 441 is formed of a conductor 443 functioning as a gate electrode, an insulator 445 functioning as a gate insulator, and part of the substrate 701 and includes a semiconductor region 447 including a channel formation region, a low-resistance region 449a functioning as one of a source region and a drain region, and a low-resistance region 449b functioning as the other of the source region and the drain region. The transistor 441 can be a p-channel transistor or an n-channel transistor.

The transistor 441 is electrically isolated from other transistors by an element isolation layer 403. FIG. 20 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 20, the semiconductor region 447 has a projecting shape. Moreover, the conductor 443 is provided to cover a side surface and a top surface of the semiconductor region 447 with the insulator 445 therebetween. Note that FIG. 20 does not illustrate the state where the conductor 443 covers the side surface of the semiconductor region 447. A material for adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with the top surface of the projecting portion. Although FIG. 20 illustrates the structure in which the projecting portion is formed by processing part of the substrate 701, a semiconductor having a projecting shape may be formed by processing an SOI substrate.

Note that the structure of the transistor 441 illustrated in FIG. 20 is only an example; the structure of the transistor 441 is not particularly limited and can be changed as appropriate in accordance with the circuit configuration, an operation method for the circuit, or the like. For example, the transistor 441 may be a planar transistor.

The transistor 601 can have the same structure as the transistor 441.

An insulator 405, an insulator 407, an insulator 409, and an insulator 411 are provided over the substrate 701, in addition to the element isolation layer 403 and the transistors 441 and 601. A conductor 451 is embedded in the insulator 405, the insulator 407, the insulator 409, and the insulator 411. Here, the top surface of the conductor 451 and the top surface of the insulator 411 can be substantially level with each other.

An insulator 413 and an insulator 415 are provided over the conductor 451 and the insulator 411. A conductor 457 is embedded in the insulator 413 and the insulator 415. The conductor 457 can be provided in the same layer as the wiring 121 to the wiring 123 illustrated in FIG. 13, for example. Here, the top surface of the conductor 457 and the top surface of the insulator 415 can be substantially level with each other.

An insulator 417 and an insulator 419 are provided over the conductor 457 and the insulator 415. A conductor 459 is embedded in the insulator 417 and the insulator 419. The conductor 459 can be provided in the same layer as the wiring 141 to the wiring 143 illustrated in FIG. 13, for example. Here, the top surface of the conductor 459 and the top surface of the insulator 419 can be substantially level with each other.

An insulator 421 and an insulator 214 are provided over the conductor 459 and the insulator 419. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 244, an insulator 280, an insulator 274, and an insulator 281 are provided over the conductor 455 and the insulator 216. A conductor 305 is embedded in the insulator 222, the insulator 224, the insulator 254, the insulator 244, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760. An FPC (Flexible Printed Circuit) 716 is provided to be electrically connected to the anisotropic conductor 780. A variety of signals and the like are supplied to the display device 10 from the outside through the FPC 716.

As illustrated in FIG. 20, the low-resistance region 449b functioning as the other of the source region and the drain region of the transistor 441 is electrically connected to the FPC 716 through the conductor 451, the conductor 457, the conductor 459, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 20 illustrates three conductors, which are the conductor 353, the conductor 355, and the conductor 357, as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be a transistor provided in the pixel 34. That is, the transistor 750 can be provided in the layer 30 illustrated in FIG. 1 and the like. An OS transistor can be used as the transistor 750. Owing to an extremely low off-state current of the OS transistor, an image signal or the like can be held for a longer time, so that the refresh operation can be less frequent. Thus, power consumption of the display device 10 can be reduced.

A conductor 301a and a conductor 301b are embedded in the insulator 254, the insulator 244, the insulator 280, the insulator 274, and the insulator 281. The conductor 301a is electrically connected to one of the source and the drain of the transistor 750, and the conductor 301b is electrically connected to the other of the source and the drain of the transistor 750. Here, the top surfaces of the conductors 301a and 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and serve as wirings. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 413, the insulator 415, the insulator 417, the insulator 419, the insulator 421, the insulator 214, the insulator 280, the insulator 274, the insulator 281, the insulator 361, and the insulator 363 function as an interlayer film and may also function as a planarization film that covers unevenness thereunder. For example, the top surface of the insulator 363 may be planarized by planarization treatment using a chemical mechanical polishing (CMP) method or the like to increase the level of planarity.

As illustrated in FIG. 20, the capacitor 790 includes a lower electrode 321 and an upper electrode 325. An insulator 323 is provided between the lower electrode 321 and the upper electrode 325. That is, the capacitor 790 has a stacked-layer structure in which the insulator 323 functioning as a dielectric is positioned between the pair of electrodes.

Although FIG. 20 illustrates an example in which the capacitor 790 is provided over the insulator 281, the capacitor 790 may be provided over an insulator other than the insulator 281.

In the example in FIG. 20, the conductor 301a, the conductor 301b, and the conductor 305 are formed in the same layer as each other. The conductors 311, 313, and 317 and the lower electrode 321 are formed in the same layer as each other. The conductor 331, the conductor 333, the conductor 335, and the conductor 337 are formed in the same layer as each other. The conductor 341, the conductor 343, and the conductor 347 are formed in the same layer as each other. The conductor 351, the conductor 353, the conductor 355, and the conductor 357 are formed in the same layer as each other. Forming a plurality of conductors in the same layer as each other in this manner simplifies the process of manufacturing the display device 10 and thus makes the display device 10 inexpensive. Note that these conductors may be formed in different layers or may contain different types of materials.

The display device 10 illustrated in FIG. 20 includes the liquid crystal element 775. The liquid crystal element 775 includes a conductor 772, a conductor 774, and a liquid crystal layer 776 provided therebetween. The conductor 774 is provided on the substrate 705 side and functions as a common electrode. The conductor 772 is electrically connected to the other of the source and the drain of the transistor 750 through the conductor 351, the conductor 341, the conductor 331, the conductor 313, and the conductor 301b. The conductor 772 is formed over the insulator 363 and functions as a pixel electrode.

A material that transmits visible light or a material that reflects visible light can be used for the conductor 772. As the light-transmitting material, for example, an oxide material including indium, zinc, tin, or the like is preferably used. As the reflective material, for example, a material including aluminum, silver, or the like is preferably used.

When a reflective material is used for the conductor 772, the display device 10 is a reflective liquid crystal display device. In contrast, when a light-transmitting material is used for the conductor 772 and a light-transmitting material is also used for the substrate 701 and the like, the display device 10 is a transmissive liquid crystal display device. In the case where the display device 10 is a reflective liquid crystal display device, a polarizing plate is provided on the viewer side. On the other hand, in the case where the display device 10 is a transmissive liquid crystal display device, a pair of polarizing plates are provided such that the liquid crystal element is sandwiched therebetween.

In addition, although not illustrated in FIG. 20, an alignment film in contact with the liquid crystal layer 776 may be provided. An optical member (an optical substrate) such as a polarizing member, a retardation member, or an anti-reflection member and a light source such as a backlight or a side light can be provided as appropriate.

Structure bodies 778 are provided between the insulator 363 and the conductor 774. The structure body 778 is a columnar spacer and has a function of controlling the distance (the cell gap) between the substrate 701 and the substrate 705. Note that a spherical spacer may also be used as the structure body 778.

On the substrate 705 side, a light-blocking layer 738, a coloring layer 736, and an insulator 734 that is in contact with these films are provided. The light-blocking layer 738 has a function of blocking light emitted from adjacent regions. Alternatively, the light-blocking layer 738 has a function of preventing external light from reaching the transistor 750 or the like. Note that coloring layer 736 is provided to have a region overlapping with the liquid crystal element 775.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case of employing a horizontal electric field mode, liquid crystal exhibiting a blue phase for which an alignment film is not used may be used.

The following can be used as a mode of the liquid crystal device: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like.

In addition, a scattering liquid crystal employing a polymer dispersed liquid crystal, a polymer network liquid crystal, or the like can be used for the liquid crystal layer 776. At this time, monochrome image display may be performed without the coloring layer 736, or color display may be performed using the coloring layer 736.

As a driving method of the liquid crystal device, a time-division display method (also referred to as a field-sequential driving method) by which color display is performed by a successive additive color mixing method may be used. In that case, a structure without the coloring layer 736 can be employed. In the case where the time-division display method is employed, advantages such as the aperture ratio of each pixel or the definition being increased can be obtained because subpixels that emit light of, for example, R (red), G (green), and B (blue) do not need to be provided.

Figure 21:
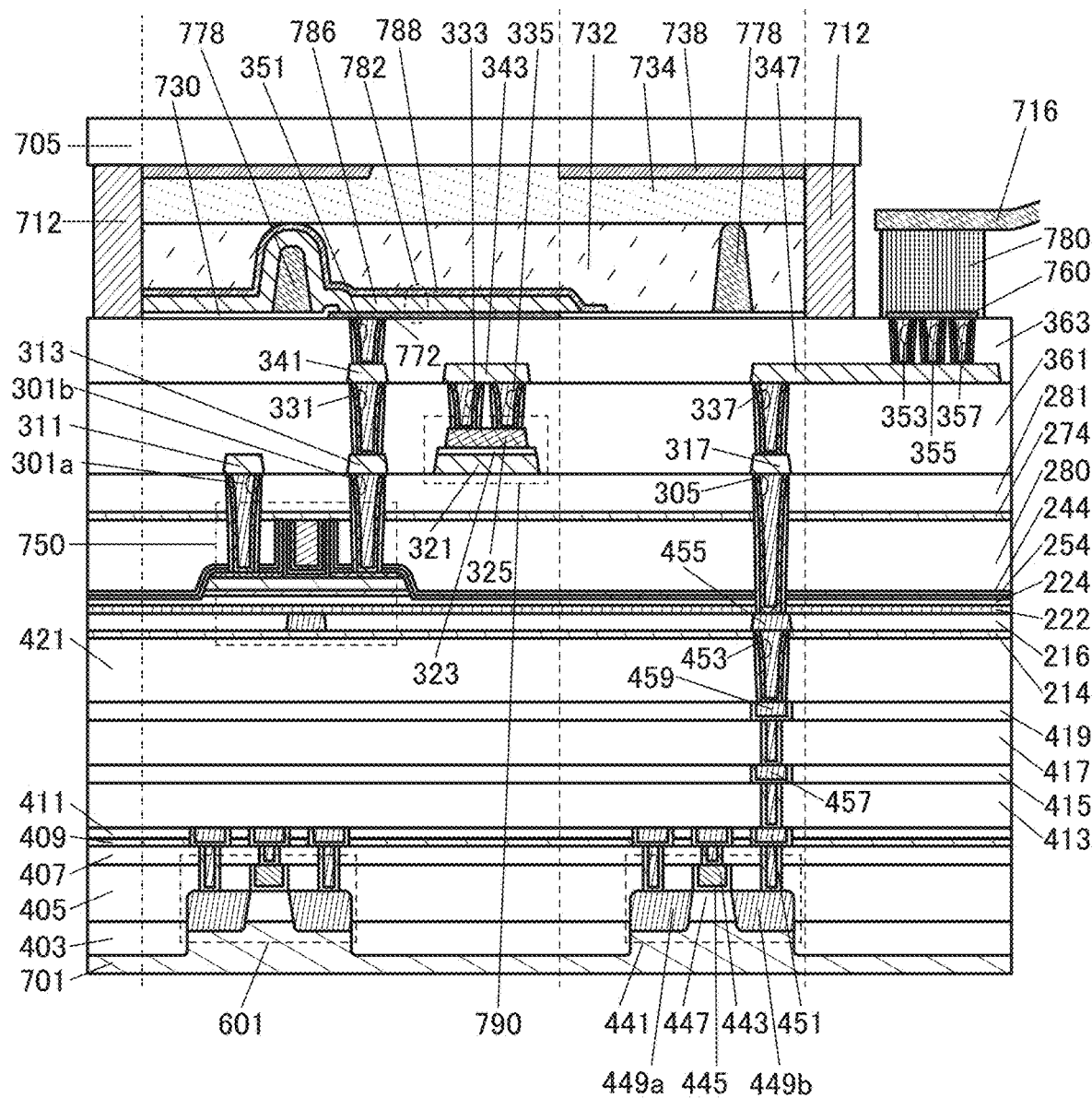
FIG. 21 A cross-sectional view illustrating a structure example of a display device.

In the display device 10 having the structure illustrated in FIG. 20, a liquid crystal element is used as a display element; however, one embodiment of the present invention is not limited thereto. FIG. 21 illustrates a modification example of the display device 10 illustrated in FIG. 20 and differs from the display device 10 illustrated in FIG. 20 in that a light-emitting element is used as a display element.

The display device 10 illustrated in FIG. 21 includes a light-emitting element 782. The light-emitting element 782 includes the conductor 772, an EL layer 786, and a conductor 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 10 illustrated in FIG. 21, an insulator 730 is provided over the insulator 363. Here, the insulator 730 can cover part of the conductor 772. Here, the light-emitting element 782 is a top-emission light-emitting element, which includes the conductor 788 with a light-transmitting property. Note that the light-emitting element 782 may have a bottom-emission structure in which light is emitted to the conductor 772 side or a dual-emission structure in which light is emitted to both the conductor 772 and the conductor 788.

The light-emitting element 782 can have a microcavity structure, which is described later in detail. Thus, light of predetermined colors (e.g., RGB) can be extracted without a coloring layer, and the display device 10 can perform color display. The structure without a coloring layer can prevent light absorption due to the coloring layer. As a result, the display device 10 can display high-luminance images, and power consumption of the display device 10 can be reduced. Note that a structure in which a coloring layer is not provided may be employed even when the EL layer 786 is formed into an island shape for each pixel or into a stripe shape for each pixel column, i.e., the EL layer 786 is formed by separate coloring.

A light-blocking layer 738 is provided to include a region overlapping with the insulator 730. The light-blocking layer 738 is covered with an insulator 734. A space between the light-emitting element 782 and the insulator 734 is filled with a sealing layer 732.

The structure body 778 is provided between the insulator 730 and the EL layer 786. Furthermore, the structure body 778 is provided between the insulator 730 and the insulator 734.

Figure 22:
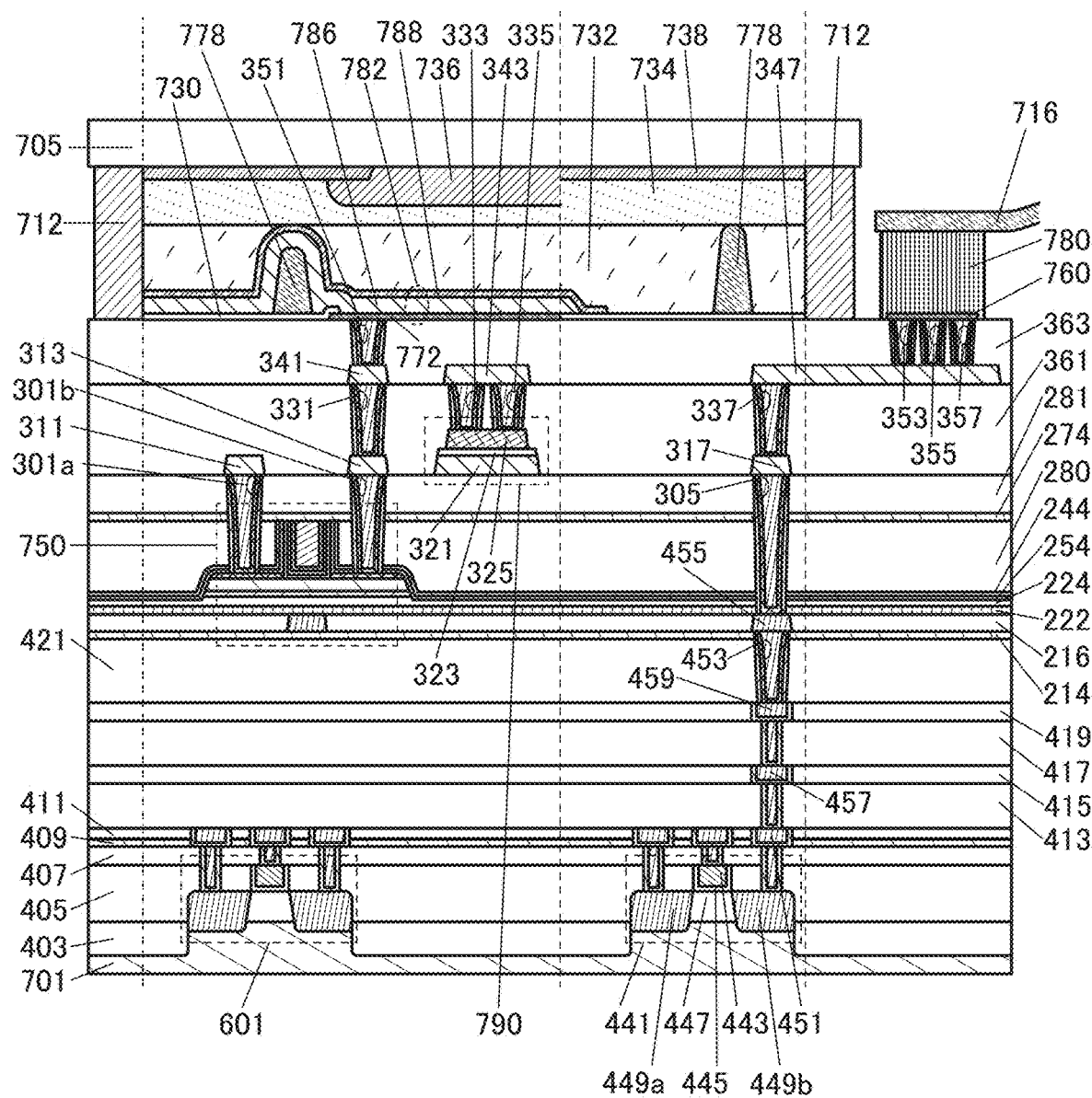
FIG. 22 A cross-sectional view illustrating a structure example of a display device.

FIG. 22 illustrates a modification example of the display device 10 illustrated in FIG. 21 and differs from the display device 10 illustrated in FIG. 21 in that the coloring layer 736 is provided. Providing the coloring layer 736 can improve the color purity of light extracted from the light-emitting element 782. Thus, the display device 10 can display high-quality images. Furthermore, all the light-emitting elements 782, for example, in the display device 10 can be light-emitting elements that emit white light; hence, the EL layers 786 are not necessarily formed by separate coloring, leading to higher definition of the display device 10.

Figure 23:
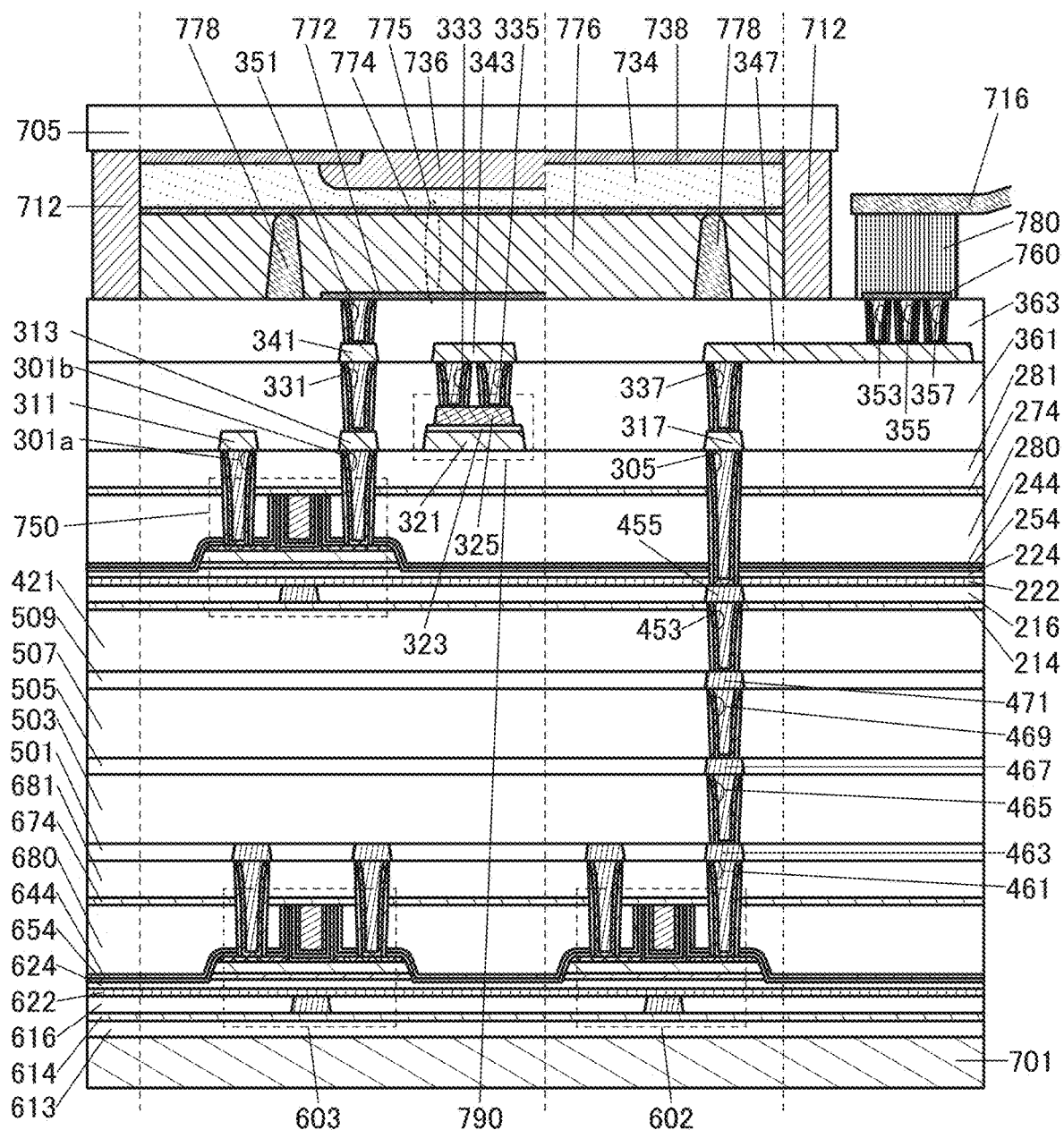
FIG. 23 A cross-sectional view illustrating a structure example of a display device.
Figure 24:
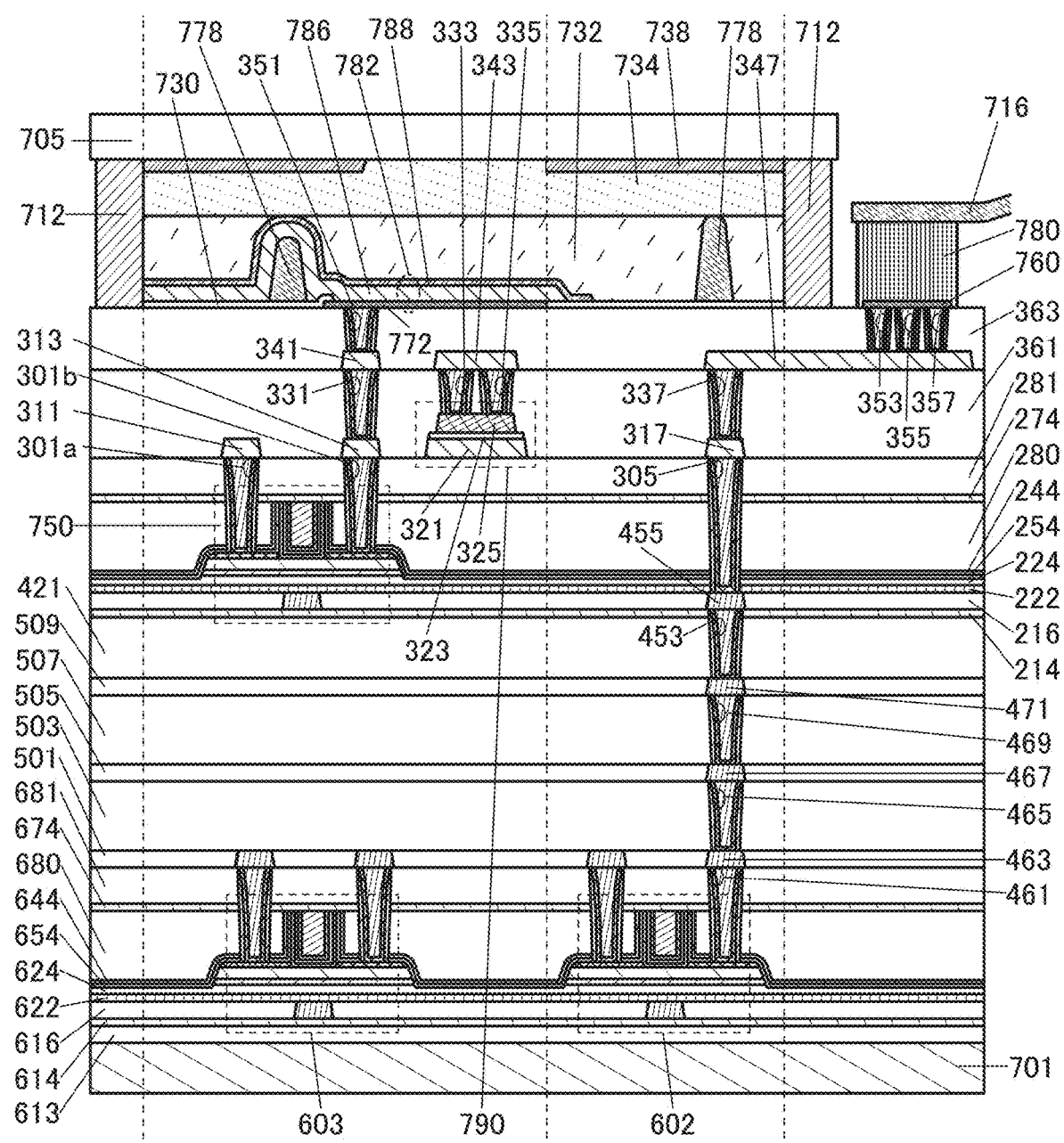
FIG. 24 A cross-sectional view illustrating a structure example of a display device.
Figure 25:
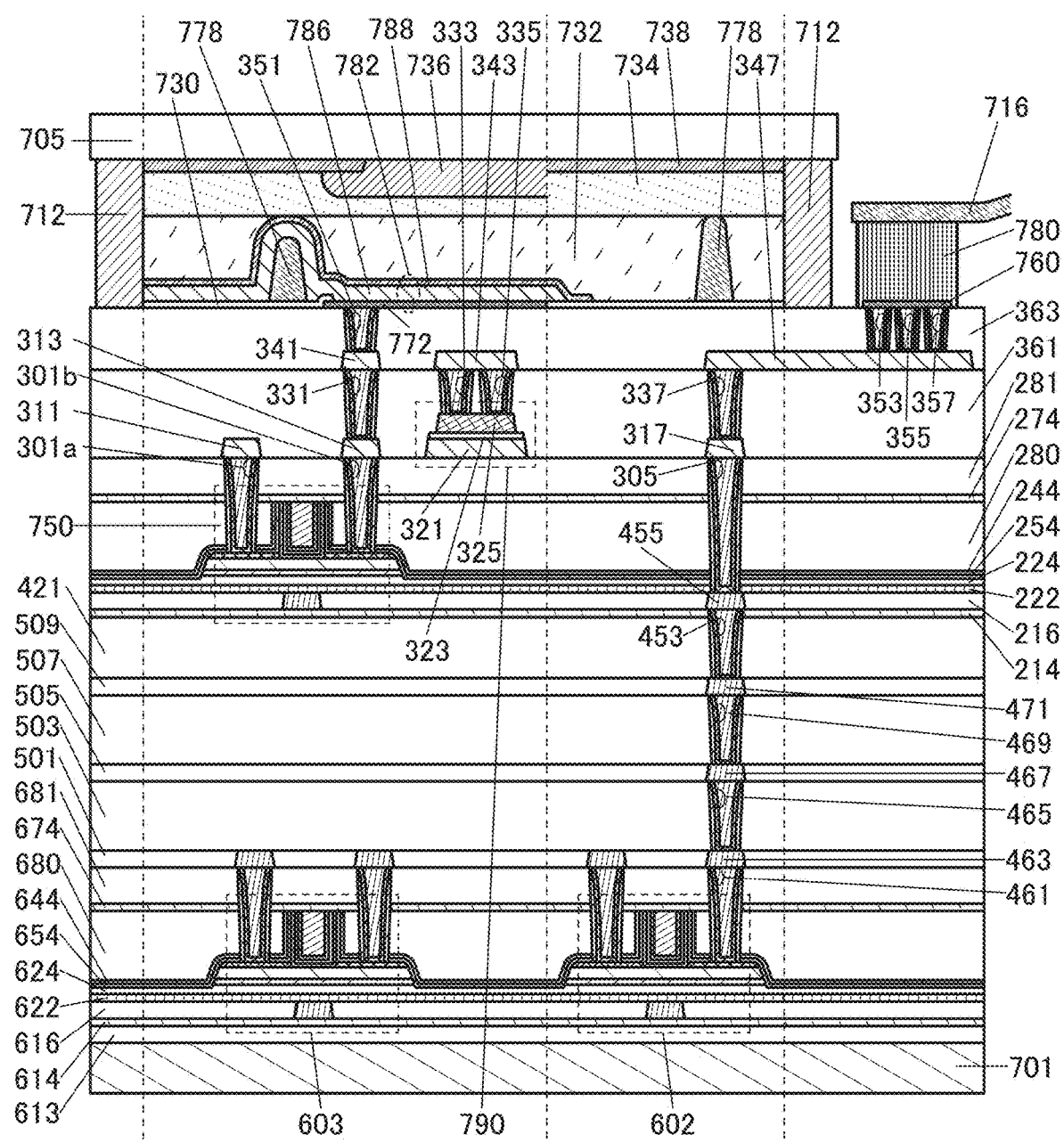
FIG. 25 A cross-sectional view illustrating a structure example of a display device.

Although FIG. 20 to FIG. 22 each illustrate a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 23 illustrates a modification example of FIG. 20, FIG. 24 illustrates a modification example of FIG. 21, and FIG. 25 illustrates a modification example of FIG. 22. The display devices 10 having the structures illustrated in FIG. 23 to FIG. 25 differ from those in FIG. 20 to FIG. 22 in that the transistor 750 is stacked not over the transistor 441 and the transistor 601 but over a transistor 602 and a transistor 603 that are OS transistors. That is, the display device 10 having the structure in any of FIG. 23 to FIG. 25 includes a stack of OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to that of the transistor 441 and the transistor 601 illustrated in FIG. 20 to FIG. 22 may be provided between the substrate 701 and the insulator 613.

The transistor 602 can be a transistor provided in the circuit 40. The transistor 603 can be a transistor provided in the gate driver circuit 21 or a transistor provided in the source driver circuit 22. That is, the transistor 602 and the transistor 603 can be provided in the layer 20 illustrated in FIG. 1 and the like. Note that when the circuit 40 is provided in the layer 30 as illustrated in FIG. 5, the transistor 602 can be provided in the layer 30.

The transistor 602 and the transistor 603 can have a structure similar to that of the transistor 750. Note that the transistor 602 and the transistor 603 may be OS transistors having a structure different from that of the transistor 750.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 is embedded in the insulator 654, the insulator 644, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

An insulator 503 is provided over the conductor 463 and the insulator 501. A conductor 465 is embedded in the insulator 503. The top surface of the conductor 465 and the top surface of the insulator 503 can be substantially level with each other.

An insulator 505 is provided over the conductor 465 and the insulator 503. A conductor 467 is embedded in the insulator 505. The conductor 467 can be provided in the same layer as the wiring 121 to the wiring 123 illustrated in FIG. 13, for example. Here, the top surface of the conductor 467 and the top surface of the insulator 505 can be substantially level with each other.

An insulator 507 is provided over the conductor 467 and the insulator 505. A conductor 469 is embedded in the insulator 507. Here, the top surface of the conductor 469 and the top surface of the insulator 507 can be substantially level with each other.

An insulator 509 is provided over the conductor 469 and the insulator 507. A conductor 471 is embedded in the insulator 509. The conductor 471 can be provided in the same layer as the wiring 141 to the wiring 143 illustrated in FIG. 13, for example. Here, the top surface of the conductor 471 and the top surface of the insulator 509 can be substantially level with each other.

The insulator 421 and the insulator 214 are provided over the conductor 471 and the insulator 509. The conductor 453 is embedded in the insulator 421 and the insulator 214. Here, the top surface of the conductor 453 and the top surface of the insulator 214 can be substantially level with each other.

As illustrated in FIG. 23 to FIG. 25, one of a source and a drain of the transistor 602 is electrically connected to the FPC 716 through the conductor 461, the conductor 463, the conductor 465, the conductor 467, the conductor 469, the conductor 471, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, the insulator 501, the insulator 503, the insulator 505, the insulator 507, and the insulator 509 function as an interlayer film and may also function as a planarization film that covers unevenness thereunder.

When the display device 10 has the structure illustrated in FIG. 23 to FIG. 25, all the transistors in the display device 10 can be OS transistors while the frame and size of the display device 10 are reduced. Accordingly, the transistors provided in the layer 20 and the transistors provided in the layer 30 can be manufactured using the same apparatus, for example. Consequently, the manufacturing cost of the display device 10 can be reduced, making the display device 10 inexpensive.

Structure Example of Light-Emitting Element

Figure 26A:
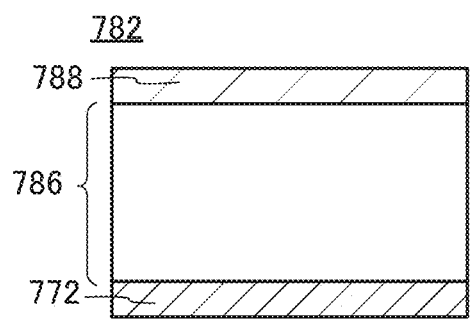
FIG. 26 (A), (B), (C), (D), (E) Schematic diagrams illustrating structure examples of light-emitting elements.

FIGS. 26(A) to 26(E) illustrate structure examples of the light-emitting element 782. FIG. 26(A) illustrates a structure where the EL layer 786 is positioned between the conductor 772 and the conductor 788 (a single structure). As described above, the EL layer 786 contains a light-emitting material, for example, a light-emitting material of an organic compound.

Figure 26B:
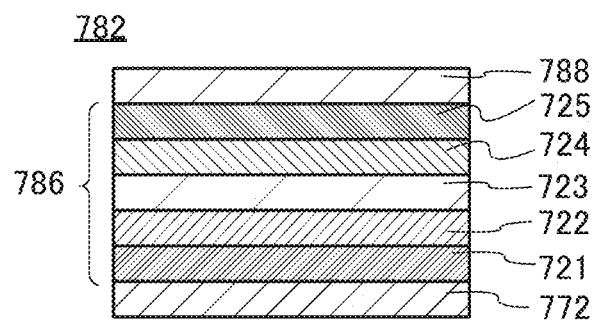

FIG. 26(B) illustrates a stacked-layer structure of the EL layer 786. In the light-emitting element 782 with the structure illustrated in FIG. 26(B), the conductor 772 functions as an anode and the conductor 788 functions as a cathode.

The EL layer 786 has a structure in which a hole-injection layer 721, a hole-transport layer 722, a light-emitting layer 723, an electron-transport layer 724, and an electron-injection layer 725 are stacked in this order over the conductor 772. Note that the order of the stacked layers is reversed when the conductor 772 functions as a cathode and the conductor 788 functions as an anode.

The light-emitting layer 723 contains a light-emitting material and a plurality of materials in appropriate combination, so that fluorescence or phosphorescence of a desired emission color can be obtained. The light-emitting layer 723 may have a stacked-layer structure having different emission colors. In that case, the light-emitting substance and other substances are different between the stacked light-emitting layers.

For example, when the light-emitting element 782 has a micro optical resonator (microcavity) structure with the conductor 772 and the conductor 788 in FIG. 26(B) serving as a reflective electrode and a transflective electrode, respectively, light emitted from the light-emitting layer 723 in the EL layer 786 can be resonated between the electrodes and thus the light emitted through the conductor 788 can be intensified.

Note that when the conductor 772 of the light-emitting element 782 is a reflective electrode having a stacked-layer structure of a reflective conductive material and a light-transmitting conductive material (transparent conductive film), optical adjustment can be performed by controlling the thickness of the transparent conductive film. Specifically, when the wavelength of light from the light-emitting layer 723 is $\lambda$, the distance between the conductor 772 and the conductor 788 is preferably adjusted to around $m\lambda/2$ (m is a natural number).

To amplify desired light (wavelength: $\lambda$) obtained from the light-emitting layer 723, the optical path length from the conductor 772 to a region where desired light is obtained in the light-emitting layer 723 (light-emitting region) and the optical path length from the conductor 788 to the region where desired light is obtained in the light-emitting layer 723 (light-emitting region) are preferably adjusted to around $(2m'+1)\lambda/4$ (m' is a natural number). Here, the light-emitting region means a region where holes and electrons are recombined in the light-emitting layer 723.

By such optical adjustment, the spectrum of specific monochromatic light emitted from the light-emitting layer 723 can be narrowed and light emission with high color purity can be obtained.

In the above case, the optical path length between the conductor 772 and the conductor 788 is, to be exact, the total thickness between a reflective region in the conductor 772 and a reflective region in the conductor 788. However, it is difficult to precisely determine the reflection region in the conductor 772 and the conductor 788; hence, it is assumed that the above effect is sufficiently obtained with given positions in the conductor 772 and the conductor 788 being supposed to be reflective regions. Furthermore, the optical path length between the conductor 772 and the light-emitting layer where desired light is obtained is, to be exact, the optical path length between the reflective region in the conductor 772 and the light-emitting region where desired light is obtained in the light-emitting layer. However, it is difficult to precisely determine the reflective region in the conductor 772 and the light-emitting region where desired light is obtained in the light-emitting layer; thus, it is assumed that the above effect can be sufficiently obtained with a given position in conductor 772 being supposed to be the reflective region and a given position in the light-emitting layer where desired light is obtained being supposed to be the light-emitting region.

The light-emitting element 782 illustrated in FIG. 26(B) has a microcavity structure, so that light (monochromatic light) with different wavelengths can be extracted from different light-emitting elements including the same EL layer. Thus, separate coloring for obtaining a plurality of emission colors (e.g., RGB) is not necessary. Therefore, high definition can be easily achieved. Note that a combination of the structure in FIG. 26(B) with coloring layers is also possible. Furthermore, the emission intensity of light with a specific wavelength in the front direction can be increased, whereby power consumption can be reduced.

Note that the light-emitting element 782 illustrated in FIG. 26(B) does not necessarily have a microcavity structure. In the case where a microcavity structure is not employed, light of predetermined colors (e.g., RGB) can be extracted when the light-emitting layer 723 has a structure for emitting white light and coloring layers are provided. When the EL layers 786 are formed by separate coloring for obtaining different emission colors, light of predetermined colors can be extracted without providing coloring layers.

At least one of the conductor 772 and the conductor 788 can be a light-transmitting electrode (e.g., a transparent electrode or a transflective electrode). In the case where the light-transmitting electrode is a transparent electrode, the transparent electrode has a visible light transmittance of higher than or equal to 40%. In the case where the light-transmitting electrode is a transflective electrode, the transflective electrode has a visible light reflectance of higher than or equal to 20% and lower than or equal to 80%, preferably higher than or equal to 40% and lower than or equal to 70%. These electrodes preferably have a resistivity of $1\times10^{-2}$ Ωcm or less.

When the conductor 772 or the conductor 788 is an electrode having reflectivity (reflective electrode), the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ Ωcm or less.

Figure 26C:
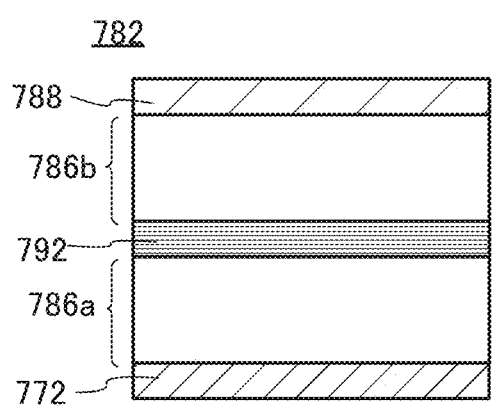

The light-emitting element 782 may have a structure illustrated in FIG. 26(C). FIG. 26(C) illustrates the light-emitting element 782 having a stacked-layer structure (tandem structure) in which two EL layers (an EL layer 786*a* and an EL layer 786*b*) are provided between the conductor 772 and the conductor 788, and a charge generation layer 792 is provided between the EL layer 786*a* and the EL layer 786*b*. When the light-emitting element 782 has the tandem structure, the current efficiency and external quantum efficiency of the light-emitting element 782 can be increased. Therefore, the display device 10 can display high-luminance images. Moreover, power consumption of the display device 10 can be reduced. Here, the EL layer 786*a* and the EL layer 786*b* can have a structure similar to that of the EL layer 786 illustrated in FIG. 26(B).

The charge generation layer 792 has a function of injecting electrons into one of the EL layer 786*a* and the EL layer 786*b* and injecting holes to the other of the EL layer 786*a* and the EL layer 786*b* when a voltage is supplied between the conductor 772 and the conductor 788. Accordingly, when a voltage is supplied such that the potential of the conductor 772 becomes higher than the potential of the conductor 788, electrons are injected into the EL layer 786*a* from the charge generation layer 792 and holes are injected into the EL layer 786*b* from the charge generation layer 792.

Note that in terms of light extraction efficiency, the charge generation layer 792 preferably transmits visible light (specifically, the visible light transmittance of the charge generation layer 792 is preferably 40% or higher). The conductivity of the charge generation layer 792 may be lower than that of the conductor 772 or the conductor 788.

Figure 26D:
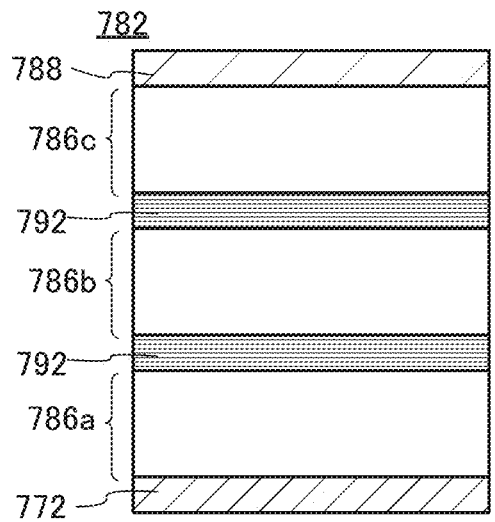

The light-emitting element 782 may have a structure illustrated in FIG. 26(D). FIG. 26(D) illustrates the light-emitting element 782 having a tandem structure in which three EL layers (the EL layer 786*a*, the EL layer 786*b*, and an EL layer 786*c*) are provided between the conductor 772 and the conductor 788, and the charge generation layer 792 is provided between the EL layer 786*a* and the EL layer 786*b* and between the EL layer 786*b* and the EL layer 786*c*. Here, the EL layer 786*a*, the EL layer 786*b*, and the EL layer 786*c* can have a structure similar to that of the EL layer 786 illustrated in FIG. 26(B). When the light-emitting element 782 has the structure illustrated in FIG. 26(D), the current efficiency and external quantum efficiency of the light-emitting element 782 can be further increased. As a result, the display device 10 can display higher-luminance images. Moreover, power consumption of the display device 10 can be further reduced.

Figure 26E:
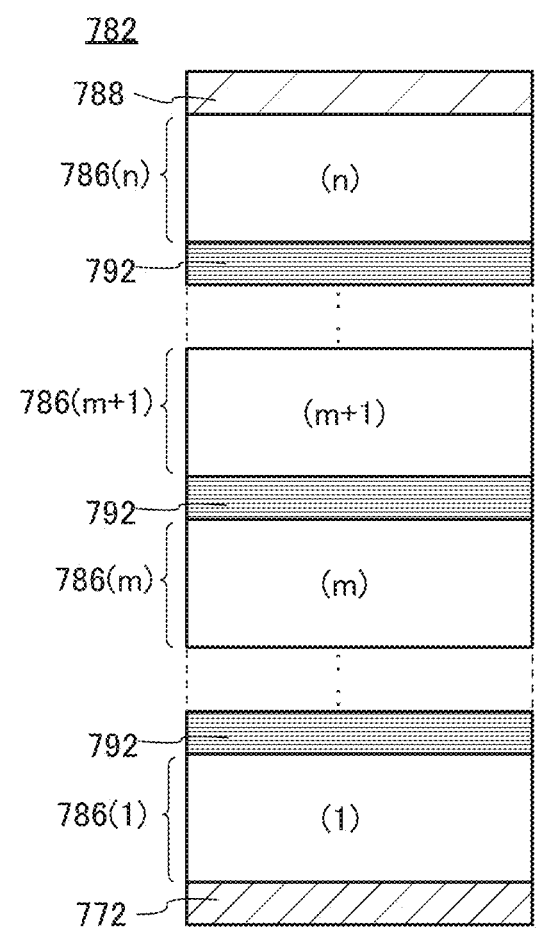

The light-emitting element 782 may have a structure illustrated in FIG. 26(E). FIG. 26(E) illustrates the light-emitting element 782 having a tandem structure in which n EL layers (an EL layer 786(1) to an EL layer 786(*n*)) are provided between the conductor 772 and the conductor 788, and the charge generation layer 792 is provided between the EL layers 786. Here, the EL layer 786(1) to the EL layer 786(*n*) can have a structure similar to that of the EL layer 786 illustrated in FIG. 26(B). Note that FIG. 26(E) illustrates the EL layer 786(1), the EL layer 786(*m*), and the EL layer 786(*n*) among the EL layers 786. Here, m is an integer greater than or equal to 2 and less than n, and n is an integer greater than m. As n becomes larger, the current efficiency and external quantum efficiency of the light-emitting element 782 can be increased. As a result, the display device 10 can display high-luminance images. Moreover, power consumption of the display device 10 can be reduced.

<Materials for Light-Emitting Element>

Next, materials that can be used for the light-emitting element 782 are described.

<<Conductor 772 and Conductor 788>>

For the conductor 772 and the conductor 788, any of the following materials can be used in an appropriate combination as long as the functions of the anode and the cathode can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb)), an alloy containing an appropriate combination of any of these elements, graphene, or the like.

<<Hole-Injection Layer 721 and Hole-Transport Layer 722>>

The hole-injection layer 721 injects holes to the EL layer 786 from the conductor 772, which is an anode, or the charge generation layer 792 and contains a material with a high hole-injection property. Here, the EL layer 786 includes the EL layer 786a, the EL layer 786b, the EL layer 786c, and the EL layer 786(1) to the EL layer 786(n).

Examples of the material with a high hole-injection property include transition metal oxides such as molybdenum oxide, vanadium oxide, ruthenium oxide, tungsten oxide, and manganese oxide. Alternatively, it is possible to use any of the following materials: phthalocyanine-based compounds such as phthalocyanine (abbreviation: $H_2Pc$ and copper phthalocyanine (abbreviation: CuPC); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material with a high hole-injection property, a composite material containing a hole-transport material and an acceptor material (electron-accepting material) can be used. In that case, the acceptor material extracts electrons from the hole-transport material, so that holes are generated in the hole-injection layer 721 and the holes are injected into the light-emitting layer 723 through the hole-transport layer 722. Note that the hole-injection layer 721 may be formed to have a single-layer structure using a composite material containing a hole-transport material and an acceptor material (electron-accepting material), or a stacked-layer structure in which a layer containing a hole-transport material and a layer containing an acceptor material (electron-accepting material) are stacked.

The hole-transport layer 722 transports the holes, which are injected from the conductor 772 by the hole-injection layer 721, to the light-emitting layer 723. Note that the hole-transport layer 722 contains a hole-transport material. It is particularly preferable that the HOMO level of the hole-transport material used for the hole-transport layer 722 be the same as or close to that of the hole-injection layer 721.

Examples of the acceptor material used for the hole-injection layer 721 include oxides of a metal belonging to any of Group 4 to Group 8 of the periodic table. Specific examples include molybdenum oxide, vanadium oxide, niobium oxide, tantalum oxide, chromium oxide, tungsten oxide, manganese oxide, and rhenium oxide. Among these oxides, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), and the like can be used.

The hole-transport materials used for the hole-injection layer 721 and the hole-transport layer 722 are preferably substances with a hole mobility of greater than or equal to $10^{-6}$ $cm^2/Vs$. Note that other substances can also be used as long as the substances have a hole-transport property higher than an electron-transport property.

Preferred hole-transport materials are π-electron rich heteroaromatic compounds (e.g., carbazole derivatives and indole derivatives) and aromatic amine compounds. Specific examples include compounds having an aromatic amine skeleton, such as 4,4'-bis[N-(1-naphthyl)-N-phenylamino] biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl) phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4''-tris(carbazol-9-yl)triphenylamine (abbreviation: TCTA), 4,4',4''-tris(N,N-diphenylamino)triphenylamine (abbreviation: TDATA), and 4,4',4''-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 1,3,5-tris[4-(N-carbazolyl)phenyl] benzene (abbreviation: TCPB), and 9-[4-(10-phenyl-9-anthracenyl)phenyl]-9H-carbazole (abbreviation: CzPA); compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl) phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4''-(benzene-1,3,5-triyl) tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

High molecular compounds such as poly(N-vinylcarbazole) (abbreviation: PVK), poly(4-vinyltriphenylamine) (abbreviation: PVTPA), poly[N-(4-{N'-[4-(4-diphenylamino) phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD) can also be used.

Note that the hole-transport material is not limited to the above examples, and one of or a combination of various known materials can be used as the hole-transport material for the hole-injection layer 721 and the hole-transport layer

722. Note that the hole-transport layer 722 may be formed of a plurality of layers. That is, for example, the hole-transport layer 722 may have a stacked-layer structure of a first hole-transport layer and a second hole-transport layer.

<<Light-Emitting Layer 723>>

The light-emitting layer 723 is a layer containing a light-emitting substance. As the light-emitting substance, a substance whose emission color is blue, violet, bluish violet, green, yellowish green, yellow, orange, red, or the like is appropriately used. Here, when the light-emitting element 782 includes a plurality of EL layers as illustrated in FIGS. 26(C), 26(D), and 26(E), the use of different light-emitting substances for the light-emitting layers 723 in the EL layers enables different emission colors to be exhibited (e.g., it enables white light emission obtained by combining complementary emission colors). For example, when the light-emitting element 782 has the structure illustrated in FIG. 26(C), the use of different light-emitting substances for the light-emitting layer 723 in the EL layer 786*a* and the light-emitting layer 723 in the EL layer 786*b* can achieve different emission colors of the EL layer 786*a* and the EL layer 786*b*. Note that the light-emitting element 782 may have a stacked-layer structure of light-emitting layers containing different light-emitting substances.

The light-emitting layer 723 may contain one or more kinds of organic compounds (a host material and an assist material) in addition to a light-emitting substance (guest material). As the organic compound(s), one or both of the hole-transport material and the electron-transport material can be used.

When the light-emitting element 782 has the structure illustrated in FIG. 26(C), it is preferred that a light-emitting substance that emits blue light (a blue-light-emitting substance) be used as a guest material in one of the EL layer 786*a* and the EL layer 786*b* and a substance that emits green light (a green-light-emitting substance) and a substance that emits red light (a red-light-emitting substance) be used in the other EL layer. This manner is effective when the blue-light-emitting substance (blue-light-emitting layer) has lower light emission efficiency or a shorter lifetime than the others. Here, it is preferred that a light-emitting substance that converts singlet excitation energy into light in the visible light range be used as the blue-light-emitting substance and light-emitting substances that convert triplet excitation energy into light in the visible light range be used as the green- and red-light-emitting substances, whereby the spectrum balance between R, G, and B is improved.

There is no particular limitation on the light-emitting substance that can be used for the light-emitting layer 723, and it is possible to use a light-emitting substance that converts singlet excitation energy into light in the visible light range or a light-emitting substance that converts triplet excitation energy into light in the visible light range. Examples of the light-emitting substance are given below.

Examples of the light-emitting substance that converts singlet excitation energy into light include substances that exhibit fluorescence (fluorescent materials). Specific examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl] pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N'-(pyrene-1,6-diyl)bis[(6,N-diphenylbenzo[b]naphtho [1,2-d]furan)-8-amine] (abbreviation: 1,6BnfAPrn-03). In addition, pyrene derivatives are compounds effective for meeting the chromaticity of blue in one embodiment of the present invention.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8, 11-tetra(tert-butyl)perylene (abbreviation: TBP), N,N''-(2-tert-butylanthracene-9,10-diyldi-4,1-phenylene)bis[N,N', N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), or the like.

Examples of the light-emitting substance that converts triplet excitation energy into light include a substance that exhibits phosphorescence (phosphorescent material) and a thermally activated delayed fluorescence (TADF) material that exhibits thermally activated delayed fluorescence.

Examples of a phosphorescent material include an organometallic complex, a metal complex (platinum complex), and a rare earth metal complex. These substances exhibit the respective emission colors (emission peaks) and thus, any of them is selected appropriately according to need.

As examples of a phosphorescent material which emits blue or green light and whose emission spectrum has a peak wavelength at greater than or equal to 450 nm and less than or equal to 570 nm, the following substances can be given.

Examples include organometallic complexes having a 4H-triazole skeleton, such as tris{2-[5-(2-methylphenyl)-4-(2,6-dimethylphenyl)-4H-1,2,4-triazol-3-yl-κN2]phenyl-κ C}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir (iPrptz-3b)$_3$]), and tris[3-(5-biphenyl)-5-isopropyl-4-phenyl-4H-1,2,4-triazolato]iridium(III) (abbreviation: [Ir (iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir (Mptz1-mp)$_3$]) and tris(1-methyl-5-phenyl-3-propyl-1H-1, 2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris

[3-(2,6-dimethylphenyl)-7-methylimidazo[1,2-f] phenanthridinato]iridium(III) (abbreviation: [Ir(dmpimpt-Me)$_3$]); and organometallic complexes in which a phenanthylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis[2-(3,5-bistrifluoromethyl-phenyl)-pyridinato-N,C$^{2'}$]iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

As examples of a phosphorescent material which emits green or yellow light and whose emission spectrum has a peak wavelength at greater than or equal to 495 nm and less than or equal to 590 nm, the following substances can be given.

Examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]).

Among the above, organometallic iridium complexes having a pyridine skeleton (particularly, a phenylpyridine skeleton) or a pyrimidine skeleton are compounds effective for meeting the chromaticity of green in one embodiment of the present invention.

As examples of a phosphorescent material which emits yellow or red light and whose emission spectrum has a peak wavelength at greater than or equal to 570 nm and less than or equal to 750 nm, the following substances can be given.

Examples include organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(d1npm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]).

Among the above, organometallic iridium complexes having a pyrazine skeleton are compounds effective for meeting the chromaticity of red in one embodiment of the present invention. In particular, organometallic iridium complexes having a cyano group, such as [Ir(dmdppr-dmCP)$_2$(dpm)], are preferable because of their high stability.

Note that as the blue-light-emitting substance, a substance whose photoluminescence peak wavelength is greater than or equal to 430 nm and less than or equal to 470 nm, preferably greater than or equal to 430 nm and less than or equal to 460 nm is used. As the green-light-emitting substance, a substance whose photoluminescence peak wavelength is greater than or equal to 500 nm and less than or equal to 540 nm, preferably greater than or equal to 500 nm and less than or equal to 530 nm is used. As the red-light-emitting substance, a substance whose photoluminescence peak wavelength is greater than or equal to 610 nm and less than or equal to 680 nm, preferably greater than or equal to 620 nm and less than or equal to 680 nm is used. Note that the photoluminescence may be measured with either a solution or a thin film.

With the parallel use of such compounds and the microcavity effect, the above chromaticity can be met more easily. Here, a transflective electrode (a metal thin film portion) that is needed for obtaining the microcavity effect has a thickness of preferably greater than or equal to 20 nm and less than or equal to 40 nm, further preferably greater than 25 nm and less than or equal to 40 nm. Note that the thickness greater than 40 nm possibly reduces the efficiency.

As the organic compounds (the host material and the assist material) used in the light-emitting layer 723, one or more kinds of substances having a larger energy gap than the light-emitting substance (the guest material) are used. Note that the hole-transport materials listed above and the electron-transport materials given below can be used as the host material and the assist material, respectively.

When the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

When the light-emitting substance is a phosphorescent material, an organic compound having triplet excitation energy (energy difference between a ground state and a triplet excited state) higher than that of the light-emitting substance can be selected as the host material. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, or the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, it is possible to use, for example, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]-9H-carbazol-3-amine (abbreviation: PCAPBA), 9,10-diphenyl-2-[N-phenyl-N-(9-phenyl-9H-carbazol-3-yl)amino]anthracene (abbreviation: 2PCAPA), 6,12-dimethoxy-5,11-diphenylchrysene, N,N,N',N',N",N",N"',N"'-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), or 1,3,5-tri(1-pyrenyl)benzene (abbreviation: TPB3).

When a plurality of organic compounds are used for the light-emitting layer 723, compounds that form an exciplex are preferably mixed with a light-emitting substance. In that case, any of various organic compounds can be used in an appropriate combination; to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material enables up-conversion of a triplet excited state into a singlet excited state (reverse intersystem crossing) using a little thermal energy and efficiently emits light from the singlet excited state (efficiently exhibits fluorescence). Thermally activated delayed fluorescence is efficiently obtained under the condition where the energy difference between the triplet excitation level and the singlet excitation level is greater than or equal to 0 eV and less than or equal to 0.2 eV, preferably greater than or equal to 0 eV and less than or equal to 0.1 eV. Note that delayed fluorescence exhibited by the TADF material refers to light emission having the same spectrum as normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP).

Alternatively, it is possible to use a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA). Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

Note that a TADF material can also be used in combination with another organic compound.

<<Electron-Transport Layer 724>>

The electron-transport layer 724 transports the electrons, which are injected from the conductor 788 by the electron-injection layer 725, to the light-emitting layer 723. Note that the electron-transport layer 724 contains an electron-transport material. The electron-transport material used for the electron-transport layer 724 is preferably a substance with an electron mobility of higher than or equal to $1\times10^{-6}$ $cm^2/Vs$. Note that any other substance can also be used as long as the substance transports electrons more easily than it transports holes.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use any of metal complexes such as Alq3, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxyphenyl)benzothiazolato]zinc (abbreviation: Zn(BTZ)$_2$); heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs); and quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Alternatively, a high-molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

The electron-transport layer 724 is not limited to a single layer and may be a stack of two or more layers each containing any of the above substances.

<<Electron-Injection Layer 725>>

The electron-injection layer 725 contains a substance having a high electron-injection property. The electron-injection layer 725 can be formed using an alkali metal, an alkaline earth metal, or a compound thereof, such as lithium fluoride (LiF), cesium fluoride (CsF), calcium fluoride (CaF$_2$), or lithium oxide (LiO$_x$). A rare earth metal compound like erbium fluoride (ErF$_3$) can also be used. An electride may also be used for the electron-injection layer 725. An example of the electride includes a substance in which electrons are added at high concentration to calcium oxide-aluminum oxide. Any of the above-described substances used for the electron-transport layer 724 can also be used.

A composite material in which an organic compound and an electron donor (donor) are mixed may also be used for the electron-injection layer 725. Such a composite material is excellent in an electron-injection property and an electron-transport property because electrons are generated in the organic compound by the electron donor. The organic compound here is preferably a material excellent in transporting the generated electrons; specifically, for example, the electron-transport material used for the electron-transport layer 724 (e.g., a metal complex or a heteroaromatic compound) can be used. As the electron donor, a substance showing an electron-donating property with respect to the organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

<<Charge Generation Layer 792>>

The charge generation layer 792 has a function of injecting electrons into the EL layer 786 that is closer to the conductor 772 of the two EL layers 786 in contact with the charge generation layer 792 and injecting holes to the other EL layer 786 that is closer to the conductor 788, when a voltage is applied between the conductor 772 and the conductor 788. For example, in the light-emitting element 782 having the structure illustrated in FIG. 26(C), the charge generation layer 792 has a function of injecting electrons into the EL layer 786a and injecting holes into the EL layer 786b. Note that the charge generation layer 792 may have either a structure in which an electron acceptor (acceptor) is added to a hole-transport material or a structure in which an electron donor (donor) is added to an electron-transport material. Alternatively, both of these structures may be stacked. Forming the charge generation layer 792 by using any of the above materials can inhibit the increase in driving voltage of the display device 10 including the stack of the EL layers.

When the charge generation layer 792 has a structure in which an electron acceptor is added to a hole-transport material, the electron acceptor can be 7,7,8,8-tetracyano-2,3,5,6-tetrafluoroquinodimethane (abbreviation: F$_4$-TCNQ), chloranil, or the like. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

When the charge generation layer 792 has a structure in which an electron donor is added to an electron-transport material, an alkali metal, an alkaline earth metal, a rare earth metal, or a metal that belongs to Group 2 or Group 13 of the periodic table, or an oxide or carbonate thereof can be used as the electron donor. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

For fabrication of the light-emitting element 782, a vacuum process such as an evaporation method or a solution process such as a spin coating method or an ink-jet method can be used. In the case of employing an evaporation method, it is possible to use a physical vapor deposition method (PVD method) such as a sputtering method, an ion plating method, an ion beam evaporation method, a molecular beam evaporation method, or a vacuum evaporation method, a chemical vapor deposition method (CVD method), or the like. Specifically, the functional layers (the hole-injection layer, the hole-transport layer, the light-emitting layer, the electron-transport layer, and the electron-injection layer) included in the EL layer and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Note that materials that can be used for the functional layers (the hole-injection layer, the hole-transport layer, the light-emitting layer, the electron-transport layer, and the electron-injection layer) included in the EL layer and the charge generation layer of the light-emitting element described in this embodiment are not limited to the above materials, and other materials can be used in combination as long as the functions of the layers are fulfilled. For example, a high molecular compound (e.g., an oligomer, a dendrimer, and a polymer), a middle molecular compound (a compound between a low molecular compound and a high molecular compound, with a molecular weight of 400 to 4000), or an inorganic compound (e.g., a quantum dot material) can be used. The quantum dot material may be a colloidal quantum dot material, an alloyed quantum dot material, a core-shell quantum dot material, a core quantum dot material, or the like.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 2

In this embodiment, transistors that can be used in the display device of one embodiment of the present invention are described.

Structure Example 1 of Transistor

Figure 27A:
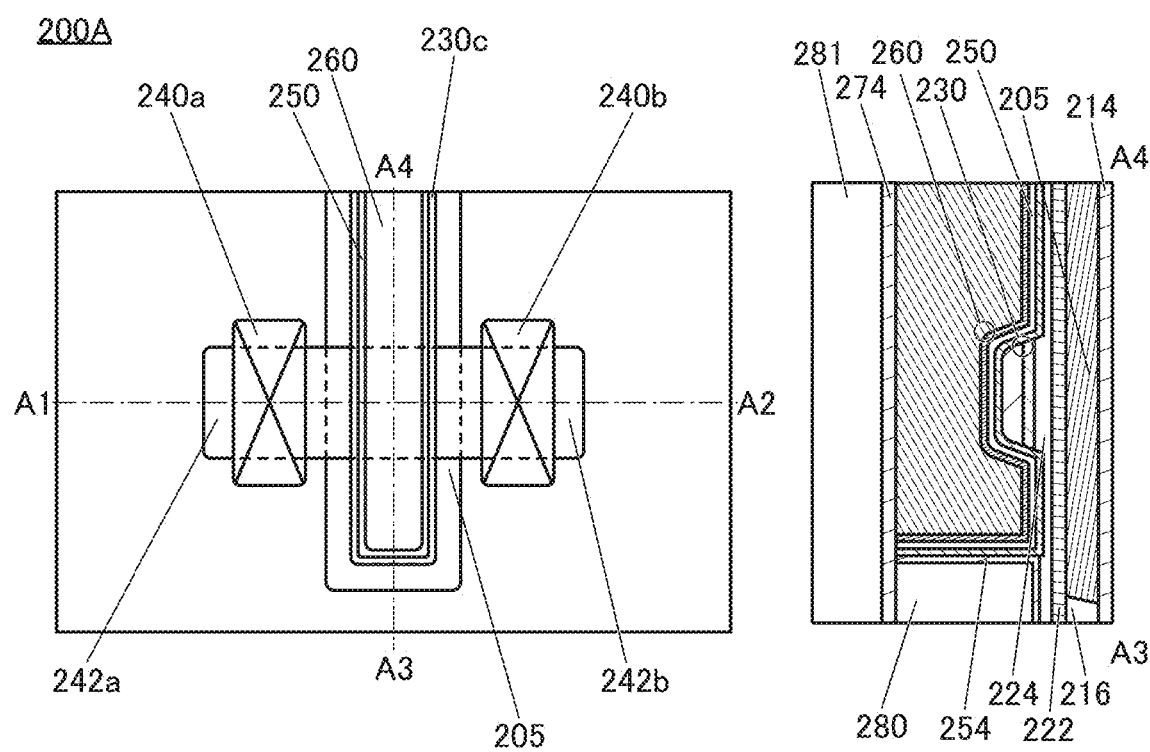
FIG. 27 (A) A top view illustrating a structure example of a transistor. (B), (C) Cross-sectional views illustrating the structure examples of the transistor.
Figure 27C:
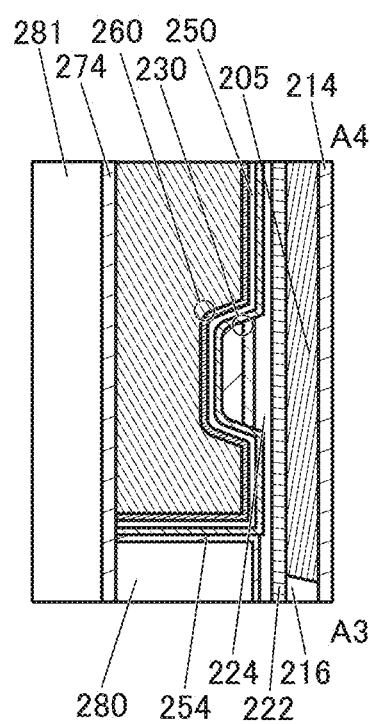
Figure 27B:
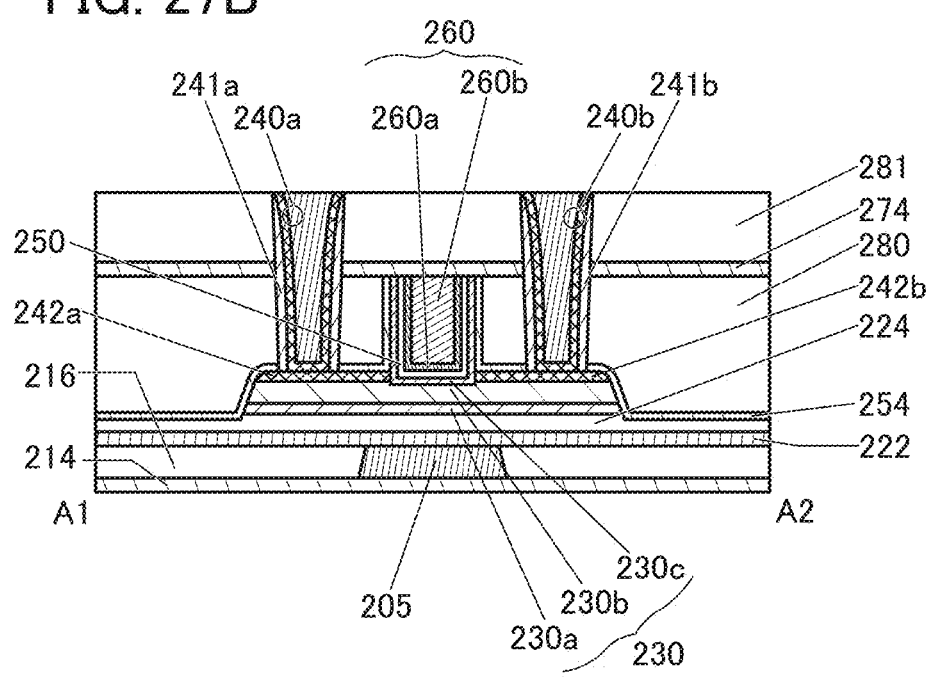

FIGS. 27(A), 27(B), and 27(C) are a top view and cross-sectional views of a transistor 200A that can be used in the display device of one embodiment of the present invention, and the periphery of the transistor 200A. The transistor 200A can be used as the transistors included in the display portion 33, the gate driver circuit 21, the source driver circuit 22, and the circuit 40 described in Embodiment 1 and the like.

FIG. 27(A) is a top view of the transistor 200A. FIGS. 27(B) and 27(C) are cross-sectional views of the transistor 200A. FIG. 27(B) is a cross-sectional view taken along the dashed-dotted line A1-A2 in FIG. 27(A) and shows a cross section of the transistor 200A in the channel length direction. FIG. 27(C) is a cross-sectional view taken along the dashed-dotted line A3-A4 in FIG. 27(A) and shows a cross section of the transistor 200A in the channel width direction. Note that for simplification of the drawing, some components are not illustrated in the top view in FIG. 27(A).

The transistor 200A includes a metal oxide 230*a* over a substrate (not illustrated); a metal oxide 230*b* over the metal oxide 230*a*; a conductor 242*a* and a conductor 242*b* that are apart from each other over the metal oxide 230*b*; the insulator 280 that is positioned over the conductor 242*a* and the conductor 242*b* and has an opening between the conductor 242*a* and the conductor 242*b*; a conductor 260 in the opening; an insulator 250 between the conductor 260 and the metal oxide 230*b*, the conductor 242*a*, the conductor 242*b*, and the insulator 280; and a metal oxide 230*c* between the insulator 250 and the metal oxide 230*b*, the conductor 242*a*, the conductor 242*b*, and the insulator 280. Here, as illustrated in FIGS. 27(B) and 27(C), the top surface of the conductor 260 is substantially aligned with the top surfaces of the insulator 250, the insulator 254, the metal oxide 230*c*, and the insulator 280. Hereinafter, the metal oxide 230*a*, the metal oxide 230*b*, and the metal oxide 230*c* may be collectively referred to as a metal oxide 230. The conductor 242*a* and the conductor 242*b* may be collectively referred to as a conductor 242 in some cases.

As illustrated in FIG. 27(B), in the transistor 200A, the side surfaces of the conductor 242*a* and the conductor 242*b* closer to the conductor 260 are substantially perpendicular. Note that the transistor 200A illustrated in FIGS. 27(A) to 27(C) is not limited thereto, and the angle formed between the side surface and the bottom surface of the conductor 242*a* and the conductor 242*b* may range from 10° to 0°, preferably from 30° to 60°. The facing side surfaces of the conductor 242*a* and the conductor 242*b* may each have a plurality of surfaces.

As illustrated in FIGS. 27(B) and 27(C), the insulator 254 is preferably provided between the insulator 280 and the insulator 224, the metal oxide 230*a*, the metal oxide 230*b*, the conductor 242*a*, the conductor 242*b*, and the metal oxide 230*c*. Here, as illustrated in FIGS. 27(B) and 27(C), the insulator 254 preferably includes a region in contact with the side surface of the metal oxide 230*c*, the top surface and side surface of the conductor 242*a*, the top surface and side surface of the conductor 242*b*, the side surface of the metal oxide 230*a*, the side surface of the metal oxide 230*b*, and the top surface of the insulator 224.

In the transistor 200A, three layers of the metal oxide 230*a*, the metal oxide 230*b*, and the metal oxide 230*c* are stacked in and around the region where the channel is formed (hereinafter also referred to as channel formation region); however, the present invention is not limited thereto. For example, a two-layer structure of the metal oxide 230*b* and the metal oxide 230*c* or a stacked-layer structure of four or more layers may be employed. Although the conductor 260 has a stacked-layer structure of two layers in the transistor 200A, the present invention is not limited thereto. For example, the conductor 260 may have a single-layer structure or a stacked-layer structure of three or more layers. Furthermore, each of the metal oxide 230*a*, the metal oxide 230*b*, and the metal oxide 230*c* may have a stacked-layer structure of two or more layers.

For example, when the metal oxide 230*c* has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b with respect to the opening of the insulator 280 are selected in a self-aligned manner. That is, in the transistor 200A, the gate electrode can be positioned between the source electrode and the drain electrode in a self-aligned manner. Thus, the conductor 260 can be formed without an alignment margin, resulting in a reduction in the footprint of the transistor 200A. Consequently, a display device can achieve high definition and have a narrow frame.

In addition, as illustrated in FIG. 27, the conductor 260 preferably includes a conductor 260a provided inside the insulator 250 and a conductor 260b embedded inside the conductor 260a.

As illustrated in FIGS. 27(A), 27(B), and 27(C), the transistor 200A preferably includes the insulator 214 over the substrate (not illustrated); the insulator 216 over the insulator 214; a conductor 205 embedded in the insulator 216; the insulator 222 over the insulator 216 and the conductor 205; and the insulator 224 over the insulator 222. The metal oxide 230a is preferably positioned over the insulator 224.

The insulator 274 and the insulator 281 functioning as interlayer films are preferably provided over the transistor 200A. Here, the insulator 274 is preferably provided in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of at least one of oxygen (e.g., oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated by the insulator 280, the insulator 281, the insulator 254, and the insulator 274. This can inhibit entry of impurities such as hydrogen included in the insulator 280 and the insulator 281 and excess oxygen into the insulator 224, the metal oxide 230a, the metal oxide 230b, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. Alternatively, a first conductor of the conductor 240 may be provided in contact with the side surface of the insulator 241 and a second conductor of the conductor 240 may be provided on the inner side of the first conductor. Here, the top surface of the conductor 240 and the top surface of the insulator 281 can be at substantially the same level. Although the first conductor of the conductor 240 and the second conductor of the conductor 240 are stacked in the transistor 200A, the present invention is not limited thereto. For example, the conductor 240 may have a single-layer structure or a stacked-layer structure of three or more layers. In the case where a stacked-layer structure is employed, the layers may be distinguished by numbers corresponding to the formation order.

In the transistor 200A, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, as the metal oxide to be the channel formation region of the metal oxide 230, it is preferable to use a metal oxide having a band gap of 2 eV or more, preferably 2.5 eV or more, as described above.

As illustrated in FIG. 27(B), the metal oxide 230b may have a smaller thickness in a region that is not overlapped by the conductor 242 than in a region overlapped by the conductor 242. The thin region is formed when part of the top surface of the metal oxide 230b is removed at the time of forming the conductor 242a and the conductor 242b. When a conductive film to be the conductor 242 is formed, a low-resistance region may be formed on the top surface of the metal oxide 230b in the vicinity of the interface with the conductive film. Removing the low-resistance region between the conductor 242a and the conductor 242b on the top surface of the metal oxide 230b in the above manner can inhibit formation of the channel in the region.

According to one embodiment of the present invention, a display device that includes small-size transistors and has high definition can be provided. A display device that includes transistors with a high on-state current and achieves high luminance can be provided. A display device that includes fast transistors and operates at high speed can be provided. A display device that includes transistors having stable electrical characteristics and is highly reliable can be provided. A display device that includes transistors with a low off-state current and achieves low power consumption can be provided.

The structure of the transistor 200A that can be used in the display device of one embodiment of the present invention is described in detail.

The conductor 205 is placed so as to include a region overlapped by the metal oxide 230 and the conductor 260. The conductor 205 is preferably embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and increases the crystallinity of the metal oxide 230b and the metal oxide 230c.

Here, the conductor 260 functions as a first gate (also referred to as top gate) electrode in some cases. The conductor 205 functions as a second gate (also referred to bottom gate) electrode in some cases. In that case, by changing a potential applied to the conductor 205 independently of a potential applied to the conductor 260, $V_{th}$ of the transistor 200A can be controlled. In particular, by applying a negative potential to the conductor 205, $V_{th}$ of the transistor 200A can be higher, and its off-state current can be reduced. Thus, a drain current of the transistor 200A at the time when a potential applied to the conductor 260 is 0 V can be smaller in the case where a negative potential is applied to the conductor 205 than in the case where the negative potential is not applied to the conductor 205.

The conductor 205 is preferably larger than the channel formation region of the metal oxide 230. It is particularly preferred that the conductor 205 extend beyond an end portion of the metal oxide 230 that intersects with the channel width direction, as illustrated in FIG. 27(C). That is, the conductor 205 and the conductor 260 preferably overlap each other with the insulator positioned therebetween, in a region beyond the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

As illustrated in FIG. 27(C), the conductor 205 is extended to have a function of a wiring. However, without limitation to this structure, a conductor functioning as a wiring may be provided under the conductor 205.

A conductive material containing tungsten, copper, or aluminum as its main component is preferably used for the conductor 205. Note that the conductor 205 is shown as a single layer but may have a stacked-layer structure, for example, a stack of titanium or titanium nitride and any of the above conductive materials.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, a conductor through which the above impurities are less likely to pass may be provided under the conductor 205. Alternatively, it is preferable to provide a conductor having a function of inhibiting diffusion of oxygen (e.g., at least one of oxygen atoms and oxygen molecules), that is, a conductor through which oxygen is less likely to pass. Note that in this specification, a function of inhibiting diffusion of impurities or oxygen means a function of inhibiting diffusion of any one or all of the above impurities and oxygen.

When the conductor having a function of inhibiting oxygen diffusion is provided under the conductor 205, a reduction in conductivity of the conductor 205 due to oxidation of the conductor 205 can be inhibited. As the conductor having a function of inhibiting oxygen diffusion, tantalum, tantalum nitride, ruthenium, or ruthenium oxide is preferably used, for example. A first conductor of the conductor 205 can therefore be a single layer or a stack of the above conductive materials.

The insulator 214 preferably functions as a barrier insulating film for inhibiting impurities such as water or hydrogen from entering the transistor 200A from the substrate side. Accordingly, the insulator 214 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, the insulator 214 is preferably formed using an insulating material having a function of inhibiting diffusion of oxygen (e.g., oxygen atoms and oxygen molecules), that is, an insulating material through which oxygen is less likely to pass.

For example, aluminum oxide or silicon nitride is preferably used for the insulator 214. Accordingly, it is possible to inhibit diffusion of impurities such as water or hydrogen into the transistor 200A side from the substrate side through the insulator 214. It is also possible to inhibit diffusion of oxygen contained in the insulator 224 and the like toward the substrate through the insulator 214.

The dielectric constant of each of the insulator 216, the insulator 280, and the insulator 281 functioning as an interlayer film is preferably lower than that of the insulator 214. The use of a material having a low dielectric constant for the interlayer film can reduce the parasitic capacitance between wirings. For example, for the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 222 and the insulator 224 function as a gate insulator.

Here, it is preferred that the insulator 224 in contact with the metal oxide 230 release oxygen by heating. In this specification and the like, oxygen that is released by heating is referred to as excess oxygen in some cases. For example, silicon oxide or silicon oxynitride can be used as appropriate for the insulator 224. When such an insulator containing oxygen is provided in contact with the metal oxide 230, oxygen vacancies in the metal oxide 230 can be reduced, leading to an improvement in reliability of the transistor 200A.

Specifically, an oxide material that releases some oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

As illustrated in FIG. 27(C), the insulator 224 is sometimes thinner in a region overlapped by neither the insulator 254 nor the metal oxide 230b than in the other regions. In the insulator 224, the region overlapped by neither the insulator 254 nor the metal oxide 230b preferably has a thickness with which released oxygen can be adequately diffused.

Like the insulator 214 and the like, the insulator 222 preferably functions as a barrier insulating film that inhibits entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, entry of impurities such as water or hydrogen into the transistor 200A from the outside can be inhibited.

Furthermore, the insulator 222 preferably has a function of inhibiting diffusion of oxygen (e.g., oxygen atoms and oxygen molecules); that is, it is preferred that oxygen is less likely to pass through the insulator 222. For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse toward the substrate. The insulator 222 can also inhibit reaction of the conductor 205 with oxygen contained in the insulator 224 and oxygen contained in the metal oxide 230.

As the insulator 222, an insulator containing an oxide of aluminum and/or an oxide of hafnium, which are insulating materials, is preferably used. As the insulator containing an oxide of one or both of aluminum and hafnium, aluminum oxide or hafnium oxide is preferably used. Alternatively, an oxide containing aluminum and hafnium (hafnium aluminate) or the like is preferably used. The insulator 222 formed using such a material functions as a layer inhibiting oxygen release from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulator 222 may have a single-layer structure or a stacked-layer structure using an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as generation of leakage current may arise because of a thinner gate insulator. When a high-k material is used for an insulator functioning as the gate insulator, a gate potential at the time when the transistor operates can be lowered while the physical thickness of the gate insulator is maintained.

Note that the insulator 222 and the insulator 224 may each have a stacked-layer structure of two or more layers. In that case, the stacked layers are not necessarily formed of the same material and may be formed of different materials. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. The metal oxide 230a under the metal oxide 230b can inhibit diffusion of impurities into the metal oxide 230b from the components formed below the metal oxide 230a. The metal oxide 230c over the metal oxide 230b can inhibit diffusion of impurities into the metal oxide 230b from the components formed above the metal oxide 230c.

Note that the metal oxide 230 preferably has a stacked-layer structure of oxides with different atomic ratios of metal atoms. Specifically, the atomic ratio of the element M to the constituent elements in the metal oxide used as the metal oxide 230a is preferably higher than that in the metal oxide used as the metal oxide 230b. The atomic ratio of the element M to In in the metal oxide used as the metal oxide 230a is preferably higher than that in the metal oxide used as the metal oxide 230b. The atomic ratio of In to the element M in the metal oxide used as the metal oxide 230b is preferably higher than that in the metal oxide used as the metal oxide 230a. The metal oxide 230c can be formed using a metal oxide that can be used as the metal oxide 230a or the metal oxide 230b.

The metal oxide 230a, the metal oxide 230b, and the metal oxide 230c preferably have crystallinity, and are particularly preferably formed using a CAAC-OS (c-axis-aligned crystalline oxide semiconductor). An oxide having crystallinity, such as a CAAC-OS, has a dense structure with small amounts of impurities and defects (e.g., oxygen vacancies) and high crystallinity. This reduces oxygen extraction from the metal oxide 230b by the source electrode or the drain electrode. Accordingly, oxygen extraction from the metal oxide 230b can be inhibited even when heat treatment is performed. Thus, the transistor 200A is stable against high temperatures in the manufacturing process (i.e., thermal budget).

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, the metal oxide 230c is preferably formed using a metal oxide that can be used as the metal oxide 230a. Specifically, the atomic ratio of the element M to the constituent elements in the metal oxide used as the metal oxide 230c is preferably higher than the atomic ratio of the element M to the constituent elements in the metal oxide used as the metal oxide 230b. The atomic ratio of the element M to In in the metal oxide used as the metal oxide 230c is preferably higher than the atomic ratio of the element M to In in the metal oxide used as the metal oxide 230b. The atomic ratio of In to the element M in the metal oxide used as the metal oxide 230b is preferably higher than the atomic ratio of In to the element M in the metal oxide used as the metal oxide 230c.

Here, the energy level of the conduction band minimum is gradually varied at a junction portion of each of the metal oxide 230a, the metal oxide 230b, and the metal oxide 230c. In other words, the energy levels of the conduction band minimum at a junction portion of each of the metal oxide 230a, the metal oxide 230b, and the metal oxide 230c continuously vary or are continuously connected. This can be achieved by decrease in the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, it is preferable to use an In—Ga—Zn oxide, a Ga—Zn oxide, gallium oxide, or the like as each of the metal oxide 230a and the metal oxide 230c. The metal oxide 230c may have a stacked-layer structure. For example, the metal oxide 230c can have a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the metal oxide 230c may have a stacked-layer structure of an In—Ga—Zn oxide and an oxide that does not contain In.

Specifically, as the metal oxide 230a, a metal oxide having an atomic ratio of In:Ga:Zn=1:3:4 or In:Ga:Zn=1:1:0.5 can be used. As the metal oxide 230b, a metal oxide having an atomic ratio of In:Ga:Zn=4:2:3 or In:Ga:Zn=3:1:2 can be used. As the metal oxide 230c, a metal oxide having an atomic ratio of In:Ga:Zn=1:3:4, In:Ga:Zn=4:2:3, Ga:Zn=2:1, or Ga:Zn=2:5 can be used. Specific examples of a stacked-layer structure of the metal oxide 230c include a stacked-layer structure of a layer having an atomic ratio of In:Ga:Zn=4:2:3 and a layer having an atomic ratio of Ga:Zn=2:1, a stacked-layer structure of a layer having an atomic ratio of In:Ga:Zn=4:2:3 and a layer having an atomic ratio of Ga:Zn=2:5, and a stacked-layer structure of a layer having an atomic ratio of In:Ga:Zn=4:2:3 and gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect state at the interface between the metal oxide 230b and the metal oxide 230c, but also the effect of inhibiting diffusion of the constituent element of the metal oxide 230c toward the insulator 250 can be expected. Specifically, the metal oxide 230c has a stacked-layer structure in which the upper layer is an oxide that does not contain In, whereby the amount of In that would diffuse toward the insulator 250 can be reduced. Since the insulator 250 functions as a gate insulator, the transistor would show poor characteristics when In diffuses into the insulator 250. Thus, the metal oxide 230c having a stacked-layer structure allows the display device to have high reliability.

The metal oxide 230 is preferably formed using a metal oxide functioning as an oxide semiconductor. For example, the metal oxide to be the channel formation region of the metal oxide 230 has a band gap of preferably 2 eV or more, further preferably 2.5 eV or more. The use of a metal oxide having a wide band gap can reduce the off-state current of the transistor. The use of such a transistor can provide a display device with low power consumption.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. In this manner, the conductor 260 can be formed in a self-aligned manner between the conductor 242a and the conductor 242b.

The insulator 250 functions as a gate insulator. The insulator 250 is preferably in contact with a top surface of the metal oxide 230c. For the insulator 250, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide can be used. In particular, silicon oxide and silicon oxynitride, which have thermal stability, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably has a function of inhibiting oxygen diffusion from the insulator 250 into the conductor 260. Thus, oxidation of the conductor 260 due to oxygen in the insulator 250 can be inhibited.

Note that the metal oxide has a function of part of the gate insulator in some cases. For that reason, when silicon oxide, silicon oxynitride, or the like is used for the insulator 250, the metal oxide is preferably a high-k material with a high dielectric constant. The gate insulator having a stacked-layer structure of the insulator 250 and the metal oxide enables the transistor 200A to be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 has a two-layer structure in FIG. 27, the conductor 260 may have a single-layer structure or a stacked-layer structure of three or more layers.

The conductor 260a is preferably formed using the aforementioned conductive material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, the conductor 260a is preferably formed using a conductive material having a function of inhibiting diffusion of at least one of oxygen (e.g., oxygen atoms and oxygen molecules).

When the conductor 260a has a function of inhibiting diffusion of oxygen, the conductivity of the conductor 260b can be prevented from being lowered because of oxidization of the conductor 260b due to oxygen in the insulator 250. As a conductive material having a function of inhibiting oxygen diffusion, tantalum, tantalum nitride, ruthenium, or ruthenium oxide is preferably used, for example.

The conductor 260b is preferably formed using a conductive material containing tungsten, copper, or aluminum as its main component. The conductor 260 also functions as a wiring and thus is preferably a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIGS. 27(A) and 27(C), the side surface of the metal oxide 230 is covered with the conductor 260 in a region where the metal oxide 230b is not overlapped by the conductor 242, that is, the channel formation region of the metal oxide 230. Accordingly, electric fields of the conductor 260 functioning as the first gate electrode are likely to act on the side surface of the metal oxide 230. Hence, the transistor 200A can have a higher on-state current and improved frequency characteristics.

The insulator 254 as well as the insulator 214 and the like preferably functions as a barrier insulating film that inhibits impurities such as water or hydrogen from entering the transistor 200A from the insulator 280 side. For example, it is preferable that the insulator 254 less transmit hydrogen than the insulator 224. Furthermore, as illustrated in FIGS. 27(B) and 27(C), the insulator 254 preferably includes a region in contact with the side surface of the metal oxide 230c, the top surface and side surface of the conductor 242a, the top surface and side surface of the conductor 242b, the side surface of the metal oxide 230a, the side surface of the metal oxide 230b, and the top surface of the insulator 224. Such a structure can inhibit entry of hydrogen of the insulator 280 into the metal oxide 230 through top surfaces or side surfaces of the conductor 242a, the conductor 242b, the metal oxide 230a, the metal oxide 230b, and the insulator 224.

Furthermore, the insulator 254 preferably has a function of inhibiting diffusion of at least one of oxygen (e.g., oxygen atoms and oxygen molecules); that is, it is preferable that oxygen is less likely to pass through the insulator 254. For example, it is preferred that the insulator 254 less transmit oxygen than the insulator 280 or the insulator 224.

The insulator 254 is preferably formed by a sputtering method. When the insulator 254 is formed by a sputtering method in an oxygen-containing atmosphere, oxygen can be added to a region of the insulator 224 in contact with the insulator 254 and its vicinity. Thus, oxygen can be supplied from the region to the metal oxide 230 through the insulator 224. Here, with the insulator 254 having a function of inhibiting upward oxygen diffusion, diffusion of oxygen from the metal oxide 230 into the insulator 280 can be inhibited. Moreover, with the insulator 222 having a function of inhibiting downward oxygen diffusion, diffusion of oxygen from the metal oxide 230 toward the substrate can be inhibited. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of aluminum and/or hafnium is formed, for example. Note that as the insulator containing an oxide of aluminum and/or hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This inhibits entry of impurities such as hydrogen from the outside of the transistor 200A, resulting in favorable electrical characteristics and reliability of the transistor 200A.

The insulator 280 is provided over the insulator 224, the metal oxide 230, and the conductor 242 with the insulator 254 placed therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. Silicon oxide and silicon oxynitride are particularly preferable in terms of high thermal stability. A material such as silicon oxide, silicon oxynitride, or porous silicon oxide is preferably used, in which case a region including oxygen that is released by heating can be easily formed.

The concentration of impurities such as water or hydrogen in the insulator 280 is preferably lowered. The top surface of the insulator 280 may be planarized.

The insulator 274, like the insulator 214 or the like, preferably functions as a barrier insulating film that inhibits entry of impurities such as water and hydrogen into the insulator 280. The insulator 274 can be formed using an insulator that can be used as the insulator 214 or the insulator 254, for example.

The insulator 281 functioning as an interlayer film is preferably provided over the insulator 274. As in the insulator 224 or the like, the concentration of impurities such as water and hydrogen in the insulator 281 is preferably reduced.

The conductor 240a and the conductor 240b are provided in openings formed in the insulator 281, the insulator 274, the insulator 280, and the insulator 254. The conductor 240a the conductor and 240b are positioned to face each other with the conductor 260 therebetween. Note that the top surfaces of the conductor 240a and the conductor 240b may be level with the top surface of the insulator 281.

The insulator 241a is provided in contact with the inner wall of the opening in the insulator 281, the insulator 274, the insulator 280, and the insulator 254, and the first conductor of the conductor 240a is formed in contact with the side surface of the insulator 241a. The conductor 242a is positioned on at least part of the bottom of the opening, and thus the conductor 240a is in contact with the conductor 242a. Similarly, the insulator 241b is provided in contact with the inner wall of another opening in the insulator 281, the insulator 274, the insulator 280, and the insulator 254, and the first conductor of the conductor 240b is formed in contact with the side surface of the insulator 241b. The conductor 242b is positioned on at least part of the bottom of the opening, and thus the conductor 240b is in contact with the conductor 242b.

The conductor 240a and the conductor 240b are preferably formed using a conductive material containing tungsten, copper, or aluminum as its main component. The conductor 240a and the conductor 240b may have a stacked-layer structure.

When the conductor 240 has a stacked-layer structure, the aforementioned conductor having a function of inhibiting diffusion of impurities such as water or hydrogen is preferably used for the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, or ruthenium oxide is preferably used. The conductive material having a function of inhibiting diffusion of impurities such as water or hydrogen can be used as a single layer or stacked layers. The use of the conductive material can prevent oxygen added to the insulator 280 from being absorbed by the conductor 240a and the conductor 240b, and prevent impurities such as water or hydrogen from entering the metal oxide 230 through the conductor 240a and the conductor 240b from the components above the insulator 281.

The insulator 241a and the insulator 241b are formed using any of the insulators that can be used for the insulator 254, for example. Since the insulator 241a and the insulator 241b are provided in contact with the insulator 254, impurities such as water and hydrogen in the insulator 280 or the like can be prevented from entering the metal oxide 230 through the conductor 240a and the conductor 240b. Furthermore, oxygen contained in the insulator 280 can be prevented from being absorbed by the conductor 240a and the conductor 240b.

Although not illustrated, a conductor functioning as a wiring may be provided in contact with the top surface of the conductor 240a and the top surface of the conductor 240b. The conductor functioning as a wiring is preferably formed using a conductive material containing tungsten, copper, or aluminum as its main component. The conductor may have a stacked-layer structure, for example, a stack of titanium or titanium nitride and the above conductive material. Note that the conductor may be formed to be embedded in an opening provided in an insulator.

Structure Example 2 of Transistor

Figure 28A:
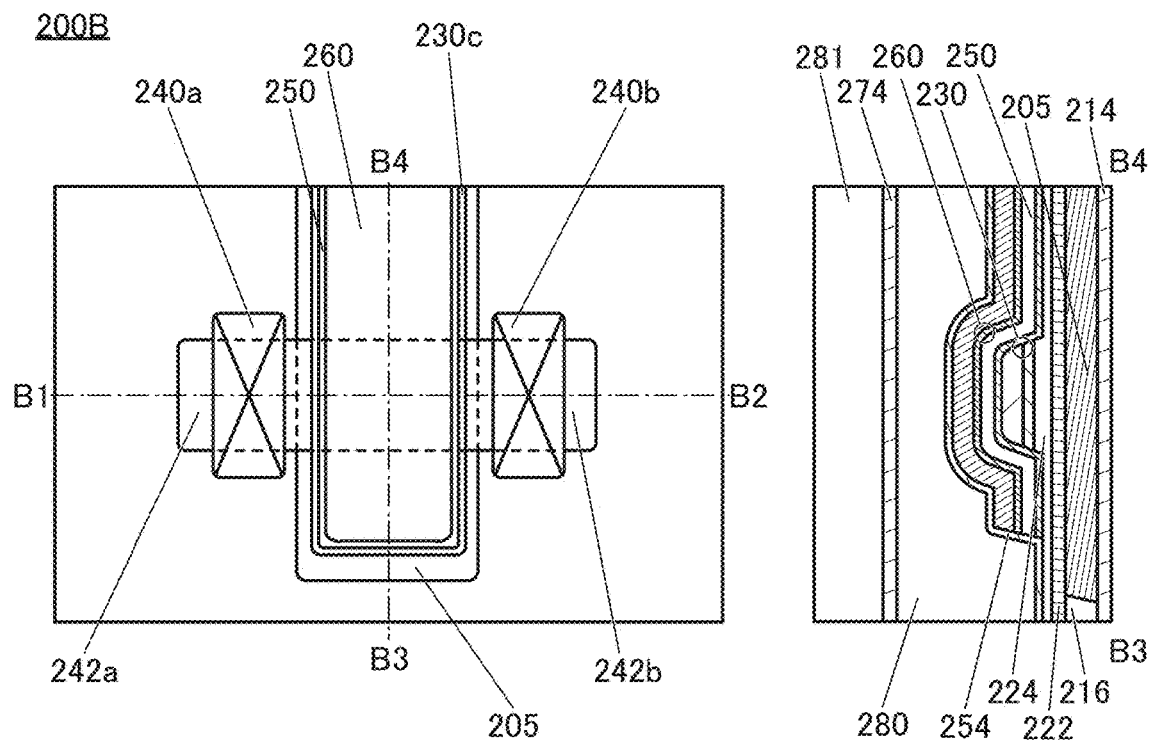
FIG. 28 (A) A top view illustrating a structure example of a transistor. (B), (C) Cross-sectional views illustrating the structure examples of the transistor.
Figure 28C:
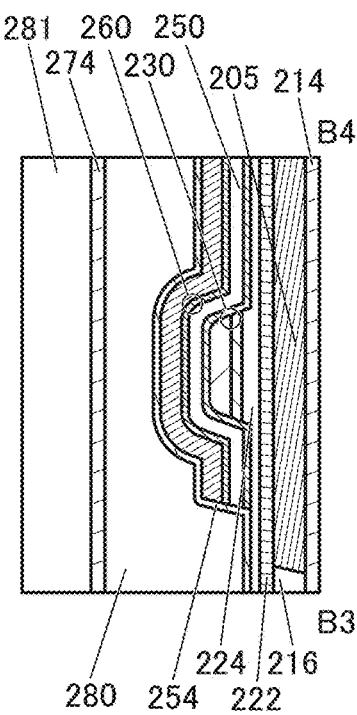
Figure 28B:
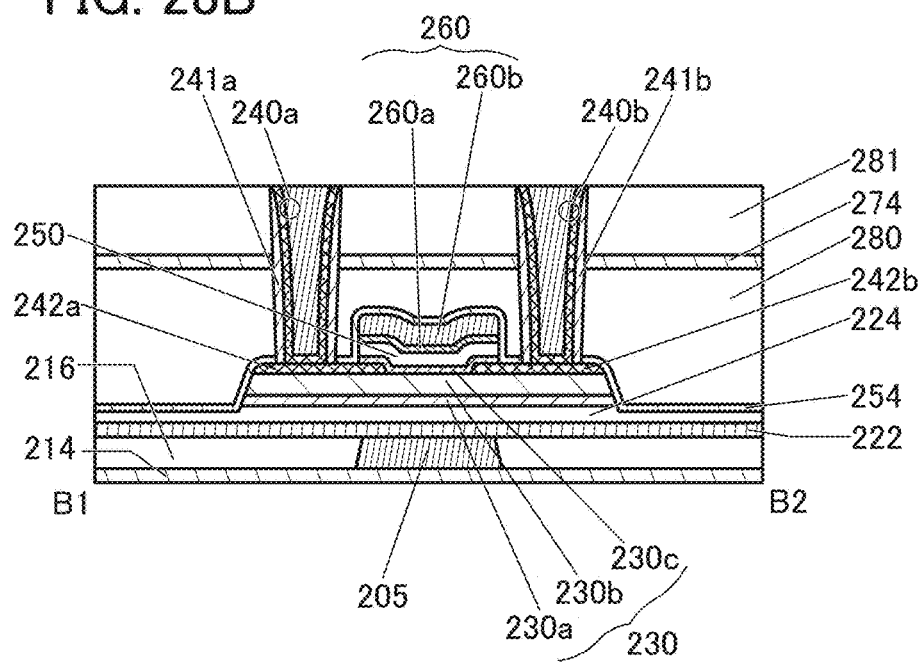

FIGS. 28(A), 28(B), and 28(C) are a top view and cross-sectional views of a transistor 200B that can be used in the display device of one embodiment of the present invention, and the periphery of the transistor 200B. The transistor 200B is a modification example of the transistor 200A.

FIG. 28(A) is a top view of the transistor 200B. FIGS. 28(B) and 28(C) are cross-sectional views of the transistor 200B. FIG. 28(B) is a cross-sectional view taken along the dashed-dotted line B1-B2 in FIG. 28(A) and shows a cross section of the transistor 200B in the channel length direction. FIG. 28(C) is a cross-sectional view taken along the dashed-dotted line B3-B4 in FIG. 28(A) and shows a cross section of the transistor 200B in the channel width direction. Note that for simplification of the drawing, some components are not illustrated in the top view in FIG. 28(A).

In the transistor 200B, the conductor 242a and the conductor 242b each have a region overlapping with the metal oxide 230c, the insulator 250, and the conductor 260. Thus, the transistor 200B can have a high on-state current. In addition, the transistor 200B can be a transistor that is easy to control.

The conductor 260 functioning as a gate electrode includes the conductor 260a and the conductor 260b over the conductor 260a. The conductor 260a is preferably formed using a conductive material having a function of inhibiting diffusion of impurities such as a hydrogen atom, a hydrogen molecule, a water molecule, and a copper atom. Alternatively, the conductor 260a is preferably formed using a conductive material having a function of inhibiting diffusion of oxygen (e.g., at least one of oxygen atoms and oxygen molecules).

When the conductor 260a has a function of inhibiting oxygen diffusion, the range of choices for the material of the conductor 260b can be expanded. That is, the conductor 260a inhibits oxidation of the conductor 260b, thereby inhibiting the decrease in conductivity of the conductor 260b.

The insulator 254 is preferably provided to cover the top surface and the side surface of the conductor 260, the side surface of the insulator 250, and the side surface of the metal oxide 230c. Note that the insulator 254 is preferably formed using an insulating material having a function of inhibiting diffusion of oxygen and impurities such as water or hydrogen.

The insulator 254 can inhibit oxidation of the conductor 260. Moreover, the insulator 254 can inhibit diffusion of impurities such as water and hydrogen contained in the insulator 280 into the transistor 200B.

Structure Example 3 of Transistor

FIGS. 28(A), 28(B), and 28(C) are a top view and cross-sectional views of a transistor 200C that can be used in the display device of one embodiment of the present invention, and the periphery of the transistor 200C. The transistor 200C is a modification example of the transistor 200A.

Figure 29A:
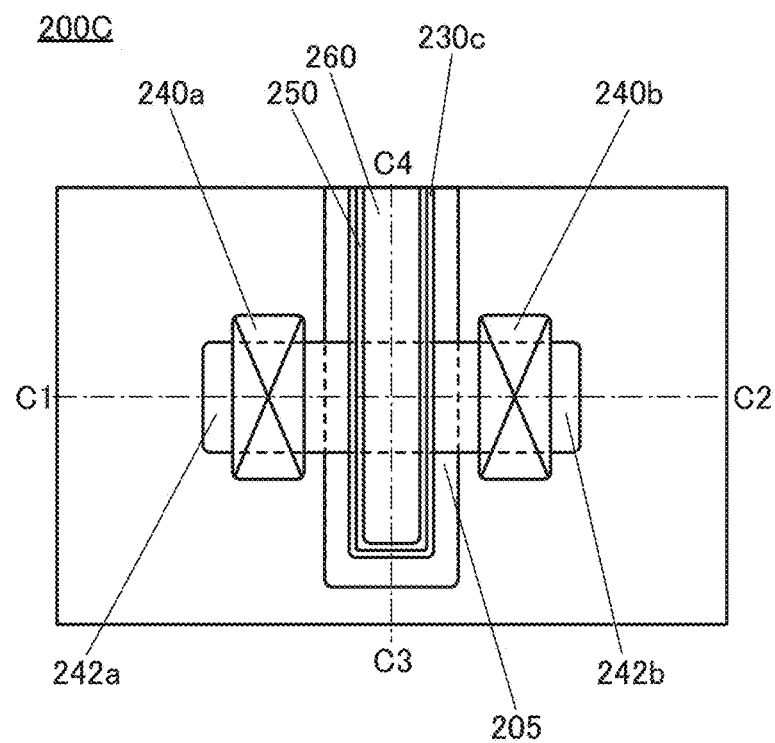
FIG. 29 (A) A top view illustrating a structure example of a transistor. (B), (C) Cross-sectional views illustrating the structure examples of the transistor.
Figure 29C:
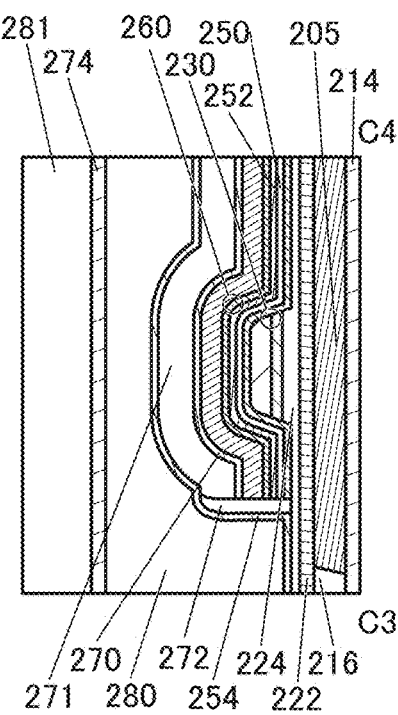
Figure 29B:
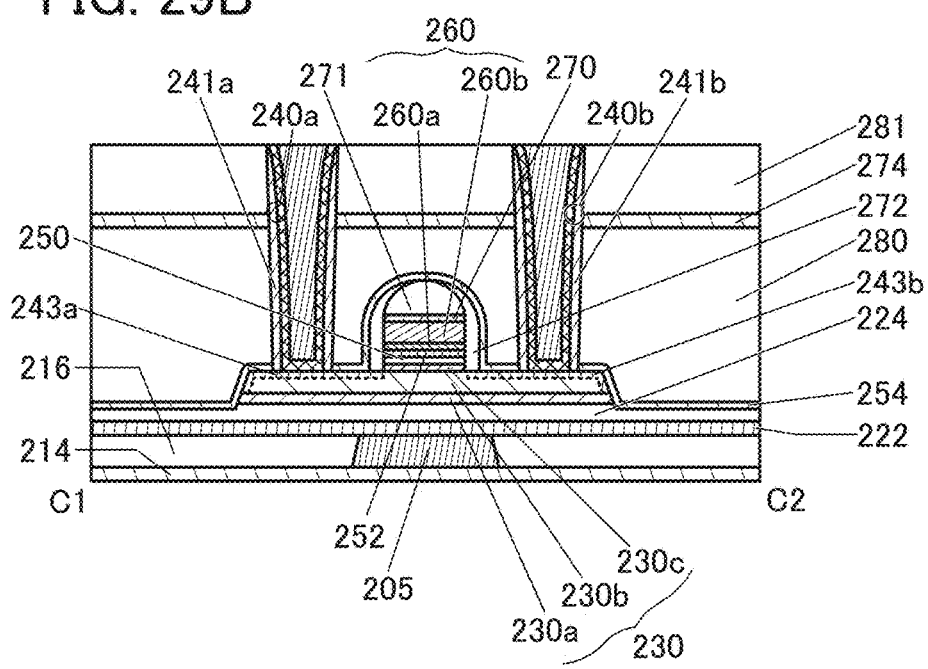

FIG. 29(A) is a top view of the transistor 200C. FIGS. 29(B) and 29(C) are cross-sectional views of the transistor 200C. FIG. 29(B) is a cross-sectional view taken along the dashed-dotted line C1-C2 in FIG. 29(A) and shows a cross section of the transistor 200C in the channel length direction. FIG. 29(C) is a cross-sectional view taken along the dashed-dotted line C3-C4 in FIG. 29(A) and shows a cross section of the transistor 200C in the channel width direction. Note that for simplification of the drawing, some components are not illustrated in the top view in FIG. 29(A).

The transistor 200C includes the insulator 250 over the metal oxide 230c, and a metal oxide 252 over the insulator 250. The conductor 260 over the metal oxide 252, and an insulator 270 over the conductor 260. An insulator 271 over the insulator 270.

The metal oxide 252 preferably has a function of inhibiting diffusion of oxygen. When the metal oxide 252 that inhibits oxygen diffusion is provided between the insulator 250 and the conductor 260, diffusion of oxygen into the conductor 260 is inhibited. That is, the reduction in the amount of oxygen supplied to the metal oxide 230 can be inhibited. Furthermore, oxidation of the conductor 260 can be inhibited.

Note that the metal oxide 252 may function as part of a gate electrode. For example, an oxide semiconductor that can be used for the metal oxide 230 can be used for the metal oxide 252. In this case, when the conductor 260 is formed by a sputtering method, the metal oxide 252 can have a reduced electric resistance and become a conductor. Such a conductor can be referred to as an OC (Oxide Conductor) electrode.

Note that the metal oxide 252 may function as part of a gate insulator. Therefore, when silicon oxide, silicon oxynitride, or the like, which has high thermal stability, is used for the insulator 250, a metal oxide that is a high-k material with a high dielectric constant is preferably used as the metal oxide 252. This stacked-layer structure enables the transistor 200C to be thermally stable and have a high dielectric constant. Accordingly, a gate potential that is applied during operation of the transistor can be lowered while the physical thickness is maintained. In addition, the equivalent oxide thickness (EOT) of the insulating layer functioning as the gate insulator can be reduced.

Although the metal oxide 252 in the transistor 200C is shown as a single layer, the metal oxide 252 may have a stacked-layer structure of two or more layers. For example, a metal oxide functioning as part of a gate electrode and a metal oxide functioning as part of a gate insulator may be stacked.

When the metal oxide 252 included in the transistor 200C functions as a gate electrode, the on-state current of the transistor 200C can be increased without weakening the influence of electric fields from the conductor 260. When the metal oxide 252 functions as a gate insulator, the distance between the conductor 260 and the metal oxide 230 can be maintained owing to the physical thickness of the insulator 250 and the metal oxide 252. Thus, leakage current between the conductor 260 and the metal oxide 230 can be reduced. Consequently, in the transistor 200C having the stacked-layer structure of the insulator 250 and the metal oxide 252, it is easy to adjust the physical distance between the conductor 260 and the metal oxide 230 and the intensity of electric fields applied from the conductor 260 to the metal oxide 230.

Specifically, for the metal oxide 252, a material obtained by lowering the resistance of an oxide semiconductor that can be used for the metal oxide 230 can be used. Alternatively, a metal oxide containing one or more of hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate is preferable because it has higher heat resistance than a hafnium oxide film and thus is less likely to be crystallized by heat treatment in a later step. Note that the metal oxide 252 is not necessarily provided. Design is appropriately determined in consideration of required transistor characteristics.

The insulator 270 is preferably formed using an insulating material having a function of inhibiting the passage of oxygen and impurities such as water or hydrogen. For example, aluminum oxide or hafnium oxide is preferably used. In that case, oxidization of the conductor 260 due to oxygen from above the insulator 270 can be inhibited. Moreover, entry of impurities such as water or hydrogen from above the insulator 270 into the metal oxide 230 through the conductor 260 and the insulator 250 can be inhibited.

The insulator 271 functions as a hard mask. By provision of the insulator 271, the conductor 260 can be processed to have a side surface that is substantially vertical. Specifically, the angle formed by the side surface of the conductor 260 and the surface of the substrate can be greater than or equal to 75° and less than or equal to 100°, preferably greater than or equal to 0° and less than or equal to 95°.

The insulator 271 may be formed using an insulating material having a function of inhibiting the passage of oxygen and impurities such as water or hydrogen so that the insulator 271 also functions as a barrier layer. In this case, the insulator 270 is not necessarily provided.

The insulator 270, the conductor 260, the metal oxide 252, the insulator 250, and the metal oxide 230c are selectively removed using the insulator 271 as a hard mask, whereby their side surfaces can be substantially aligned with each other and the surface of the metal oxide 230b can be partly exposed.

The transistor 200C includes a region 243a and a region 243b on part of the exposed surface of the metal oxide 230b. One of the region 243a and the region 243b functions as a source region, and the other of the region 243a and the region 243b functions as a drain region.

The region 243a and the region 243b can be formed by introducing an impurity element such as phosphorus or boron to the exposed surface of the metal oxide 230b by an ion implantation method, an ion doping method, a plasma immersion ion implantation method, or plasma treatment, for example. In this embodiment and the like, an impurity element refers to an element other than main constituent elements.

Alternatively, the region 243a and the region 243b can be formed in such manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as impurity regions or low-resistance regions.

The region 243a and the region 243b can be formed in a self-aligned manner by using the insulator 271 and/or the conductor 260 as a mask. Accordingly, the conductor 260 does not overlap the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves a higher on-state current, a lower threshold voltage, and a higher operating frequency, for example.

The transistor 200C includes an insulator 272 on the side surfaces of the insulator 271, the insulator 270, the conductor 260, the metal oxide 252, the insulator 250, and the metal oxide 230c. The insulator 272 is preferably an insulator having a low dielectric constant. The insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, and porous silicon oxide are preferable because an excess oxygen region can be easily formed in the insulator 272 in a later step. Silicon oxide and silicon oxynitride are preferable because of their thermal stability. The insulator 272 preferably has a function of diffusing oxygen.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 272. In this case, the insulator 272 serves as a mask like the insulator 271 or the like. Thus, the impurity element is not added to the region of the metal oxide 230b overlapped by the insulator 272, so that the electrical resistivity of the region can be kept high.

The transistor 200C also includes the insulator 254 over the insulator 272 and the metal oxide 230. The insulator 254 is preferably formed by a sputtering method. The insulator formed by a sputtering method can be an insulator containing few impurities such as water or hydrogen.

Note that an oxide film formed by a sputtering method may extract hydrogen from the component over which the oxide film is formed. For that reason, the insulator 254 formed by a sputtering method absorbs hydrogen and water from the metal oxide 230 and the insulator 272. This reduces the hydrogen concentration in the metal oxide 230 and the insulator 272.

<Materials for Transistor>

Materials that can be used for the transistor are described.

<<Substrate>>

As a substrate where the transistor 200 is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Another example includes a semiconductor substrate in which an insulator region is provided in the above semiconductor substrate, e.g., a SOI (Silicon On Insulator) substrate. Examples of the conductor substrate include a graphite substrate, a metal substrate, an alloy substrate, and a conductive resin substrate. Other examples include a substrate containing a nitride of a metal, a substrate including an oxide of a metal, an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided over the substrate include a capacitor, a resistor, a switching element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of transistors, for example, a problem such as generation of leakage current may arise because of a thin gate insulator. When a high-k material is used for an insulator functioning as a gate insulator, the driving voltage of the transistor can be lowered while the physical thickness of the gate insulator is kept. On the other hand, when a material having a low dielectric constant is used for an insulator functioning as an interlayer film, the parasitic capacitance between wirings can be reduced. Accordingly, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting transmission of oxygen and impurities such as hydrogen (e.g., the insulators 214, 222, 254, and 274), the electrical characteristics of the transistor can be stable. An insulator with a function of inhibiting transmission of oxygen and impurities such as hydrogen can be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator with a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen that is released by heating. For example, when silicon oxide or silicon oxynitride that includes a region containing oxygen released by heating is provided in contact with the metal oxide 230, oxygen vacancies in the metal oxide 230 can be compensated.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Alternatively, a semiconductor having high electric conductivity, typified by polycrystalline silicon containing an impurity element such as phosphorus, or silicide such as nickel silicide may be used.

Conductors formed using any of the above materials may be stacked. For example, a stacked-layer structure combining a material containing any of the above metal elements and a conductive material containing oxygen may be used. Alternatively, a stacked-layer structure combining a material containing any of the above metal elements and a conductive material containing nitrogen may be used. Further alternatively, a stacked-layer structure combining a material containing any of the above metal elements, a conductive material containing oxygen, and a conductive material containing nitrogen may be used.

When a metal oxide is used for the channel formation region of the transistor, the conductor functioning as the gate electrode preferably employs a stacked-layer structure using a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide in which the channel is formed. A conductive material containing any of the above metal elements and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which the channel is formed can be captured in some cases. Alternatively, hydrogen entering from a surrounding insulator or the like can be captured in some cases.

<<Metal Oxide>>

A metal oxide contains preferably at least indium or zinc and particularly preferably indium and zinc. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, tin, or the like. Other examples that can be used as the element M include boron, titanium, iron, nickel, germanium, zirconium, molybdenum, lanthanum, cerium, neodymium, hafnium, tantalum, tungsten, and magnesium. Note that two or more of the above elements can be used in combination as the element M in some cases.

Note that in this specification and the like, a metal oxide containing nitrogen is also referred to as a metal oxide in some cases. A metal oxide containing nitrogen may be referred to as a metal oxynitride.

[Structure of Metal Oxide]

An oxide semiconductor (metal oxide) is classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

[Impurities]

Here, the influence of impurities in the metal oxide is described. When the metal oxide contains an alkali metal or an alkaline earth metal, defect states are formed and carriers are generated in some cases. Thus, a transistor using a metal oxide containing an alkali metal or an alkaline earth metal in a channel formation region tends to have normally-on characteristics. Therefore, it is preferable to reduce the concentration of an alkali metal or an alkaline earth metal in the metal oxide. Specifically, the concentration of an alkali metal or an alkaline earth metal in the metal oxide, measured by secondary ion mass spectrometry (SIMS), is lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom and forms water. Hence, hydrogen contained in a metal oxide may cause oxygen vacancies in the metal oxide. Entry of hydrogen into the oxygen vacancies generates electrons serving as carriers in some cases. Furthermore, some hydrogen may react with oxygen bonded to a metal atom and generate an electron serving as a carrier. Thus, a transistor including a metal oxide that contains hydrogen tends to have normally-on characteristics.

For this reason, hydrogen in the metal oxide is preferably reduced as much as possible. Specifically, the hydrogen concentration of the metal oxide measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently reduced impurity concentration is used for a channel formation region of a transistor, the transistor can have stable electrical characteristics.

As a metal oxide used for a semiconductor of a transistor, a thin film having high crystallinity is preferably used. With the thin film, the stability or reliability of the transistor can be improved. As the thin film, a thin film of a single crystal metal oxide or a thin film of a polycrystalline metal oxide can be used, for example. However, a high-temperature process or a laser heating process is required to form the thin film of a single crystal metal oxide or the thin film of a polycrystalline metal oxide over a substrate. Thus, the manufacturing cost is increased, and the throughput is decreased.

At least part of any of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

Embodiment 3

In this embodiment, electronic devices each including a display device that is one embodiment of the present invention are described.

Figure 30A:
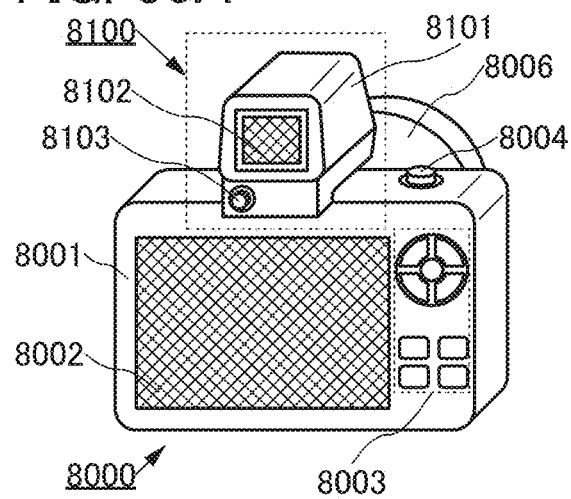
FIG. 30 (A), (B), (C), (D), (E) Perspective views illustrating examples of electronic devices.

FIG. 30(A) is a diagram showing the appearance of a camera 8000 to which a finder 8100 is attached. The camera 8000 is provided with an imaging device. The camera 8000 can be a digital camera, for example. Note that although the camera 8000 and the finder 8100 are separate and detachable electronic devices in FIG. 30(A), a finder including a display device may be incorporated in the housing 8001 of the camera 8000.

The camera 8000 includes a housing 8001, a display portion 8002, operation buttons 8003, a shutter button 8004, and the like. A detachable lens 8006 is attached to the camera 8000.

Although the lens 8006 of the camera 8000 here is detachable from the housing 8001 for replacement, the lens 8006 may be integrated with the housing.

The camera 8000 can take images at the press of the shutter button 8004. The display portion 8002 functions as a touch panel and images can also be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like. The finder 8100 can be an electronic viewfinder.

The housing 8101 includes a mount for engagement with the mount of the camera 8000 so that the finder 8100 can be attached to the camera 8000. The mount includes an electrode, and an image or the like received from the camera 8000 through the electrode can be displayed on the display portion 8102.

The button 8103 functions as a power button. The on/off state of the display portion 8102 can be switched with the button 8103.

A display device of one embodiment of the present invention can be used for the display portion 8002 of the camera 8000 and the display portion 8102 of the finder 8100. The display device of one embodiment of the present invention has extremely high definition; thus, even when the display portion 8002 or the display portion 8102 is close to the user, the user does not perceive pixels, and a more realistic image can be displayed on the display portion 8002 or the display portion 8102. In particular, an image displayed on the display portion 8102 provided in the finder 8100 is perceived when the user brings his/her eyes closer to the eyepiece of the finder 8100; thus, the distance between the user and the display portion 8102 becomes very short. Thus, in particular, the display device of one embodiment of the present invention is preferably used for the display portion 8102. Note that in the case where the display device of one embodiment of the present invention is used for the display portion 8102, the resolution of an image that can be displayed on the display portion 8102 can be 4K, 5K, or higher.

Note that the resolution of an image that can be taken by the imaging device provided in the camera 8000 is preferably the same as or higher than the resolution of an image that can be displayed on the display portion 8002 or the display portion 8102. For example, in the case where an image having a resolution of 4K can be displayed on the display portion 8102, the camera 8000 is preferably provided with an imaging device that can take an image of 4 k or higher. Moreover, for example, in the case where an image having a resolution of 5K can be displayed on the display portion 8102, the camera 8000 is preferably provided with an imaging device that can take an image of 5 k or higher.

Figure 30B:
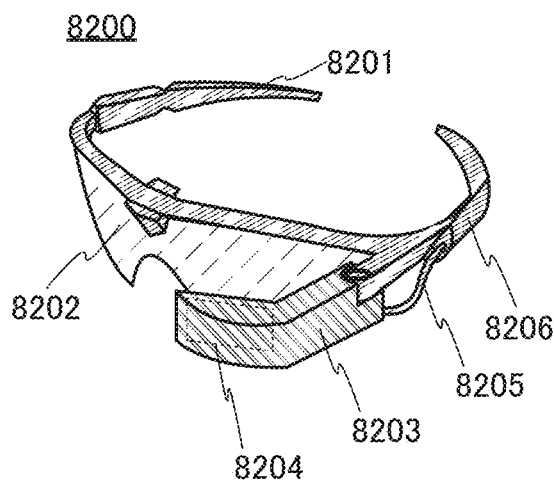

FIG. 30(B) is a diagram showing the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data on the display portion 8204. The movement of the eyeball and the eyelid of the user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display portion 8204 can use the display device of one embodiment of the present invention. Accordingly, the head-mounted display 8200 can have a narrower frame, a high-quality image can be displayed on the display portion 9001, and a more realistic image can be displayed.

Figure 30C:
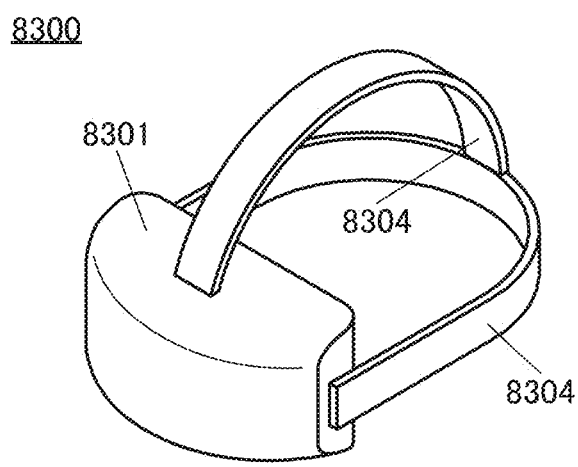
Figure 30D:
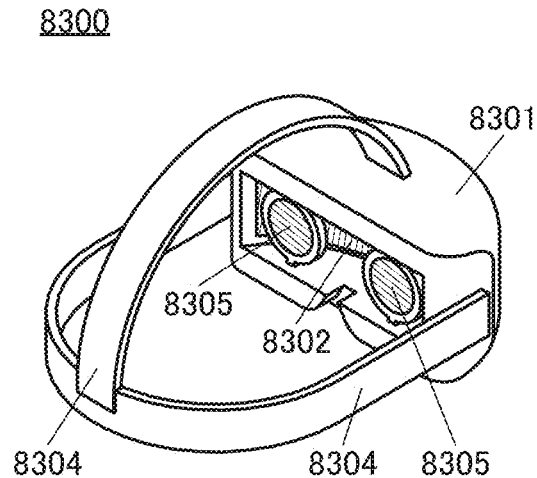
Figure 30E:
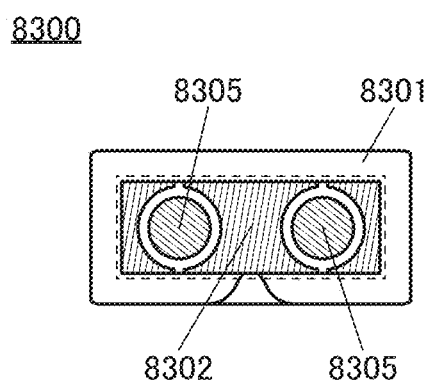

FIGS. 30(C), 30(D), and 30(E) are external views of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that it is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and two display portions 8302 may be provided. In that case, one display portion is placed for one eye of the user, so that three-dimensional display using parallax or the like is possible.

Note that the display device of one embodiment of the present invention can be used in the display portion 8302. The display device of one embodiment of the present invention has extremely high definition; thus, even when an image is magnified using the lenses 8305 as in FIG. 30(E), the user does not perceive pixels, and a more realistic image can be displayed.

Next, FIG. 31(A) to FIG. 31(G) show examples of electronic devices that are different from the electronic devices illustrated in FIG. 30(A) to FIG. 30(E).

Electronic devices illustrated in FIG. 31(A) to FIG. 31(G) include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 31(A) to FIG. 31(G) have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 31(A) to FIG. 31(G) are not limited thereto, and the electronic devices can have a variety of functions. Although not illustrated in FIG. 31(A) to FIG. 31(G), the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices illustrated in FIG. 31(A) to FIG. 31(G) are described below.

Figure 31A:
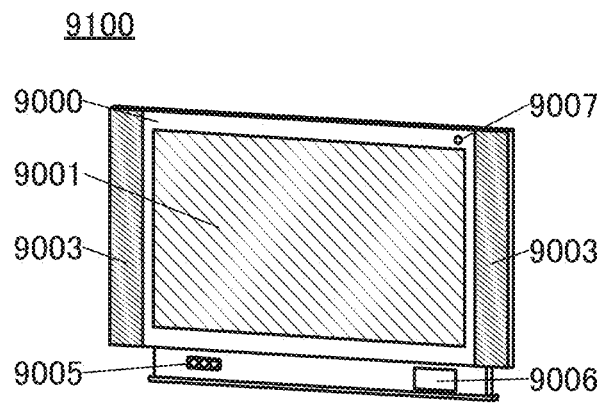
FIG. 31 (A), (B), (C), (D), (E), (F), (G) Perspective views illustrating examples of electronic devices.

FIG. 31(A) is a perspective view illustrating a television 9100. The television 9100 can include the display portion

9001 having a large screen size of, for example, 50 inches or more, or 100 inches or more.

The display device of one embodiment of the present invention can be used for the display portion 9001 included in the television 9100. Accordingly, the television 9100 can have a narrower frame, a high-quality image can be displayed on the display portion 9001, and a more realistic image can be displayed.

Figure 31D:
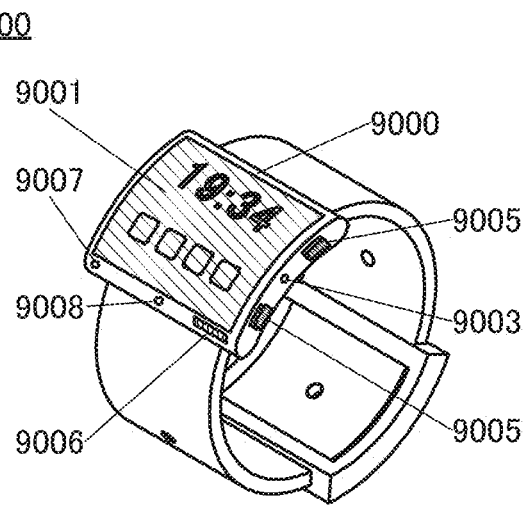
Figure 31B:
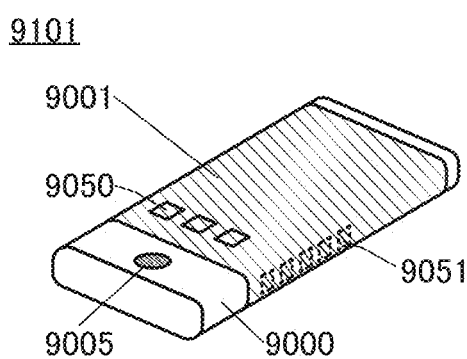

FIG. 31(B) is a perspective view illustrating a portable information terminal 9101. The portable information terminal 9101 functions as, for example, one or more selected from a telephone set, a notebook, an information browsing device, and the like. Specifically, the portable information terminal can be used as a smartphone. Note that the portable information terminal 9101 may be provided with the speaker 9003, the connection terminal 9006, the sensor 9007, or the like. The portable information terminal 9101 can display characters and image information on its plurality of surfaces. For example, three operation buttons 9050 (also referred to as operation icons, or simply as icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display device of one embodiment of the present invention can be used for the display portion 9001 included in the portable information terminal 9101. Accordingly, the size of the portable information terminal 9101 can be reduced, a high-quality image can be displayed on the display portion 9001, and a more realistic image can be displayed.

Figure 31E:
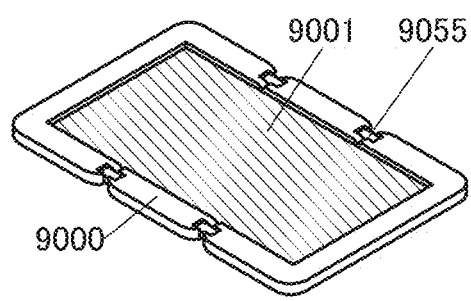
Figure 31C:
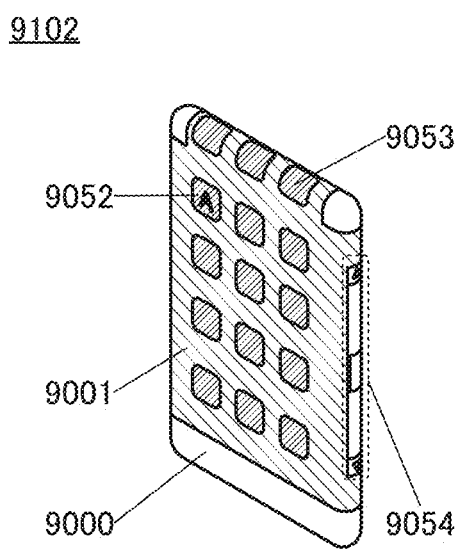

FIG. 31(C) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The display device of one embodiment of the present invention can be used for the display portion 9001 of the portable information terminal 9102. Accordingly, the size of the portable information terminal 9101 can be reduced, a high-quality image can be displayed on the display portion 9001, and a more realistic image can be displayed.

FIG. 31(D) is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used in the display portion 9001 of the portable information terminal 9200. Accordingly, the portable information terminal 9200 can have a narrower frame, a high-quality image can be displayed on the display portion 9001, and a more realistic image can be displayed.

Figure 31F:
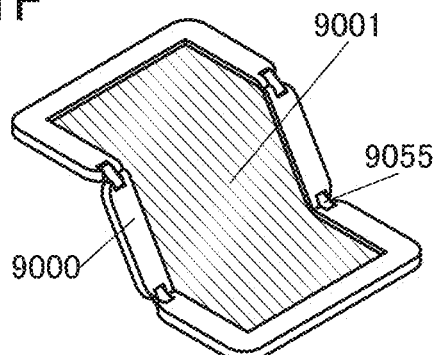
Figure 31G:
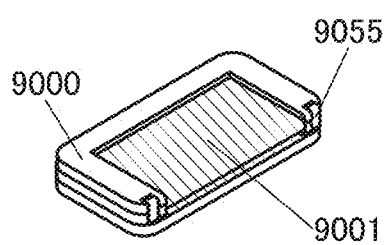

FIGS. 31(E), 31(F), and 31(G) are perspective views illustrating a foldable portable information terminal 9201. FIG. 31(E) is a perspective view of the portable information terminal 9201 in the opened state, FIG. 31(F) is a perspective view of the portable information terminal 9201 that is shifted from one of the opened state and the folded state to the other, and FIG. 31(G) is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The display device of one embodiment of the present invention can be used in the display portion 9001 of the portable information terminal 9201. Accordingly, the portable information terminal 9201 can have a narrower frame, a high-quality image can be displayed on the display portion 9001, and a more realistic image can be displayed.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Example 1

In this example, results of the measurement of the drain current-drain voltage characteristics (Id-Vd characteristics) on a transistor provided in a pixel of a display device are described.

In this example, the Id-Vd characteristics of a transistor used as the transistor 554 that was provided in the pixel having the configuration illustrated in FIG. 15(C) were measured. Table 1 shows the specifications of the display device including the transistor whose Id-Vg characteristics were measured.

TABLE 1

| | | |
|---|---|---|
| | Screen size | 0.28 inches |
| | Resolution | HD (1280 × <720) |
| | Pixel density | 5291 ppi |
| | Pixel pitch | 3.2 × 2.4 μm × RGB |
| | Frame frequency | 120 Hz |
| | Source driver circuit | On-chip |
| | Gate driver circuit | Built-in |
| Transistor 552 | Kind | OS transistor |
| | Channel length (L) | 60 nm |
| | Channel width (W) | 60 nm |
| Transistor 554 | Kind | OS transistor |
| | Channel length (L) | 200 nm |
| | Channel width (W) | 60 nm |
| Capacitor 562 | Capacitance | 4.7 fF |
| | Light-emitting element 572 | Organic EL element |

Figure 32:
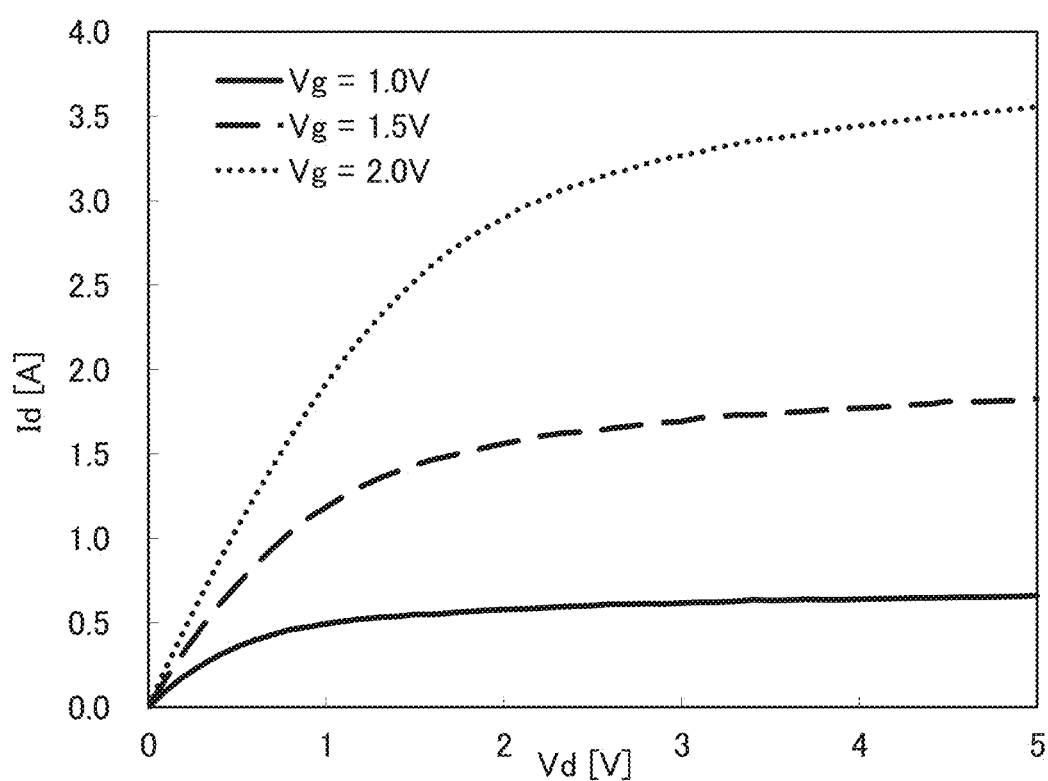
FIG. 32 A graph showing the measurement results of Id-Vd characteristics in Example.

FIG. 32 shows the measurement results of the Id-Vd characteristics of the transistor. Note that in this example, three conditions of a gate voltage (Vg) applied to the transistor were used: 1.0 V, 1.5V, and 2.0 V. FIG. 32 shows that the transistor has saturation characteristics in each of the three conditions of the gate voltage.

Example 2

In this example, the results of the measurement on a cross section of the transistor provided in the display device 10 having the structure illustrated in FIG. 1 with a scanning transmission electron microscope (STEM: Scanning Transmission Electron Microscopy) and the results of the measurement of the drain current-gate voltage characteristics (Id-Vg characteristics) of the transistor are described.

Figure 33:
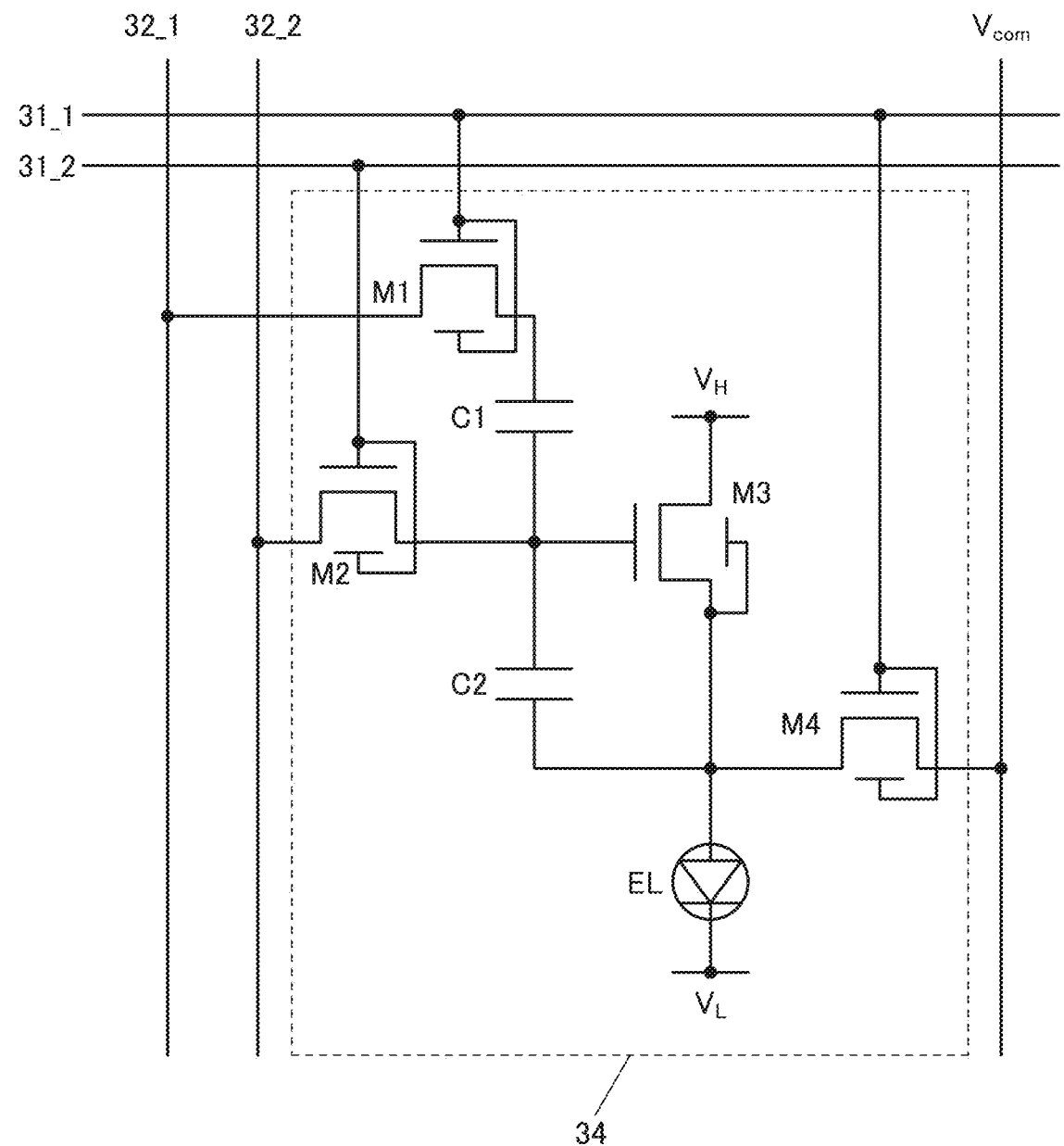
FIG. 33 A configuration of a pixel in Example.

FIG. 33 is a diagram illustrating a configuration of the pixel 34 provided in the display device 10 of this example. The pixel 34 includes a transistor M1, a transistor M2, a transistor M3, a transistor M4, a capacitor C1, a capacitor C2, and a light-emitting element EL.

One of a source and a drain of the transistor M1 is electrically connected to one electrode of the capacitor C1. The other electrode of the capacitor C1 is electrically connected to one of a source and a drain of the transistor M2. The one of the source and the drain of the transistor M2 is electrically connected to a gate of the transistor M3. The gate of the transistor M3 is electrically connected to one electrode of the capacitor C2. The other electrode of the capacitor C2 is electrically connected to one of a source and a drain of the transistor M3. The one of the source and the drain of the transistor M3 is electrically connected to one of a source and a drain of the transistor M4. The one of the source and the drain of the transistor M4 is electrically connected to an anode of a light-emitting element EL.

The gate of the transistor M1 and the gate of the transistor M4 are electrically connected to the wiring 31_1 functioning as a scan line. The gate of the transistor M2 is electrically connected to the wiring 31_2 functioning as a scan line. The other of the source and the drain of the transistor M1 is electrically connected to the wiring 32_1 functioning as a data line. The other of the source and the drain of the transistor M2 is electrically connected to the wiring 32_2 functioning as a data line. The other of the source and the drain of the transistor M3 is electrically connected to a wiring to which a potential $V_H$ is supplied. The other of the source and the drain of the transistor M4 is electrically connected to a wiring to which a potential $V_{com}$ is supplied. A cathode of the light-emitting element EL is electrically connected to a wiring to which a potential $V_L$ is supplied.

The transistor M1 to the transistor M4 each include a back gate in addition to the gate. In each of the transistor M1, the transistor M2, and the transistor M4, the back gate is electrically connected to the gate. The back gate of the transistor M3 is electrically connected to the one of the source and the drain of the transistor M3.

In each of the transistor M1, the transistor M2, and the transistor M4, the channel length (L) was 360 nm and the channel width (W) was 360 nm. Moreover, in the transistor M3, the channel length (L) was 1000 nm and the channel width was 36 nm. Furthermore, the capacitance of the capacitor C1 was 36 fF and the capacitance of the capacitor C2 was 33 fF.

Table 2 shows the specifications of the display device 10 including the transistor whose cross section was measured and whose Id-Vg characteristics were measured in this example.

TABLE 2

| | | |
|---|---|---|
| | Screen size | 0.62 inches |
| | Resolution | HD (1280 × 720) |
| | Pixel density | 2351 ppi |
| | Pixel pitch | 7.2 × 5.4 μm × RGB |
| | Frame frequency | 60 hz |
| | Source driver circuit | On-chip |
| | Gate driver circuit | Built-in |
| Kind of transistor | Layer 20 | OS transistor |
| | Layer 30 | OS transistor |
| | Light-emitting element EL | Organic EL element |

Figure 34:
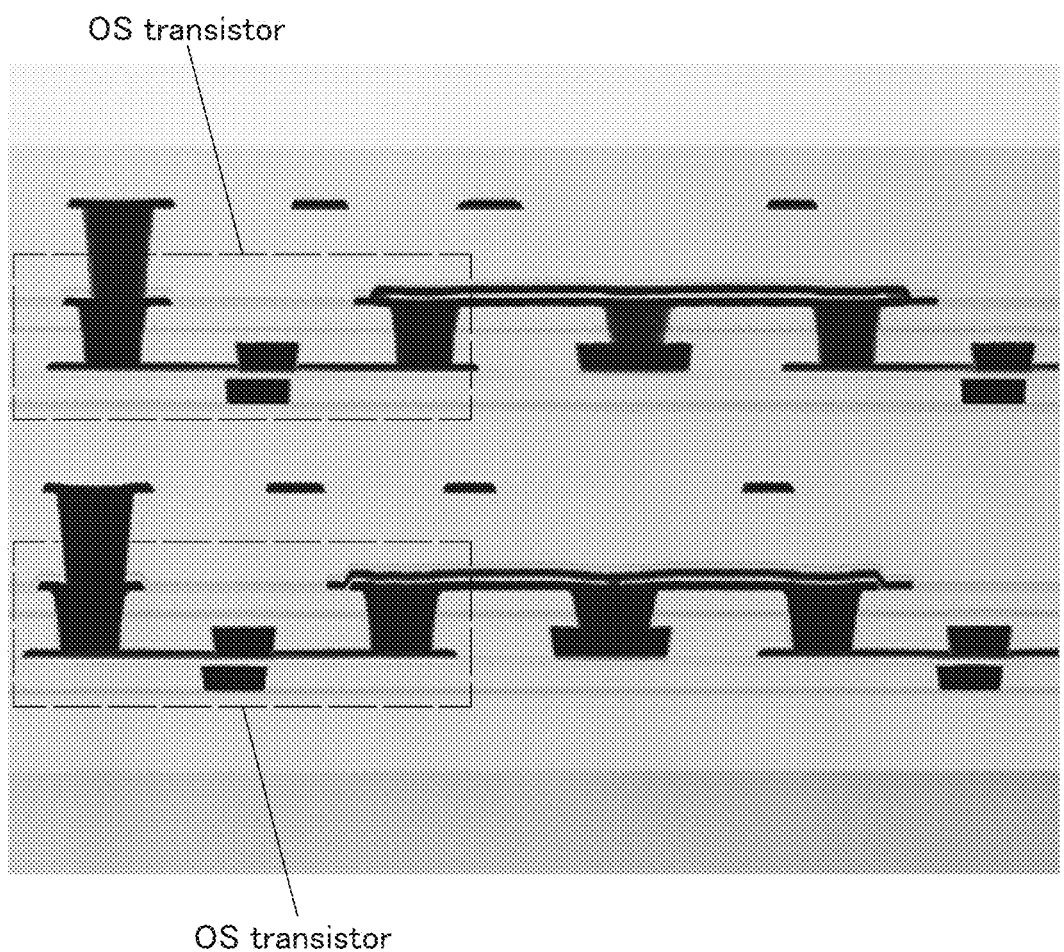
FIG. 34 A STEM image of a transistor in Example.

FIG. 34 is a STEM image showing a cross section of the transistor. FIG. 34 shows that stacked OS transistors can be formed.

Figure 35A:
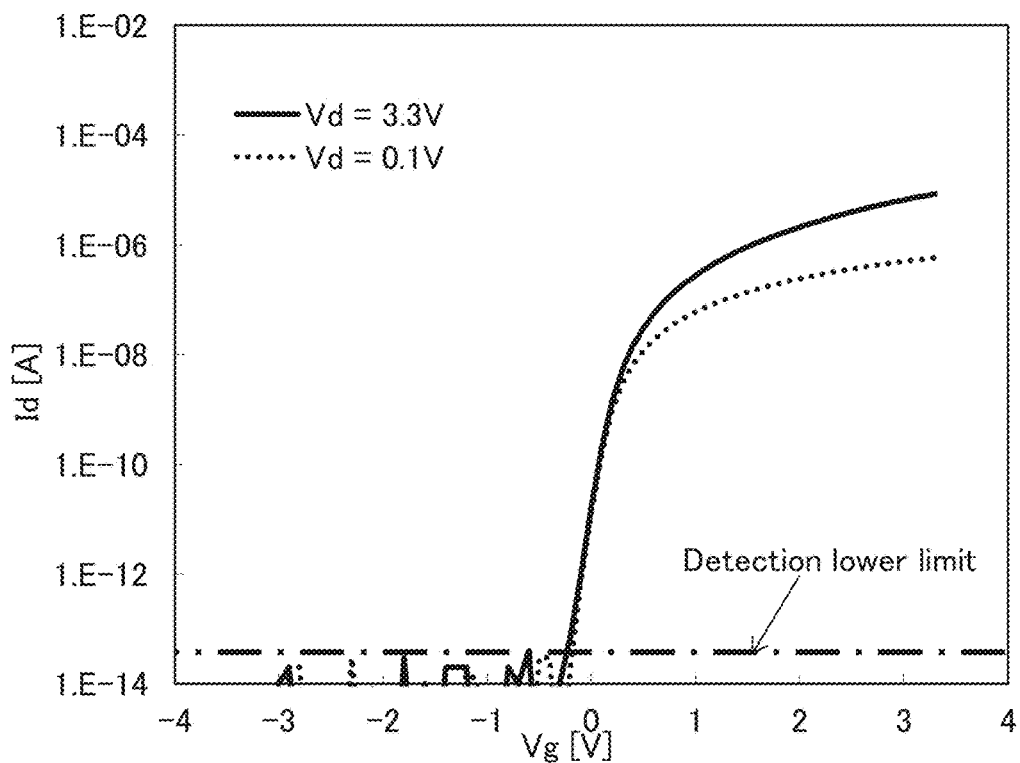
FIG. 35 (A), (B) Graphs showing the measurement results of Id-Vd characteristics in Example.
Figure 35B:
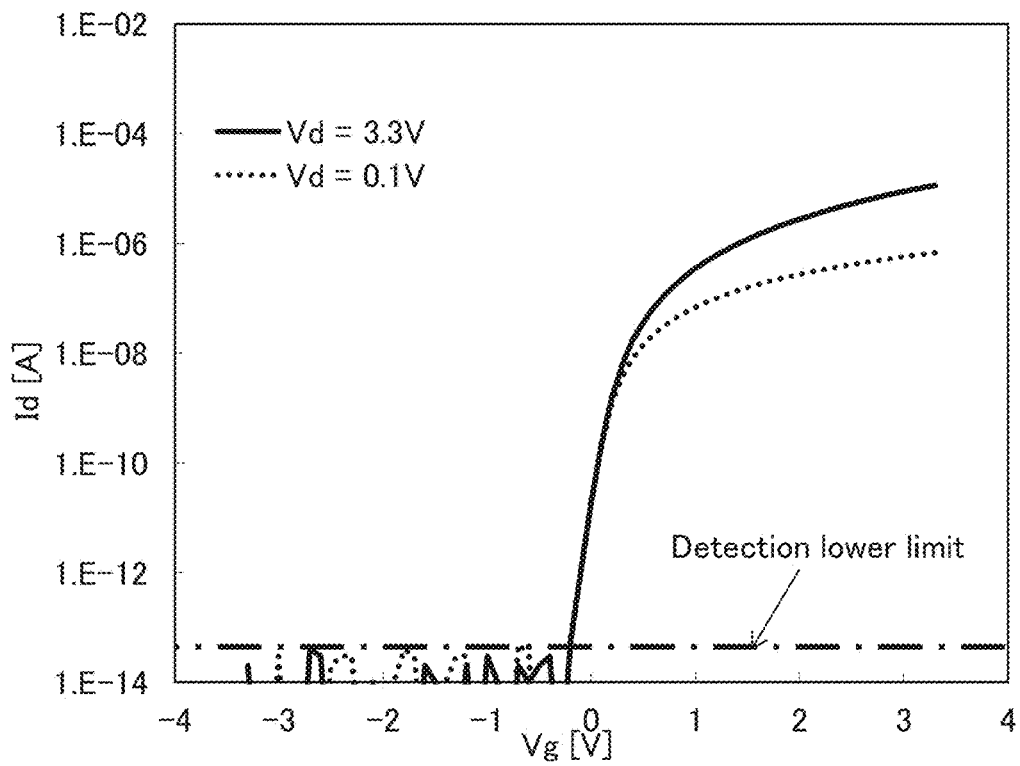

FIG. 35(A) shows the measurement results of the Id-Vg characteristics of the transistor that is provided in the lower layer. FIG. 35(B) shows the measurement results of the Id-Vg characteristics of the transistor that is provided in the upper layer. Note that in the transistor whose Id-Vg characteristics were measured, the channel length (L) was 360 nm and the channel width (W) was 360 nm. The drain voltage (Vd) applied to the transistor provided in the layer 20 was 0.1 V and the drain voltage (Vd) applied to the transistor provided in the layer 30 was 3.3 V.

FIGS. 35(A) and 35(B) show that the off-state current of each of the OS transistor provided in the layer 20 and the OS transistor provided in the layer 30 is below the detection lower limit regardless of the applied drain voltage.

REFERENCE NUMERALS

10: display device, 20: layer, 21: gate driver circuit, 21a: gate driver circuit, 21b: gate driver circuit, 22: source driver circuit, 23: region, 23a: region, 23b: region, 24: demultiplexer circuit, 30: layer, 31: wiring, 31-1: wiring, 31-2: wiring, 31_1: wiring, 31_2: wiring, 31a: wiring, 31b: wiring, 32: wiring, 32-1: wiring, 32-2: wiring, 32_1: wiring, 32_2: wiring, 33: display portion, 34: pixel, 35: wiring, 35a: wiring, 35b: wiring, 40: circuit, 41: receiver circuit, 42: serial-to-parallel converter circuit, 43: buffer circuit, 44: shift register circuit, 45: latch circuit, 46: D/A converter circuit, 46a: potential generator circuit, 46b: pass transistor logic circuit, 47: amplifier circuit, 48: resistor, 49: pass transistor, 51: transistor, 52: transistor, 53: transistor, 54: transistor, 55: transistor, 56: transistor, 57: transistor, 58:

transistor, 59: transistor, 60: transistor, 61: transistor, 62: transistor, 63: transistor, 64: capacitor, 65: capacitor, 66: capacitor, 67: source follower circuit, 70: region, 71: transistor, 72: transistor, 73: dummy transistor, 110: channel formation region, 111: source region, 112: drain region, 113: gate electrode, 114: opening, 115: wiring, 116: opening, 117: wiring, 118: opening, 119: opening, 120: opening, 121: wiring, 122: wiring, 123: wiring, 130: channel formation region, 131: source region, 132: drain region, 133: gate electrode, 134: opening, 135: wiring, 136: opening, 137: wiring, 138: opening, 139: opening, 140: opening, 141: wiring, 142: wiring, 143: wiring, 151: semiconductor, 152: conductor, 200: transistor, 200A: transistor, 200B: transistor, 200C: transistor, 205: conductor, 214: insulator, 216: insulator, 222: insulator, 224: insulator, 230: metal oxide, 230*a*: metal oxide, 230*b*: metal oxide, 230*c*: metal oxide, 240: conductor, 240*a*: conductor, 240*b*: conductor, 241: insulator, 241*a*: insulator, 241*b*: insulator, 242: conductor, 242*a*: conductor, 242*b*: conductor, 243*a*: region, 243*b*: region, 244: insulator, 250: insulator, 252: metal oxide, 254: insulator, 260: conductor, 260*a*: conductor, 260*b*: conductor, 270: insulator, 271: insulator, 272: insulator, 274: insulator, 280: insulator, 281: insulator, 301*a*: conductor, 301*b*: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 401: circuit, 403: element isolation layer, 405: insulator, 407: insulator, 409: insulator, 411: insulator, 413: insulator, 415: insulator, 417: insulator, 419: insulator, 421: insulator, 441: transistor, 443: conductor, 445: insulator, 447: semiconductor region, 449*a*: low-resistance region, 449*b*: low-resistance region, 451: conductor, 453: conductor, 455: conductor, 457: conductor, 459: conductor, 461: conductor, 463: conductor, 465: conductor, 467: conductor, 469: conductor, 471: conductor, 501: insulator, 503: insulator, 505: insulator, 507: insulator, 509: insulator, 511: transistor, 513: transistor, 515: capacitor, 517: capacitor, 519: liquid crystal element, 520: circuit, 521: transistor, 523: light-emitting element, 525: transistor, 527: transistor, 531: wiring, 533: wiring, 535: wiring, 537: wiring, 539: wiring, 541: wiring, 543: wiring, 545: wiring, 550: transistor, 552: transistor, 554: transistor, 560: capacitor, 562: capacitor, 570: liquid crystal element, 572: light-emitting element, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716: FPC, 721: hole-injection layer, 722: hole-transport layer, 723: light-emitting layer, 724: electron-transport layer, 725: electron-injection layer, 730: insulator, 732: sealing layer, 734: insulator, 736: coloring layer, 738: light-blocking layer, 750: transistor, 760: connection electrode, 772: conductor, 774: conductor, 775: liquid crystal element, 776: liquid crystal layer, 778: structure body, 780: anisotropic conductor, 782: light-emitting element, 786: EL layer, 786*a*: EL layer, 786*b*: EL layer, 786*c*: EL layer, 788: conductor, 790: capacitor, 792: charge generation layer, 8000: camera, 8001: housing, 8002: display portion, 8003: operation button, 8004: shutter button, 8006: lens, 8100: finder, 8101: housing, 8102: display portion, 8103: button, 8200: head mounted display, 8201: mounting portion, 8202: lens, 8203: main body, 8204: display portion, 8205: cable, 8206: battery, 8300: head mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television, 9101: portable information terminal, 9102: portable information terminal, 9200: portable information terminal, 9201: portable information terminal

The invention claimed is:
1. A display device comprising:
a first layer; and
a second layer,
wherein the first layer and the second layer are stacked,
wherein the first layer includes a gate driver circuit and a source driver circuit,
wherein the second layer includes a display portion,
wherein pixels are arranged in a matrix in the display portion,
wherein the gate driver circuit and the source driver circuit each include a first region overlapping with the display portion,
wherein the gate driver circuit and the source driver circuit share a second region,
wherein the gate driver circuit comprises first and second transistors in the second region,
wherein the source driver circuit comprises a third transistor positioned between the first and second transistors in the second region,
wherein the source driver circuit is electrically connected to the pixel through a first data line,
wherein the source driver circuit is electrically connected to the pixel through a second data line,
wherein the source driver circuit is configured to generate a first image signal and supply the first image signal to the pixel through the first data line,
wherein the source driver circuit is configured to generate a second image signal and supply the second image signal to the pixel through the second data line, and
wherein the pixel is configured to display an image in which an image corresponding to the first image signal and an image corresponding to the second image signal are superimposed on each other.
2. The display device according to claim 1,
wherein the display device includes a D/A converter circuit,
wherein the D/A converter circuit includes a potential generator circuit and a pass transistor logic circuit,
wherein the potential generator circuit is provided outside the source driver circuit,
wherein the pass transistor logic circuit is provided in the source driver circuit,
wherein the potential generator circuit is configured to generate a plurality of potentials having different levels, and
wherein the pass transistor logic circuit is configured to receive image data and output any of the potentials generated by the potential generator circuit on the basis of digital value of the image data.
3. The display device according to claim 1,
wherein the pixel includes a display element, and
wherein the display element is a light-emitting element.
4. The display device according to claim 3, wherein the display element is an organic EL element.
5. The display device according to claim 4, wherein the organic EL element has a tandem structure.

6. The display device according to claim 1,
wherein the pixel includes a display element, a fourth transistor, a fifth transistor, a sixth transistor, and a capacitor,
wherein one of a source and a drain of the fourth transistor is electrically connected to one electrode of the capacitor,
wherein the other of the source and the drain of the fourth transistor is electrically connected to the first data line,
wherein one of a source and a drain of the fifth transistor is electrically connected to the other electrode of the capacitor,
wherein the other of the source and the drain of the fifth transistor is electrically connected to the second data line,
wherein the other electrode of the capacitor is electrically connected to a gate of the sixth transistor, and
wherein one of a source and a drain of the sixth transistor is electrically connected to one electrode of the display element.

7. The display device according to claim 6,
wherein the fourth transistor and the fifth transistor each include a metal oxide in a channel formation region,
wherein the metal oxide includes an element M and Zn, and
wherein the element M is any one of Al, Ga, Y, and Sn.

8. An electronic device comprising:
the display device according to claim 1, and
a lens.

9. A display device comprising:
a first layer; and
a second layer,
wherein the first layer and the second layer are stacked,
wherein the first layer includes a gate driver circuit and a source driver circuit,
wherein the second layer includes a display portion,
wherein pixels are arranged in a matrix in the display portion,
wherein the gate driver circuit and the source driver circuit each include a first region overlapping with the display portion,
wherein the gate driver circuit and the source driver circuit share a second region,
wherein the gate driver circuit comprises first and second transistors in the second region, and
wherein the source driver circuit comprises a third transistor positioned between the first and second transistors in the second region.

10. The display device according to claim 9,
wherein the first layer comprises a transistor including silicon,
wherein the second layer comprises a transistor including a metal oxide in a channel formation region,
wherein the metal oxide includes an element M and Zn, and
wherein the element M is any one of Al, Ga, Y, and Sn.

11. The display device according to claim 9,
wherein the first layer and the second layer each comprises a transistor including a metal oxide in a channel formation region,
wherein the metal oxide includes an element M and Zn, and
wherein the element M is any one of Al, Ga, Y, and Sn.

12. The display device according to claim 9,
wherein the pixel includes a display element, and
wherein the display element is a light-emitting element.

13. The display device according to claim 12, wherein the display element is an organic EL element.

14. The display device according to claim 13, wherein the organic EL element has a tandem structure.

15. A display device comprising:
a first layer; and
a second layer,
wherein the first layer and the second layer are stacked,
wherein the first layer includes a gate driver circuit and a source driver circuit,
wherein the second layer includes a display portion,
wherein pixels are arranged in a matrix in the display portion,
wherein the gate driver circuit and the source driver circuit each include a region overlapping with the display portion,
wherein the gate driver circuit and the source driver circuit share a second region,
wherein the gate driver circuit comprises first and second transistors in the second region,
wherein the source driver circuit comprises a third transistor positioned between the first and second transistors in the second region,
wherein the first layer comprises a transistor including silicon,
wherein the second layer comprises a transistor including a metal oxide in a channel formation region,
wherein the pixel includes a display element, and
wherein the display element is an organic EL element.

16. The display device according to claim 15, wherein the organic EL element has a tandem structure.

* * * * *